(12) United States Patent
Wolleb et al.

(10) Patent No.: US 12,545,679 B2
(45) Date of Patent: Feb. 10, 2026

(54) COMPOUND, MATERIAL FOR AN ORGANIC ELECTROLUMINESCENCE DEVICE AND AN ORGANIC ELECTROLUMINESCENCE DEVICE COMPRISING THE COMPOUND

(71) Applicant: Idemitsu Kosan Co., Ltd., Tokyo (JP)

(72) Inventors: Heinz Wolleb, Fehren (CH); Michelle Groarke, Binningen (CH); Masato Mitani, Sodegaura (JP); Natalia Chebotareva, Hagenthal le Bas (FR)

(73) Assignee: Idemitsu Kosan Co., Ltd., Tokyo (JP)

( * ) Notice: Subject to any disclaimer, the term of this patent is extended or adjusted under 35 U.S.C. 154(b) by 927 days.

(21) Appl. No.: 17/666,850

(22) Filed: Feb. 8, 2022

(65) Prior Publication Data

US 2022/0251086 A1      Aug. 11, 2022

(30) Foreign Application Priority Data

Feb. 11, 2021   (EP) .................................... 21156625

(51) Int. Cl.
  *C07D 487/00*   (2006.01)
  *C07D 498/04*   (2006.01)
  (Continued)

(52) U.S. Cl.
  CPC ......... *C07D 487/00* (2013.01); *C07D 498/04* (2013.01); *C07D 513/04* (2013.01);
  (Continued)

(58) Field of Classification Search
  CPC .......................... C07D 251/24; C07D 209/82
  See application file for complete search history.

(56) References Cited

U.S. PATENT DOCUMENTS 9,831,444 B1 * 11/2017 Yen .................... C09K 11/06
9,893,296 B2    2/2018 Mizutani et al.
(Continued)

FOREIGN PATENT DOCUMENTS

CN   107739345 A  *  2/2018  .......... C07D 251/24
CN   107964019 A     4/2018
(Continued)

OTHER PUBLICATIONS

Machine-generated English-language translation of KR 2018/0061076 A.*

(Continued)

*Primary Examiner* — Vu A Nguyen
(74) *Attorney, Agent, or Firm* — Oblon, McClelland, Maier & Neustadt, L.L.P.

(57) ABSTRACT

Specific compounds represented by formula (I), a material for an organic electroluminescence device comprising said specific compound, an organic electroluminescence device comprising said specific compound, an electronic equipment comprising said organic electroluminescence device and the use of said compounds in an organic electroluminescence device.

12 Claims, 1 Drawing Sheet

(51) Int. Cl.

| | | |
|---|---|---|
| *C07D 513/04* | (2006.01) | |
| *H10K 50/11* | (2023.01) | |
| *H10K 50/12* | (2023.01) | |
| *H10K 50/16* | (2023.01) | |
| *H10K 85/60* | (2023.01) | |
| *H10K 101/10* | (2023.01) | |
| *H10K 101/30* | (2023.01) | |
| *H10K 101/40* | (2023.01) | |

(52) U.S. Cl.
CPC ......... *H10K 85/622* (2023.02); *H10K 85/626* (2023.02); *H10K 85/654* (2023.02); *H10K 85/6572* (2023.02); *H10K 50/11* (2023.02); *H10K 50/12* (2023.02); *H10K 50/16* (2023.02); *H10K 2101/10* (2023.02); *H10K 2101/30* (2023.02); *H10K 2101/40* (2023.02)

(56) References Cited

U.S. PATENT DOCUMENTS

| | | | |
|---|---|---|---|
| 10,217,954 B2 | 2/2019 | Hayama et al. | |
| 2014/0323723 A1* | 10/2014 | Ahn | H10K 85/654 544/212 |
| 2019/0214570 A1 | 7/2019 | Inayama et al. | |

FOREIGN PATENT DOCUMENTS

| | | | | |
|---|---|---|---|---|
| EP | 2 827 397 A1 | 1/2015 | | |
| EP | 3 675 194 A1 | 7/2020 | | |
| KR | 10-2012-0038032 A | 4/2012 | | |
| KR | 10-2014-0004005 A | 1/2014 | | |
| KR | 10-2014-0129435 A | 11/2014 | | |
| KR | 10-2017-0094766 A | 8/2017 | | |
| KR | 20170094766 A | * 8/2017 | ........... | C07D 209/22 |
| KR | 10-2018-0061076 A | 6/2018 | | |
| KR | 20180061076 A | * 6/2018 | ........... | C07D 405/14 |
| KR | 10-2019-0076376 A | 7/2019 | | |
| WO | WO 2010/134350 A1 | 11/2010 | | |
| WO | WO-2013032297 A1 | * 3/2013 | ........... | C07B 59/002 |
| WO | WO 2013/191177 A1 | 12/2013 | | |
| WO | WO-2019114478 A1 | * 6/2019 | ........... | C07D 251/04 |
| WO | WO 2020/050372 A1 | 3/2020 | | |
| WO | WO 2020/209678 A1 | 10/2020 | | |
| WO | WO 2020/209679 A1 | 10/2020 | | |

OTHER PUBLICATIONS

Wolfe et al., "Highly Active Palladium Catalysts for Suzuki Coupling Reactions", Journal of American Chemical Society, 121, 1999, pp. 9550-9561.

Miyaura et al., "Palladium-Catalyzed Cross-Coupling Reactions of Organoboron Compounds", Chemical Reviews, vol. 95, No. 7, 1995, pp. 2457-2483.

Ackermann et al., "Air-Stable Secondary Phosphine Oxide or Chloride (Pre)Ligands for Cross-Couplings of Unactivated Alkyl Chlorides", Organic Letters, vol. 12, No. 10, 2010, pp. 2298-2301.

Frisch et al., "Palladium-katalysierte Kupplung von Alkychloriden mit Grignard-Reagentien", Angew. Chem., 114, 2002, pp. 4218-4221.

* cited by examiner

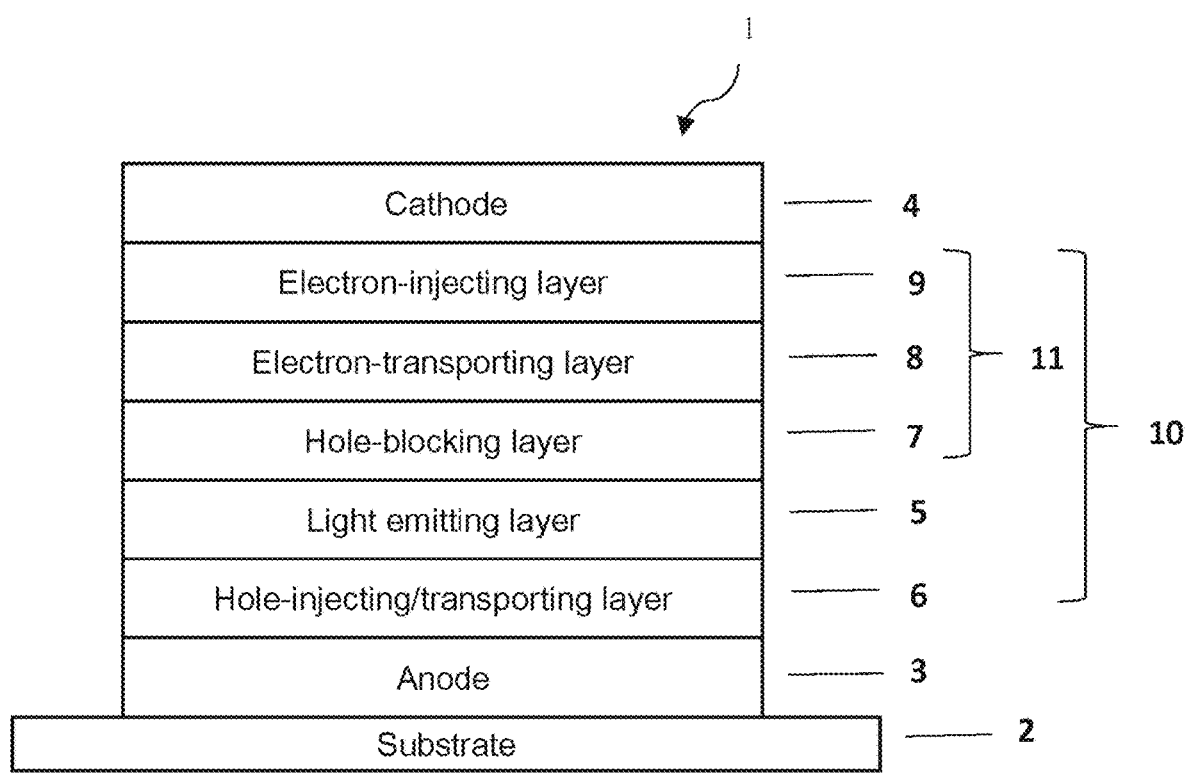

COMPOUND, MATERIAL FOR AN ORGANIC ELECTROLUMINESCENCE DEVICE AND AN ORGANIC ELECTROLUMINESCENCE DEVICE COMPRISING THE COMPOUND

The present invention relates to specific compounds, a material for an organic electroluminescence device comprising said specific compound, an organic electroluminescence device comprising said specific compound, an electronic equipment comprising said organic electroluminescence device and the use of said compounds in an organic electroluminescence device.

When a voltage is applied to an organic electroluminescence device (hereinafter may be referred to as an organic EL device), holes are injected to an emitting layer from an anode and electrons are injected to an emitting layer from a cathode. In the emitting layer, injected holes and electrons are re-combined and excitons are formed.

An organic EL device comprises an emitting layer between the anode and the cathode. Further, there may be a case where it has a stacked layer structure comprising an organic layer such as a hole-injecting layer, a hole-transporting layer, an electron-blocking layer, an electron-injecting layer, an electron-transporting layer, a hole-blocking layer etc.

KR 2014-0129435 relates to an organic light emitting compound of the below mentioned formula and an organic electroluminescent device which applies the organic light emitting compound to a hole injection layer material, a hole transport layer material, a host material of a luminescent layer or a phosphorescence layer, and an electron transport and injection material to improve characteristics such as luminous efficiency, brightness, thermal stability, driving voltage and service life of a device.

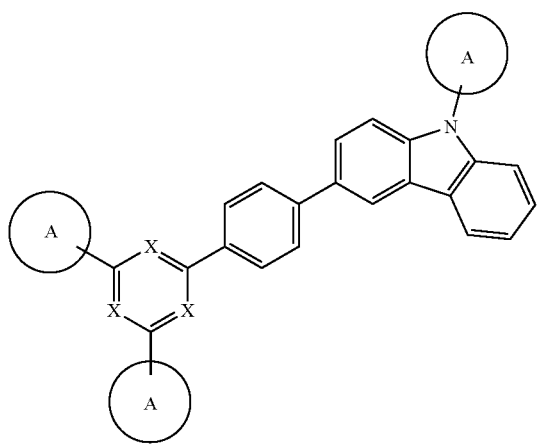

Only two specific compounds are exemplified in KR2014-0129435

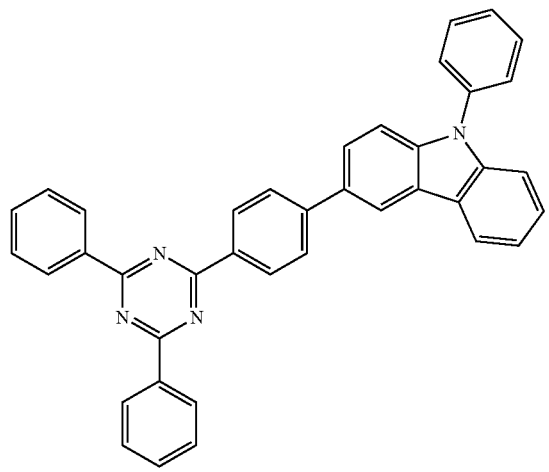 [SMILES: c1ccc(-c2nc(-c3ccccc3)nc(-c3ccc(-c4ccc5c(c4)c4ccccc4n5-c4ccccc4)cc3)n2)cc1]

WO 2020/050372 relates to an organic electroluminescence device comprising an anode, a cathode, and an organic layer disposed between the anode and the cathode, wherein the organic layer includes a light emitting layer and an electron transport layer, wherein the electron transport layer contains a compound represented by the following formula (1) and a compound represented by the following formula (2).

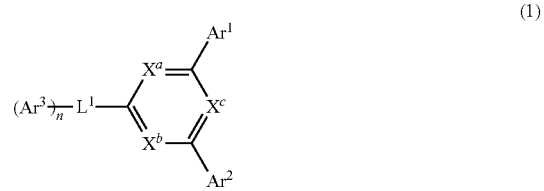

(1)

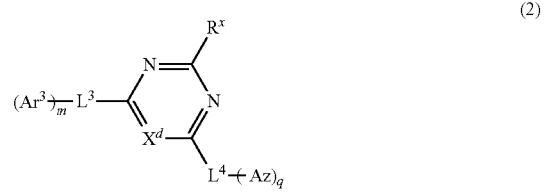

(2)

An example for a compound of formula (1) is shown in the following:

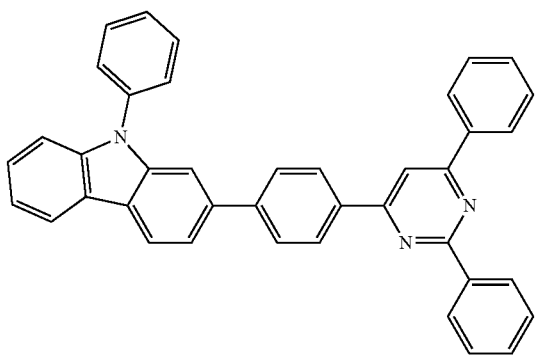 [SMILES: c1ccc(-c2cc(-c3ccc(-c4ccc5c6ccccc6n(-c6ccccc6)c5c4)cc3)nc(-c3ccccc3)n2)cc1]

An example for a compound of formula (2) is shown in the following:

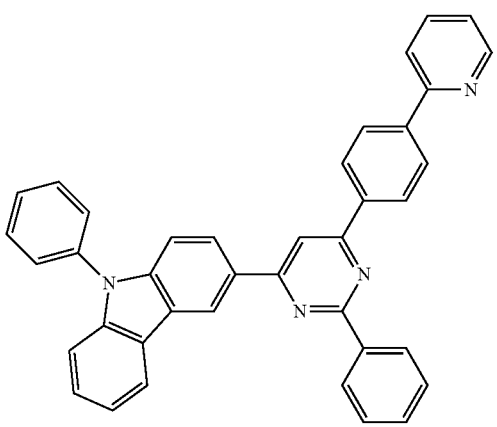 [SMILES: c1ccc(-c2nc(-c3ccc(-c4ccccn4)cc3)cc(-c3ccc4c(c3)c3ccccc3n4-c3ccccc3)n2)cc1]

WO 2020/209678 relates to a pyrimidine derivative compound of the following formula and an organic electroluminescent device using the same The pyrimidine derivative compound having excellent electron injection and transport capabilities, and by including the same in one or more organic material layers, luminous efficiency and driving voltage are improved. The organic electroluminescent device having improved characteristics such as lifetime.

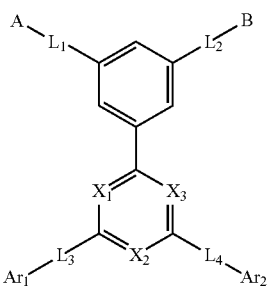

A specific example of the compound mentioned above is shown in the following:

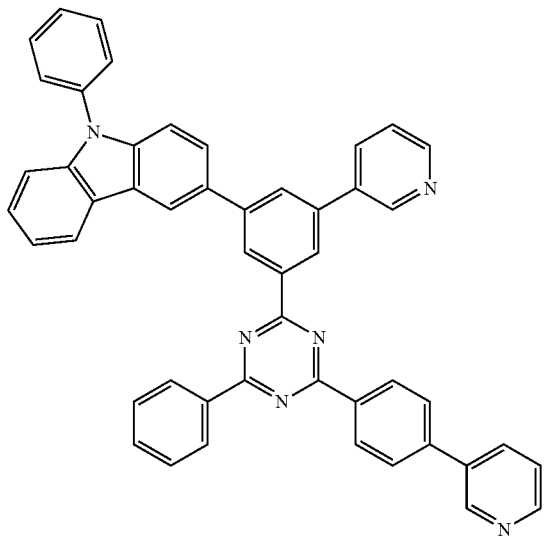 [SMILES: c1ccc(-c2nc(-c3ccc(-c4cccnc4)cc3)nc(-c3cc(-c4cccnc4)cc(-c4ccc5c(c4)c4ccccc4n5-c4ccccc4)c3)n2)cc1]

U.S. Pat. No. 10,217,954 relates to a compound of formula (1) (more specifically a compound of formula 1B) capable of improving the performance of an organic electroluminescence device, an organic-electroluminescence-device material containing the compound, an organic electroluminescence device containing the compound, and an electronic device including the organic electroluminescence device.

(1B)

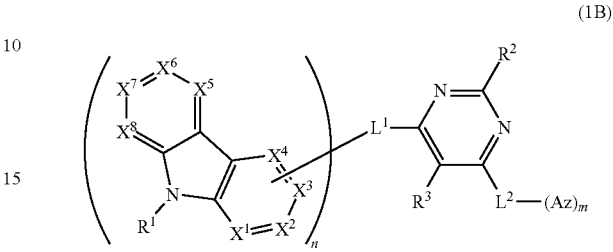

wherein Az is a group of formula (11)

(11)

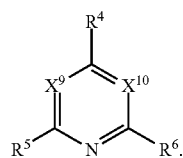

An exemplified compound is as follows:

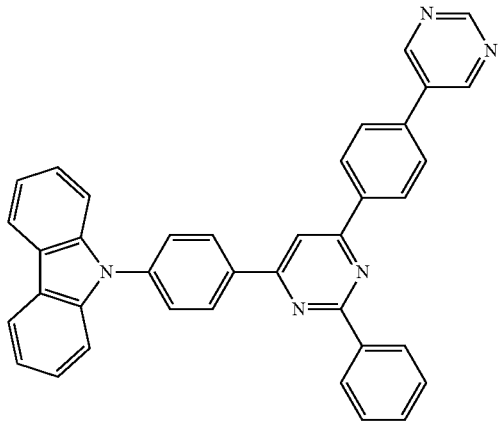 [SMILES: c1ccc(-c2nc(-c3ccc(-c4cncnc4)cc3)cc(-c3ccc(-n4c5ccccc5c5ccccc54)cc3)n2)cc1]

WO 2013/191177 relates to a cyclic azine compound having a carbazolyl group substituted with a nitrogen-containing heteroaryl group of formula (1) useful as a component of an organic electroluminescent device, a method for producing the same, and an organic electroluminescent device containing the same.

(1)

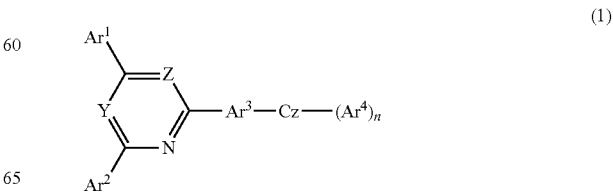

An exemplified compound is shown in the following:

U.S. Pat. No. 9,893,296 relates to an organic electroluminescence device including: an anode; an emitting layer; an electron transporting zone; and a cathode in this sequence, in which the electron transporting zone comprises an aromatic heterocyclic derivative represented by a formula (1) below.

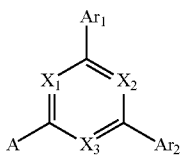

(1)

In the formula (1), A is represented by a formula (2) below.

(2)

HAr is represented by a formula (3) below.

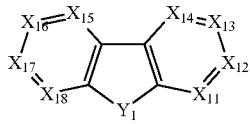

In all exemplified compounds $Y_1$ is O or S.

The specific structure and substitution pattern of the compounds in organic electronic devices have a significant impact on the performance of the organic electronic devices.

Therefore, notwithstanding the developments described above, there remains a need for organic electroluminescence devices comprising new materials, especially charge-transporting materials, e.g. electron-transporting materials, charge-blocking materials, e.g. hole-blocking materials and/or dopant materials, to provide improved performance of electroluminescence devices.

Accordingly, it is an object of the present invention, with respect to the aforementioned related art, to provide further materials suitable for use in organic electroluminescence devices and further applications in organic electronics. More particularly, it should be possible to provide charge-transporting materials, e.g. electron-transporting materials, and/or charge-blocking materials, e.g. hole-blocking materials, and/or dopant materials for use in organic electroluminescence devices. The materials should be suitable especially for organic electroluminescence devices which comprise at least one emitter, which is a phosphorescence emitter and/or a fluorescence emitter.

Furthermore, the materials should be suitable for providing organic electroluminescence devices which ensure good overall performance of the organic electroluminescence devices, especially a long lifetime and/or a low driving voltage.

Said object is solved by a compound represented by formula (I):

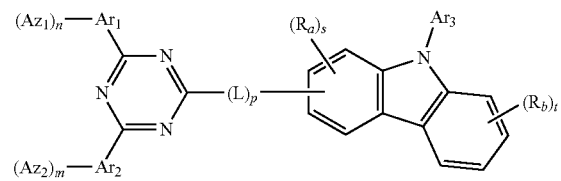

(I)

wherein
L represents an unsubstituted divalent aromatic hydrocarbon group containing 6 to 30 ring atoms or an unsubstituted divalent heteroaromatic group containing 3 to 30 ring atoms; $Ar_1$, $Ar_2$ and $Ar_3$ each independently represents an unsubstituted or substituted aromatic hydrocarbon group containing 6 to 30 ring atoms or an unsubstituted or substituted heteroaromatic group containing 3 to 30 ring atoms, wherein at least one of $Ar_1$ and $Ar_2$ is substituted by at least one group $Az_1$ or $Az_2$;
$Az_1$ and $Az_2$ each independently represents an unsubstituted or substituted heteroaromatic group containing 3 to 30 ring atoms containing at least one ring nitrogen;
$R_a$ and $R_b$ each independently represents hydrogen, an unsubstituted or substituted aromatic hydrocarbon group containing 6 to 30 ring atoms or an unsubstituted or substituted heteroaromatic group containing 3 to 30 ring atoms, an unsubstituted or substituted alkyl group having 1 to 25 carbon atoms, an unsubstituted or substituted cycloalkyl group having 3 to 18 ring carbon atoms or CN, or two adjacent groups $R_a$, and/or two adjacent groups $R_b$, can form together a substituted or unsubstituted carbocyclic or heterocyclic ring;
p is 1, 2 or 3;
m and n are each independently 0, 1, 2, 3 or 4, wherein at least one of m and n is not 0;
s is 0, 1, 2 or 3; and
t is 0, 1, 2, 3 or 4.

The specific compounds of the present invention according to formula (I) may be used as a material, especially host, charge-transporting or charge-blocking material, that is highly suitable in organic electroluminescence devices. Moreover, thermally stable compounds are provided, especially resulting in organic electroluminescence devices having a good overall performance, especially a long lifetime and/or a low driving voltage.

The compounds of the present invention may also be used in further organic electronic devices than organic electroluminescence devices such as electrophotographic photoreceptors, photoelectric converters, organic solar cells (organic photovoltaics), switching elements, such as organic transistors, for example, organic FETs and organic TFTs, organic light emitting field effect transistors (OLEFETs), image sensors and dye lasers.

Accordingly, a further subject of the present invention is directed to an organic electronic device, comprising a compound according to the present invention. The organic electronic device is preferably an organic electroluminescence device (EL device). The term organic EL device (organic electroluminescence device) is used interchangeably with the term organic light-emitting diode (OLED) in the present application.

The compounds of formula (I) can in principal be used in any layer of an EL device, but are preferably used as charge-transporting, especially electron-transporting, charge-blocking, especially hole-blocking, material. Particularly, the compounds of formula (I) are used as electron-transporting material and/or hole-blocking material for phosphorescence or fluorescence emitters.

Hence, a further subject of the present invention is directed to a material for an organic electroluminescence device comprising at least one compound of formula (I) according to the present invention.

A further subject of the present invention is directed to an organic electroluminescence device which comprises an organic thin film layer between a cathode and an anode, wherein the organic thin film layer comprises one or more layers and comprises a light emitting layer, and at least one layer of the organic thin film layer comprises at least one compound of formula (I) according to the present invention.

A further subject of the present invention is directed to an electronic equipment comprising the organic electroluminescence device according the present invention.

A further subject of the present invention is directed to the use of a compound of formula (I) according to the present invention in an organic electroluminescence device. In said embodiment the compound of formula (I) is preferably used in an electron-transporting zone of the organic electroluminescence device. In the meaning of the present invention, the electron-transporting zone includes at least an electron-transporting layer and preferably also an electron-injection layer and/or a hole-blocking layer.

A further subject of the present invention is directed to an emitting layer, comprising a compound of formula (I) according to the present invention.

A further subject of the present invention is directed to an electron-transporting layer comprising a compound of formula (I) according to the present invention. Preferably, the electron-transporting layer is provided between the cathode and the light emitting layer of an EL device such as an OLED.

A further subject of the present invention is directed to a hole-blocking layer comprising a compound of formula (I) according to the present invention. Preferably, the hole-blocking layer is provided between the electron-transporting layer and the light emitting layer of an EL device such as an OLED.

The terms unsubstituted divalent aromatic hydrocarbon group containing 6 to 30 ring atoms, an unsubstituted divalent heteroaromatic group containing 3 to 30 ring atoms, unsubstituted or substituted aromatic hydrocarbon group containing 6 to 30 ring atoms, an unsubstituted or substituted heteroaromatic group containing 3 to 30 ring atoms, unsubstituted or substituted heteroaromatic group containing 3 to 30 ring atoms containing at least one ring nitrogen, an unsubstituted or substituted alkyl group having 1 to 25 carbon atoms, an unsubstituted or substituted cycloalkyl group having 3 to 18 ring carbon atoms, are known in the art and generally have the following meaning, if said groups are not further specified in specific embodiments mentioned below:

The unsubstituted or substituted aromatic hydrocarbon group containing 6 to 30 ring atoms, preferably 6 to 24 ring atoms, more preferably 6 to 18 ring atoms may be a non-condensed aryl group or a condensed aryl group. Specific examples thereof include phenyl group, naphthyl group, phenanthryl group, biphenyl group, terphenyl group, quaterphenyl group, fluoranthenyl group, triphenylenyl group, phenanthrenyl group, fluorenyl group, anthracenyl, chrysenyl, spirofluorenyl group, 9,9-diphenylfluorenyl group, 9,9'-spirobi[9H-fluorene]-2-yl group, 9,9-dimethylfluorenyl group, benzo[c]phenanthrenyl group, benzo[a]triphenylenyl group, naphtho[1,2-c]phenanthrenyl group, naphtho[1,2-a]triphenylenyl group, dibenzo[a,c]triphenylenyl group, benzo[a]fluoranthenyl group, benzo[j]fluoranthenyl group, benzo[k]fluoranthenyl group and benzo[b]fluoranthenyl group, with phenyl group, naphthyl group, biphenyl group, terphenyl group, phenanthryl group, triphenylenyl group, fluorenyl group, spirobifluorenyl group anthracenyl, and fluoranthenyl group being preferred, and phenyl group, 1-naphthyl group, 2-naphthyl group, biphenyl-2-yl group, biphenyl-3-yl group, biphenyl-4-yl group, phenanthrene-9-yl group, phenanthrene-3-yl group, phenanthrene-2-yl group, triphenylene-2-yl group, 9,9-dimethylfluorene-2-yl group, 9,9-dimethylfluorene-4-yl group, 9,9-diphenylfluorene-2-yl group, 9,9-diphenylfluorene-4-yl group, fluoranthene-3-yl group, fluoranthene-2-yl group, fluoranthene-8-yl, anthracen-3-yl and anthracen-9-yl group being most preferred.

The unsubstituted or substituted heteroaromatic group containing 3 to 30 ring atoms, preferably 5 to 18 ring atoms, may be a non-condensed heteroaromatic group or a condensed heteroaromatic group. Specific examples thereof include the residues of pyrrole ring, isoindole ring, imidazopyridine ring, imidazopyrimidine ring, imidazopyrazin ring, benzofuran ring, isobenzofuran ring, benzothiophene, dibenzothiophene ring, isoquinoline ring, quinoxaline ring, quinazoline, phenanthridine ring, phenanthroline ring, pyridine ring, pyrazine ring, pyrimidine ring, pyridazine ring, indole ring, quinoline ring, acridine ring, carbazole ring, furan ring, thiophene ring, benzoxazole ring, benzothiazole ring, benzimidazole ring, dibenzofuran ring, triazine ring, oxazole ring, oxadiazole ring, thiazole ring, thiadiazole ring, triazole ring, and imidazole ring with the residues of dibenzofuran ring, carbazole ring, and dibenzothiophene ring being preferred, and the residues of imidazo[1,2-a]pyridine, imidazo[1,5-a]pyridine, dibenzofuran-1-yl group, dibenzofuran-3-yl group, dibenzofuran-2-yl group, dibenzofuran-4-yl group, 9-phenylcarbazole-3-yl group, 9-phenylcarbazole-2-yl group, 9-phenylcarbazole-4-yl group, dibenzothiophene-2-yl group, and dibenzothiophene-4-yl, dibenzothiophene-1-yl group, and dibenzothiophene-3-yl group being more preferred.

In the case of $Az_1$ and $Az_2$, the unsubstituted or substituted heteroaromatic group containing 3 to 30 ring atoms containing at least one ring nitrogen, preferably containing 5 to 18 ring atoms containing at least one ring nitrogen, may be a non-condensed heteroaromatic group or a condensed heteroaromatic group, containing at least one ring nitrogen. Specific examples are pyridyl, a quinoline group, a phenanthroline group, a pyridazine group, a pyrimidine group, a pyrazine group, a triazine group, a isoquinoline group, a quinolizine group, a cinnoline group, a quinoxaline group, a quinazoline group, a phthalazine group, a naphthyridine group, an acridine group, a phenanthridine group, a phenazine group, a pteridine group, a thiazole group, an oxazole group, an imidazole group, a benzothiazole group, a benzoxazole group, a benzimidazole group, an imidazopyridine group wherein the aforementioned groups are unsubstituted or substituted, preferably unsubstituted or substituted pyridyl, for example a pyridyl substituted pyridyl group, an unsubstituted or substituted quinoline group or an unsubstituted or substituted phenanthroline group. Further preferred groups $Az_1$ and $Az_2$ are mentioned below.

Examples of the unsubstituted or substituted alkyl group having 1 to 25 carbon atoms, preferably 1 to 8 carbon atoms, are methyl group, ethyl group, n-propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neopentyl group and 1-methylpentyl group.

Further preferred are alkyl groups having 1 to 6 carbon atoms. Examples of the alkyl group having 1 to 6 carbon atoms are methyl group, ethyl group, n-propyl group, isopropyl group, n-butyl group, s-butyl group, isobutyl group, t-butyl group, n-pentyl group, n-hexyl group, neopentyl group and 1-methylpentyl group, with methyl group, ethyl group, n-propyl group, isopropyl group, n-butyl group, s-butyl group, isobutyl group and t-butyl group being preferred.

Examples of the unsubstituted or substituted cycloalkyl group having 3 to 18 ring carbon atoms, preferably 3 to 12 ring carbon atoms include cyclopropyl group, cyclobutyl group, cyclopentyl group, cyclohexyl group, cyclooctyl group, and adamantyl group. Most preferred are cycloalkyl groups having 3 to 6 ring carbon atoms, i.e. a cyclopropyl group, a cyclobutyl group, a cyclopentyl group or a cyclohexyl group.

The unsubstituted divalent aromatic hydrocarbon group containing 6 to 30 ring atoms, preferably 6 to 18 ring atoms, more preferably 6 to 14 ring atoms, may be a non-condensed or a condensed divalent aromatic hydrocarbon group. Specific examples thereof include phenylene group, naphthylene group, biphenylene group, terphenylene group, quaterphenylene group, fluoranthene-diyl group, triphenylene-diyl group, phenanthrene-diyl group, fluorene-diyl group, anthracene-diyl, chrysene-diyl, spirofluorene-diyl group, 9,9-diphenylfluorene-diyl group, 9,9'-spirobi[9H-fluorene]-2-diyl group, 9,9-dimethylfluorene-diyl group, benzo[c]phenanthrene-diyl group, benzo[a]triphenylene-diyl group, naphtho[1,2-c]phenanthrene-diyl group, naphtho[1,2-a]triphenylene-diyl group, dibenzo[a,c]triphenylene-diyl group, benzo[a]fluoranthene-diyl group, benzo[j]fluoranthene-diyl group, benzo[k]fluoranthene-diyl group and benzo[b]fluoranthene-diyl group, with phenylene group, naphthylene group, biphenylene group, terphenylene group, phenanthrene-diyl group, triphenylene-diyl group, fluorene-diyl group, spirobifluorene-diyl group, anthracene-diyl and fluoranthene-diyl group being preferred.

The unsubstituted divalent heteroaromatic group containing 3 to 30 ring atoms, preferably 5 to 18 ring atoms, may be a non-condensed heteroaromatic group or a condensed heteroaromatic group. Specific examples thereof include pyrrole-diyl, isoindole-diyl, benzofuran-diyl, isobenzofuran-diyl, benzothiophene-diyl, dibenzothiophene-diyl, isoquinoline-diyl, quinoxaline-diyl, quinazoline-diyl, phenanthridine-diyl, phenanthroline-diyl, pyridine-diyl, pyrazine-diyl, pyrimidine-diyl, pyridazine-diyl, indole-diyl, quinoline-diyl, acridine-diyl, carbazole-diyl, furan-diyl, thiophene-diyl, benzoxazole-diyl, benzothiazole-diyl, benzimidazole-diyl, dibenzofuran-diyl, triazine-diyl, oxazole-diyl, oxadiazole-diyl, thiazole-diyl, thiadiazole-diyl, triazole-diyl, and imidazole-diyl with the residues of dibenzofuran-diyl, carbazole-diyl, and dibenzothiophene-diyl being preferred.

Examples of the optional substituent(s) indicated by "substituted or unsubstituted" and "may be substituted" referred to above or hereinafter include a halogen atom, a cyano group, an alkyl group having 1 to 25, preferably 1 to 8 carbon atoms, a cycloalkyl group having 3 to 18, preferably 3 to 12 ring carbon atoms, an alkoxy group having 1 to 25, preferably 1 to 8 carbon atoms, an alkylamino group having 1 to 25 carbon atoms, preferably 1 to 5 carbon atoms, a carboxyalkyl group having 1 to 25 carbon atoms, preferably 1 to 5 carbon atoms, a carboxamidalkyl group having 1 to 25 carbon atoms, preferably 1 to 5 carbon atoms, a silyl group, a $C_6$ to $C_{24}$ aryl group, preferrably a $C_6$ to $C_8$ aryl group, an aryloxy group having 6 to 24, preferably 6 to 18 ring carbon atoms, an aralkyl group having 7 to 24, preferably 7 to 20 carbon atoms, an alkylthio group having 1 to 25, preferably 1 to 5 carbon atoms, an arylthio group having 6 to 24, preferably 6 to 18 ring carbon atoms, an arylamino group having 6 to 30 carbon atoms, preferably 6 to 18 carbon atoms, a carboxyaryl group having 6 to 24 carbon atoms, preferably 6 to 18 carbon atoms, a carboxamidaryl group having 6 to 24 carbon atoms, preferably 6 to 18 carbon atoms, and a heteroaromatic group having 3 to 30 ring atoms, preferably 5 to 18 ring atoms. The substituents may in turn be unsubstituted or substituted, preferably unsubstituted.

The alkyl group having 1 to 25, preferably 1 to 8 carbon atoms, the $C_6$ to $C_{24}$ aryl group, preferably $C_6$ to $C_{18}$ aryl group, and cycloalkyl group having 3 to 18 ring carbon atoms, preferably 3 to 12 ring carbon atoms, are defined above.

Examples of the alkenyl group having 2 to 25 carbon atoms include those disclosed as alkyl groups having 2 to 25 carbon atoms but comprising at least one double bond, preferably one, or where possible, two or three double bonds.

Examples of the alkynyl group having 2 to 25 carbon atoms include those disclosed as alkyl groups having 2 to 25 carbon atoms but comprising at least one triple bond, preferably one, or where possible, two or three triple bonds.

The silyl group is an alkyl and/or aryl substituted silyl group. Examples of alkyl and/or aryl substituted silyl groups include alkylsilyl groups having 1 to 10 carbon atoms, preferably 1 to 5 carbon atoms, including trimethylsilyl group, triethylsilyl group, tributylsilyl group, dimethylethylsilyl group, t-butyldimethylsilyl group, propyldimethylsilyl group, dimethylisopropylsilyl group, dimethylpropylsilyl group, dimethylbutylsilyl group, dimethyltertiarybutylsilyl group, diethylisopropylsilyl group, alkylarylsilyl groups having 6 to 30 carbon atoms, preferably 6 to 18 carbon atoms in the aryl part and 1 to 10 carbon atoms, preferably 1 to 5 carbon atoms, in the alkyl part including phenyldimethylsilyl group, diphenylmethylsilyl group, diphenyltertiarybutylsilyl group, and arylsilyl groups having 6 to 30 carbon atoms, preferably 6 to 18 carbon atoms, including a triphenylsilyl group, with trimethylsilyl, triphenylsilyl, diphenyltertiarybutylsilyl group and t-butyldimethylsilyl group being preferred.

Examples of halogen atoms include fluorine, chlorine, bromine, and iodine.

Examples of an alkylamino group (alkyl substituted amino group), preferably an alkylamino group having 1 to 25 ring carbon atoms include those having an alkyl portion selected from the alkyl groups mentioned above.

Examples of an arylamino group (aryl substituted amino group), preferably an arylamino group having 6 to 24 ring carbon atoms include those having an aryl portion selected from the aromatic hydrocarbon groups mentioned above.

Examples of the optional aralkyl group having 6 to 30 ring carbon atoms include benzyl group, 2-phenylpropane-2-yl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, β-naphthylmethyl group, 1-, β-naphthylethyl group, 2-β-naphthylethyl group, 1-β-naphthylisopropyl group, 2-β-naphthylisopropyl group, 1-pyrrolylmethyl group, 2-(1-pyrrolyl)ethyl group, p-methylbenzyl group, m-methylbenzyl group, o-methylbenzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, 1-hydroxy-2-phenylisopropyl group, and 1-chloro-2-phenylisopropyl group.

Examples of a carboxyalkyl group (alkyl substituted carboxyl group), preferably a carboxyalkyl group having 1 to 25 carbon atoms, preferably 1 to 5 carbon atoms, include those having an alkyl portion selected from the alkyl groups mentioned above.

Examples of a carboxyaryl group (aryl substituted carboxyl group), preferably a carboxyaryl group having 6 to 24 carbon atoms, preferably 6 to 18 carbon atoms, include those having an aryl portion selected from the aromatic hydrocarbon groups mentioned above.

Examples of a carboxamidalkyl group (alkyl substituted amide group), preferably a carboxamidalkyl group having 1 to 25 carbon atoms, preferably 1 to 5 carbon atoms include those having an alkyl portion selected from the alkyl groups mentioned above.

Examples of a carboxamidaryl group (aryl substituted amide group), preferably a carboxamidaryl group having 6 to 24 carbon atoms, preferably 6 to 18 carbon atoms, include those having an aryl portion selected from the aromatic hydrocarbon groups mentioned above.

The optional substituent is preferably a halogen atom, a cyano group, an alkyl group having 1 to 25 carbon atoms, an aryl group having 6 to 24 ring carbon atoms, preferably 6 to 18 ring carbon atoms, and an heterocyclic group having 3 to 30 ring atoms, preferably 5 to 18 ring atoms; more preferably a cyano group, a phenyl group, a naphthyl group, a biphenyl group, a terphenyl group, a phenanthryl group, a triphenylenyl group, a fluorenyl group, a spirobifluorenyl group, a fluoranthenyl group, a residue based on a dibenzofuran ring, a residue based on a carbazole ring, and a residue based on a dibenzothiophene ring, a methyl group, an ethyl group, a n-propyl group, an isopropyl group, a n-butyl group, a s-butyl group, an isobutyl group, a t-butyl group, a cyclopentyl group, and a cyclohexyl group.

The optional substituent mentioned above may be further substituted by one or more of the optional substituents mentioned above.

The number of the optional substituents depends on the group which is substituted by said substituent(s). Preferred are 1, 2, 3 or 4 optional substituents, more preferred are 1, 2 or 3 optional substituents, most preferred are 1 or 2 optional substituents. In a further preferred embodiment, the groups mentioned above are unsubstituted.

The "carbon number of a to b" in the expression of "substituted or unsubstituted X group having a to b carbon atoms" is the carbon number of the unsubstituted X group and does not include the carbon atom(s) of an optional substituent.

The hydrogen atom referred to herein includes isotopes different from neutron numbers, i.e., light hydrogen (protium), heavy hydrogen (deuterium) and tritium.

The term "unsubstituted" referred to by "unsubstituted or substituted" means that a hydrogen atom is not substituted by one of the groups mentioned above.

The Compounds of Formula (I)

In the compounds of formula (I), L represents an unsubstituted divalent aromatic hydrocarbon group containing 6 to 30 ring atoms or an unsubstituted divalent heteroaromatic group containing 3 to 30 ring atoms. Preferably, L represents an unsubstituted divalent aromatic hydrocarbon group containing 6 to 30 ring atoms, more preferably 6 to 24 ring atoms, most preferably 6 to 16 ring atoms. Further most preferably, L represents an unsubstituted divalent phenyl group, an unsubstituted divalent naphthyl group, an unsubstituted divalent anthryl group, an unsubstituted phenythrenyl group, an unsubstituted triphenylenyl group, an unsubstituted 9,9-dimethyl fluorene group, an unsubstituted 9,9-diphenyl fluorene group, preferably 1,4-phenylene, 1,3-phenylene, 1,4-naphthalene, 1,5-naphthalene, 1,6-naphthylene, 2,6-naphthylene, 2,7-9,9-diphenyl-fluorene, 2,5-9,9-diphenyl-fluorene, 2,7-triphenylene, or 9,10-anthryl.

p is 1, 2 or 3, preferably, p is 1 or 2. In the case that p is at least 2, the groups L are the same or different.

Preferred groups -(L)$_p$- are:

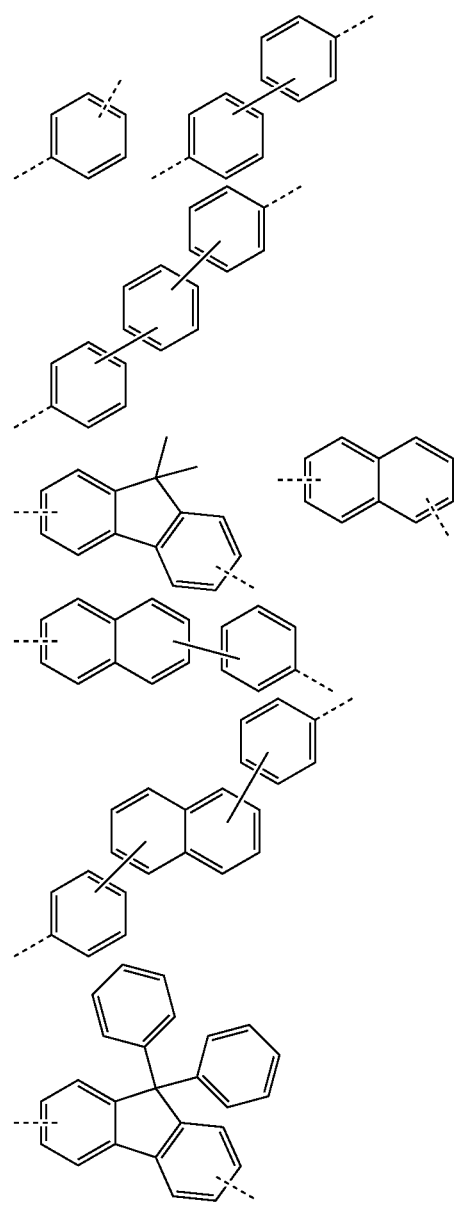

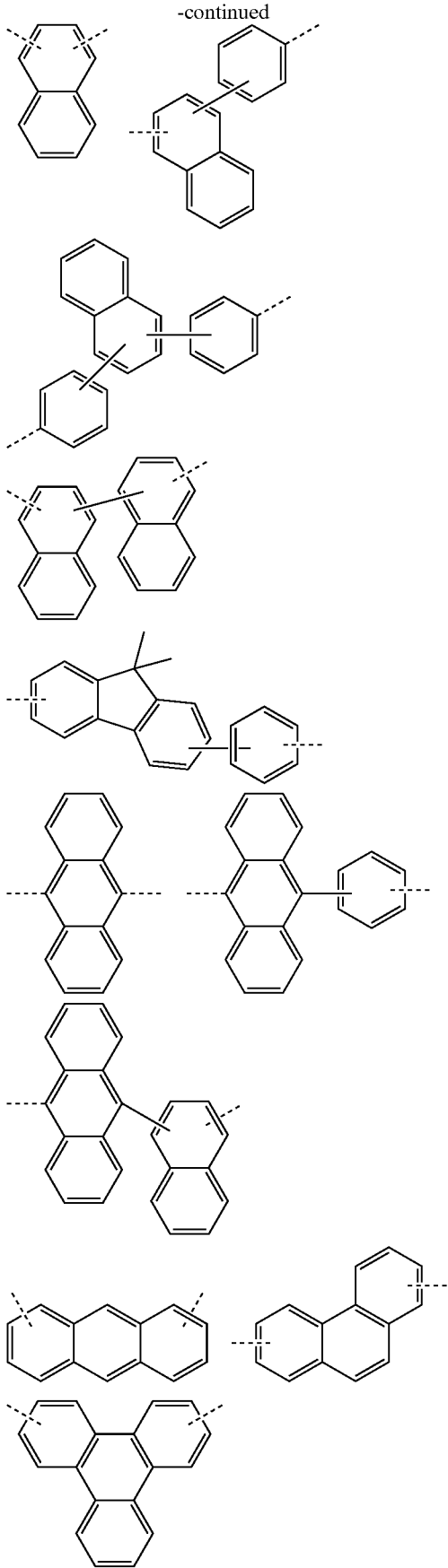

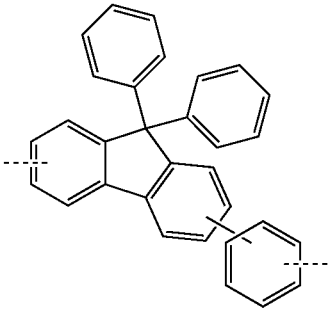

wherein the dotted lines are bonding sites.

$Ar_1$, $Ar_2$ and $Ar_3$ each independently represents an unsubstituted or substituted aromatic hydrocarbon group containing 6 to 30 ring atoms or an unsubstituted or substituted heteroaromatic group containing 3 to 30 ring atoms, wherein at least one of $Ar_1$ and $Ar_2$ is substituted by at least one group $Az_1$ or $Az_2$. Preferably, $Ar_1$, $Ar_2$ and $Ar_3$ each independently represents an unsubstituted or substituted aromatic hydrocarbon group containing 6 to 30 ring atoms, preferably 6 to 24 ring atoms, more preferably 6 to 16 ring atoms, wherein at least one of $Ar_1$ and $Ar_2$ is substituted by at least one group $Az_1$ or $Az_2$.

m and n are each independently 0, 1, 2, 3 or 4, wherein at least one of m and n is not 0. Preferably, m and n are each independently 0, 1 or 2, wherein at least one of m and n is not 0, more preferably, n is 0 or 1 and m is 1.

In the case that m respectively n are 0, no group Az is present at $Ar_2$ respectively $Ar_1$. In this case, $Ar_2$ respectively $Ar_1$ is an end group and not a linker between the triazine group and Az.

Therefore—in the case that n respectively m is 0—$Ar_1$ respectively $Ar_2$ is an unsubstituted or substituted aromatic hydrocarbon group containing 6 to 30 ring atoms or an unsubstituted or substituted heteroaromatic group containing 3 to 30 ring atoms. Preferably, $Ar_1$ respectively $Ar_2$ is an unsubstituted or substituted aromatic hydrocarbon group containing 6 to 30 ring atoms, preferably 6 to 24 ring atoms, more preferably 6 to 16 ring atoms. Most preferably, $Ar_1$ respectively $Ar_2$ is an unsubstituted or substituted phenyl group (including a substituted or unsubstituted biphenyl group), an unsubstituted or substituted fluorene group, or an unsubstituted or substituted naphthyl group, preferably an unsubstituted phenyl group, an unsubstituted biphenyl group, an unsubstituted naphthyl group, an unsubstituted 9,9-diphenyl-fluorenyl group, or an 9,9-dimethyl-fluorenyl group.

In the case that m respectively n is not 0 —$Ar_2$ respectively $Ar_1$ is an unsubstituted or substituted aromatic hydrocarbon group containing 6 to 30 ring atoms or an unsubstituted or substituted heteroaromatic group containing 3 to 30 ring atoms, wherein at least one of $Ar_1$ and $Ar_2$ is substituted by at least one group $Az_1$ or $Az_2$. Preferably, $Ar_1$ respectively $Ar_2$ is an unsubstituted or substituted aromatic hydrocarbon group containing 6 to 30 ring atoms, preferably 6 to 24 ring atoms, more preferably 6 to 16 ring atoms, wherein at least one of $Ar_1$ and $Ar_2$ is substituted by at least one group $Az_1$ or $Az_2$. Most preferably, $Ar_1$ respectively $Ar_2$ is an unsubstituted or substituted phenylene group (including a substituted or unsubstituted divalent biphenyl group), an unsubstituted or substituted fluorene-diyl group, or an unsubstituted or substituted naphthylene group, preferably an unsubstituted phenylene group, an unsubstituted divalent biphenyl group, an unsubstituted fluorene-diyl group, or an unsubstituted naphthylene group, more preferably an unsubstituted 1,3-phenylene group or an unsubstituted 1,4-phenylene group.

$Az_1$ and $Az_2$ each independently represents an unsubstituted or substituted heteroaromatic group containing 3 to 30 ring atoms containing at least one ring nitrogen. Preferably, $Az_1$ and $Az_2$ each independently represents pyridyl, a quinoline group, a phenanthroline group, a pyridazine group, a pyrimidine group, a pyrazine group, a triazine group, a isoquinoline group, a quinolizine group, a cinnoline group, a quinoxaline group, a quinazoline group, a phthalazine group, a naphthyridine group, an acridine group, a phenanthridine group, a phenazine group, a pteridine group, a thiazole group, an oxazole group, an imidazole group, a benzothiazole group, a benzoxazole group, a benzimidazole group, an imidazopyridine group wherein the aforementioned groups are unsubstituted or substituted, preferably unsubstituted or substituted pyridyl, for example a pyridyl substituted pyridyl group, an unsubstituted or substituted quinoline group or an unsubstituted or substituted phenanthroline group.

Most preferred groups $Az_1$ and $Az_2$ each independently are one of the following groups:

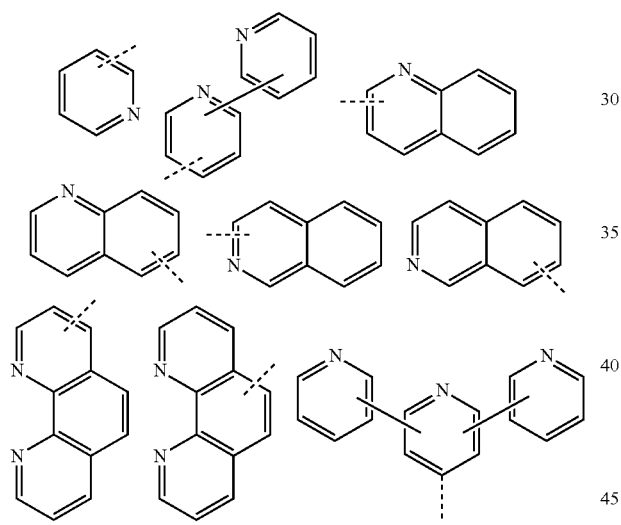

wherein the dotted lines are bonding sites.

$R_a$ and $R_b$ each independently represents hydrogen, an unsubstituted or substituted aromatic hydrocarbon group containing 6 to 30 ring atoms or an unsubstituted or substituted heteroaromatic group containing 3 to 30 ring atoms, an unsubstituted or substituted alkyl group having 1 to 25 carbon atoms, an unsubstituted or substituted cycloalkyl group having 3 to 18 ring carbon atoms or CN, or two adjacent groups $R_a$, and/or two adjacent groups $R_b$, can form together a substituted or unsubstituted carbocyclic or heterocyclic ring;

preferably, $R_a$ and $R_b$ each independently represents hydrogen, an unsubstituted or substituted aromatic hydrocarbon group containing 6 to 30 ring atoms or an unsubstituted or substituted heteroaromatic group containing 3 to 30 ring atoms, or CN, preferably hydrogen, an unsubstituted or substituted aromatic hydrocarbon group containing 6 to 24 ring atoms or an unsubstituted or substituted heteroaromatic group containing 3 to 24 ring atoms, more preferably hydrogen.

s is 0, 1, 2 or 3, preferably 0, 1 or 2, more preferably 0.

t is 0, 1, 2, 3 or 4, preferably 0, 1 or 2, more preferably 0.

Preferred compounds of formula (I) are defined as follows:

L represents an unsubstituted divalent aromatic hydrocarbon group containing 6 to 30 ring atoms, preferably 6 to 24 ring atoms, more preferably 6 to 16 ring atoms, preferably L represents an unsubstituted divalent phenyl group, an unsubstituted divalent naphthyl group or an unsubstituted divalent anthryl group an unsubstituted phenythrenyl group, an unsubstituted triphenylenyl group, an unsubstituted 9,9-dimethyl fluorene group, an unsubstituted 9,9-diphenyl fluorene group, preferably 1,4-phenylene, 1,3-phenylene, 1,4-naphthalene, 1,5-naphthalene, 1,6-naphthylene, 2,6-naphthylene, 2,7-9,9-diphenyl-fluorene, 2,5-9,9-diphenyl-fluorene, 2,7-tripenylene, or 9,10-anthryl;

n is 0 or 1 and m is 1;

$Ar_1$ and $Ar_2$, preferably $Ar_1$, $Ar_2$ and $Ar_3$ each independently represents an unsubstituted or substituted aromatic hydrocarbon group containing 6 to 30 ring atoms, preferably 6 to 24 ring atoms, more preferably 6 to 16 ring atoms, wherein at least one of $Ar_1$ and $Ar_2$ is substituted by at least one group $Az_1$ or $Az_2$; and all other groups, residues and indices in formula (I) are defined as mentioned above.

Preferred compounds of formula (I) are defined as follows (formula (IA)):

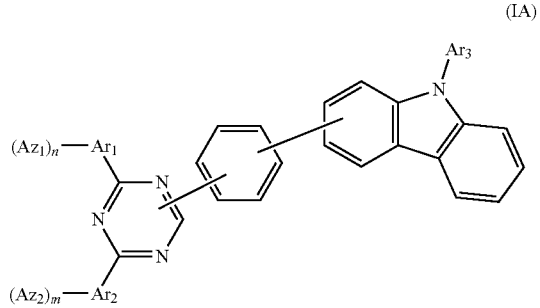

(IA)

wherein $Ar_1$, $Ar_2$ and $Ar_3$ each independently an unsubstituted or substituted phenyl group (including a substituted or unsubstituted biphenyl group) or an unsubstituted or substituted naphthyl group, preferably an unsubstituted phenyl group, an unsubstituted biphenyl group or an unsubstituted naphthyl group, wherein at least one of $Ar_1$ and $Ar_2$ is substituted by at least one group $Az_1$ or $Az_2$;

$Az_1$ and $Az_2$ each independently represents unsubstituted or substituted pyridyl, for example a pyridyl substituted pyridyl group, an unsubstituted or substituted quinoline group or an unsubstituted or substituted phenanthroline group, wherein most preferred groups $Az_1$ and $Az_2$ are mentioned above;

m and n are each independently 0, 1 or 2, wherein at least one of m and n is not 0, preferably n is 0 or 1 and m is 1, wherein at least one of m and n is not 0.

Below, examples for compounds of formula (I) are given:
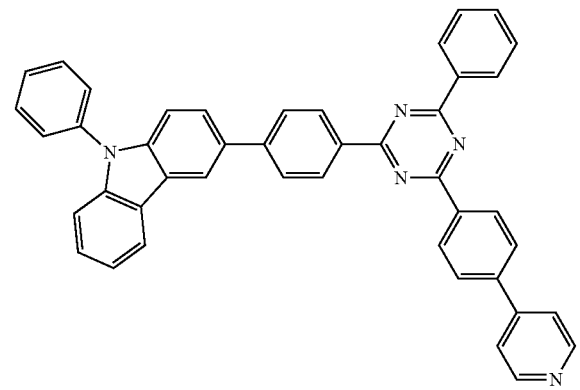
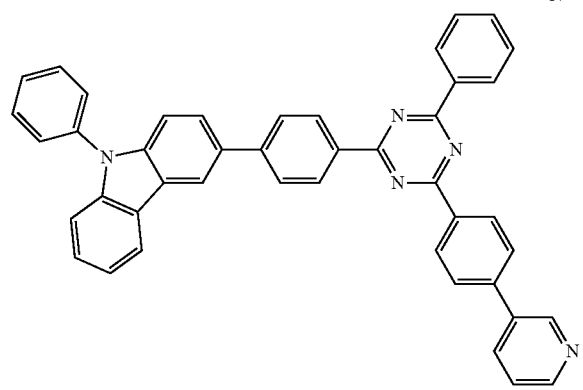
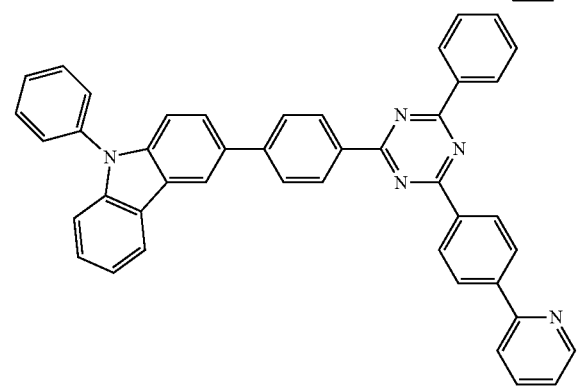
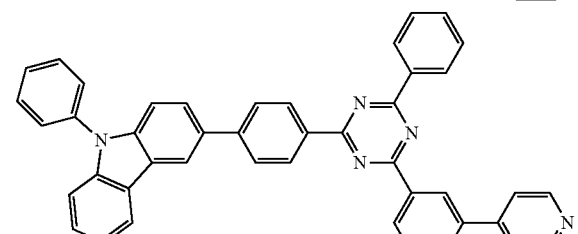
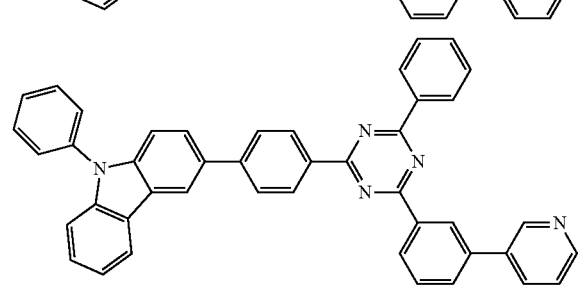
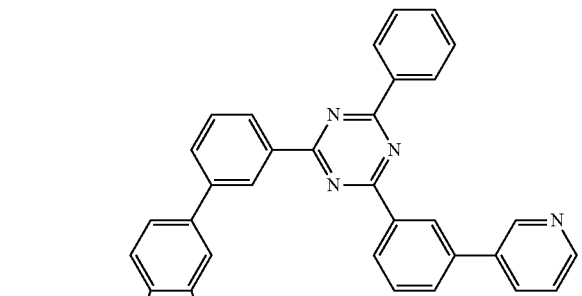
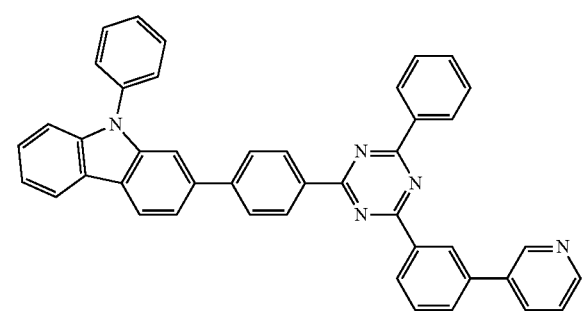
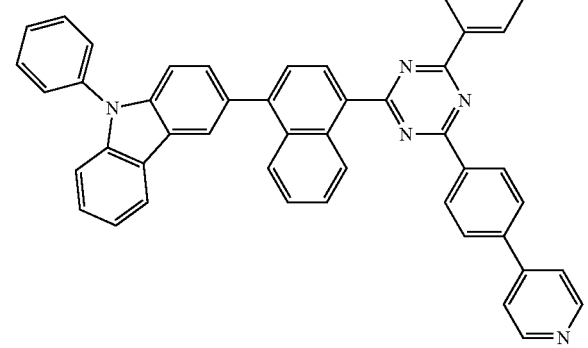
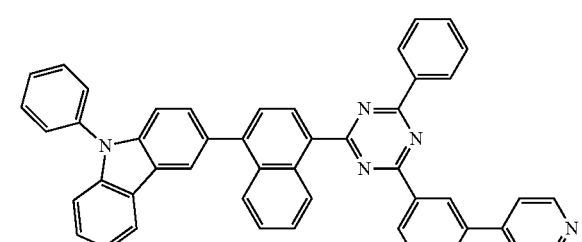
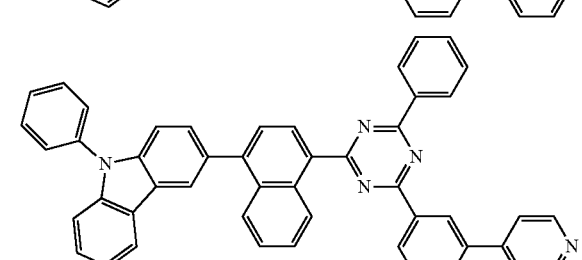
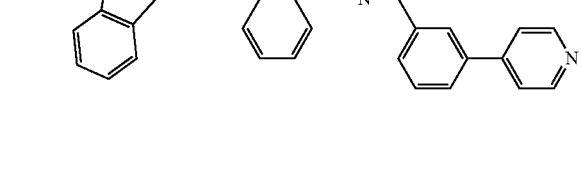

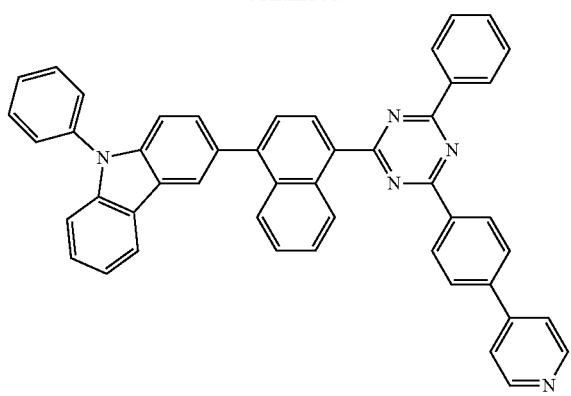
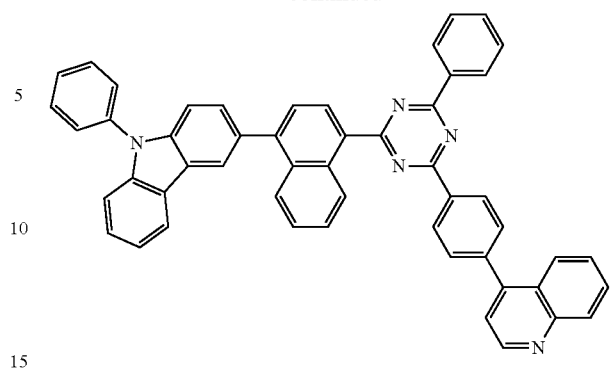
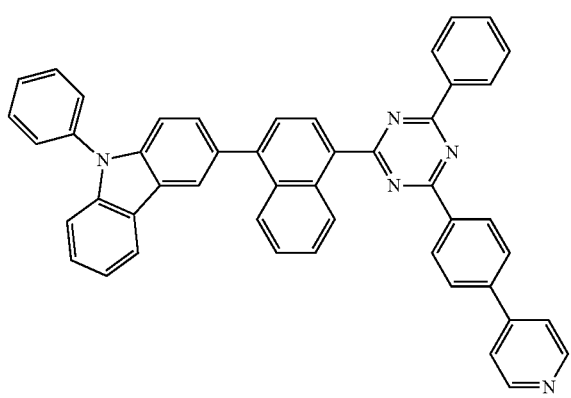
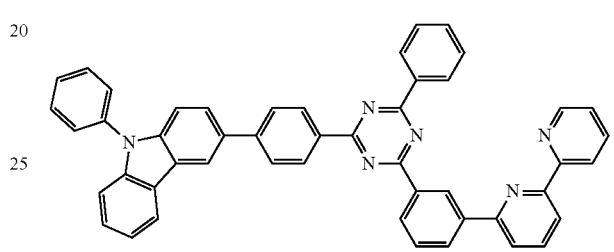
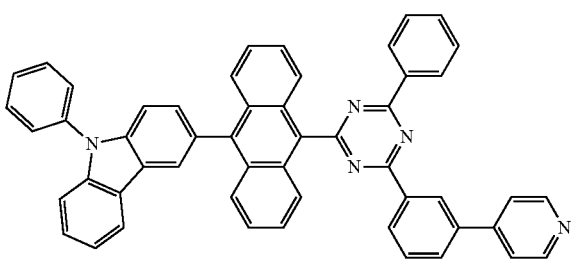
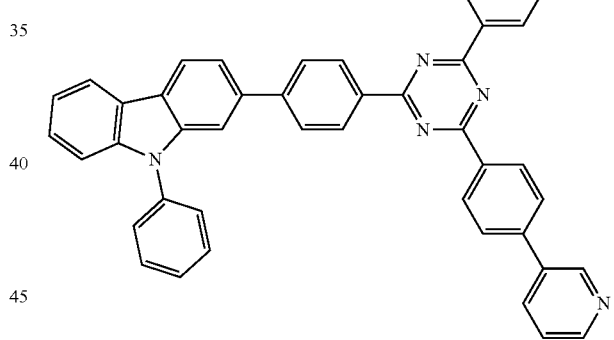
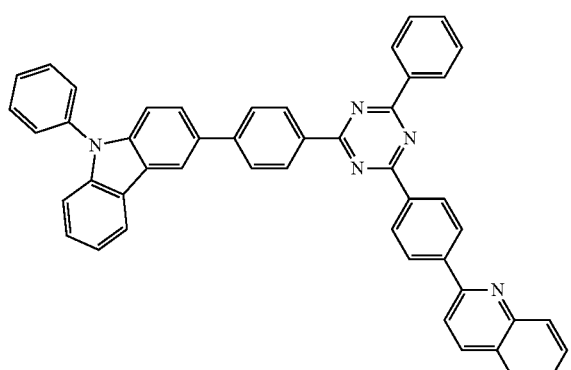
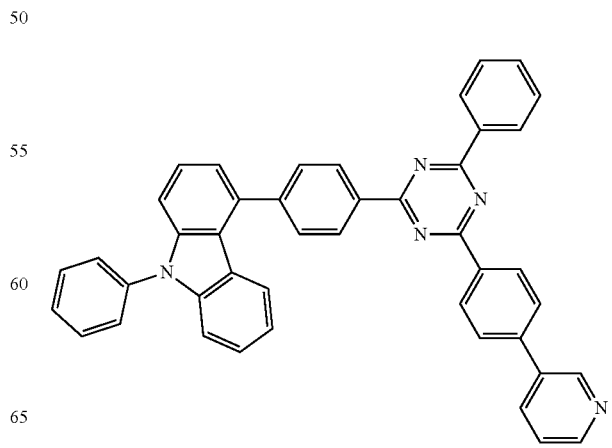

-continued
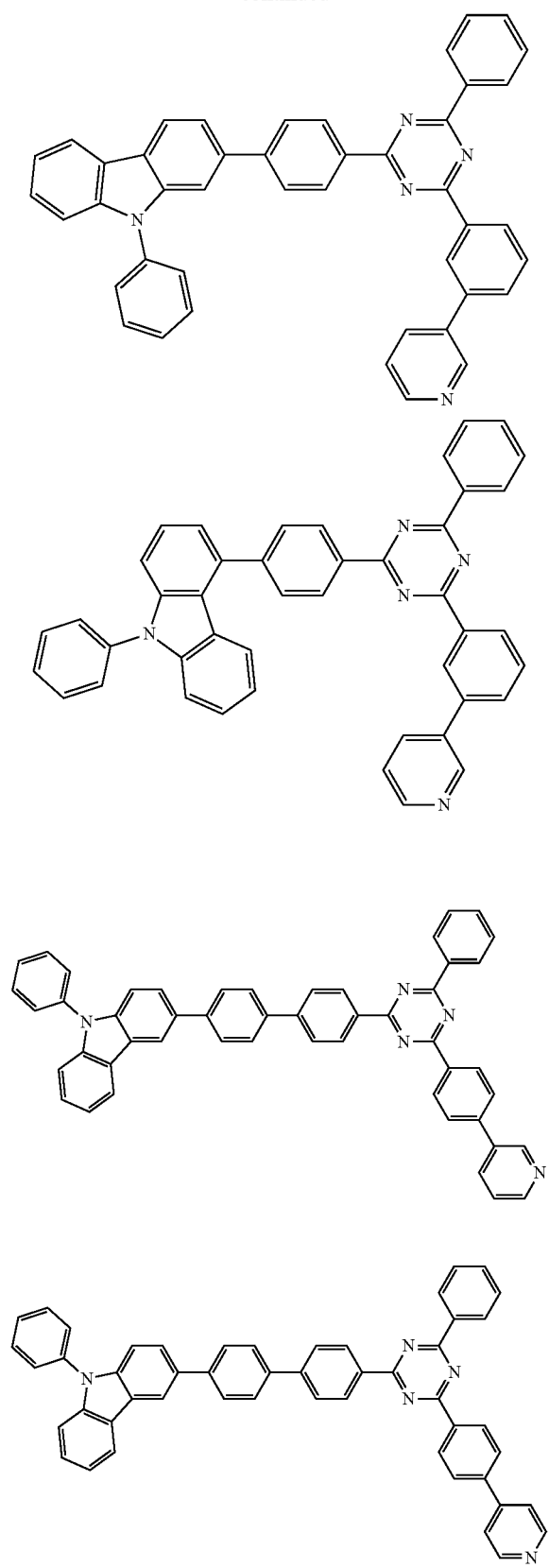
-continued
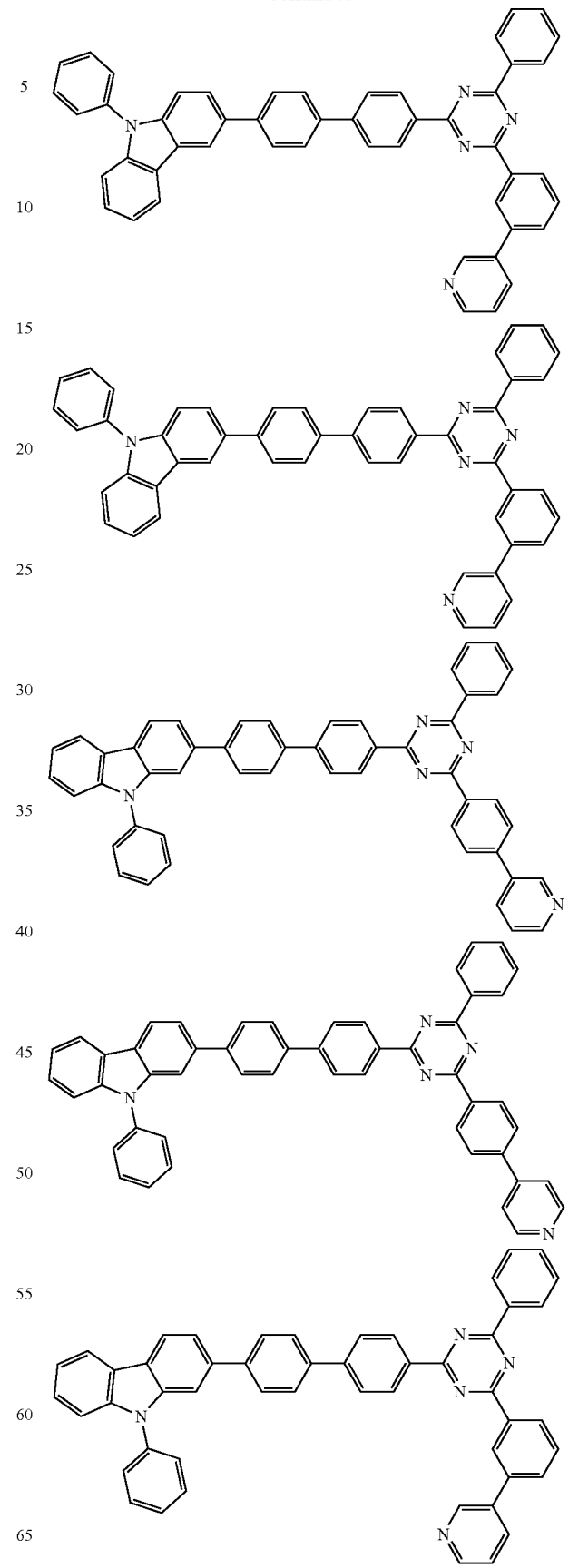

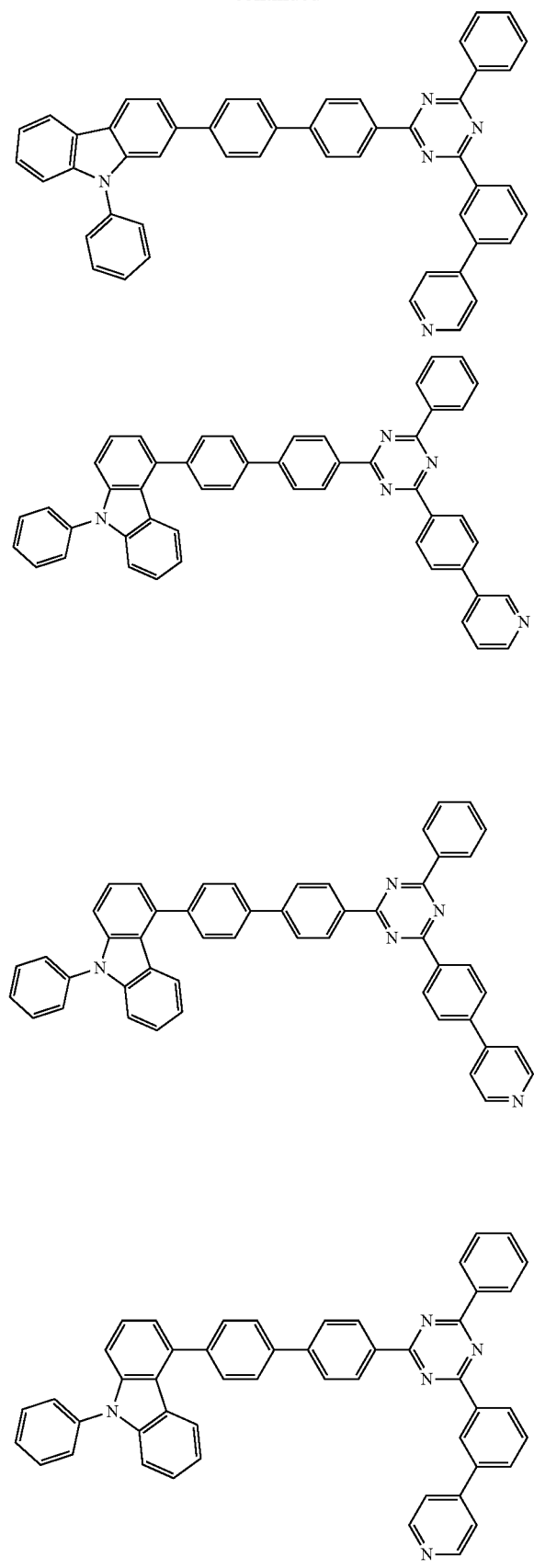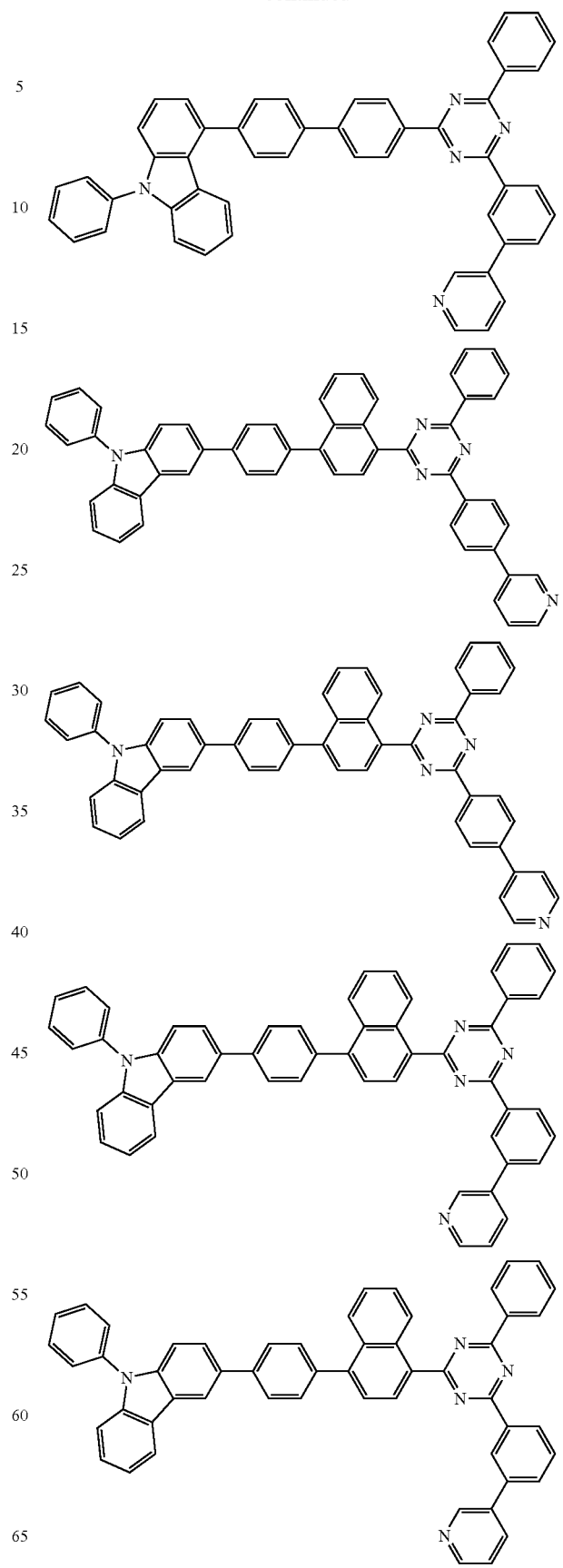

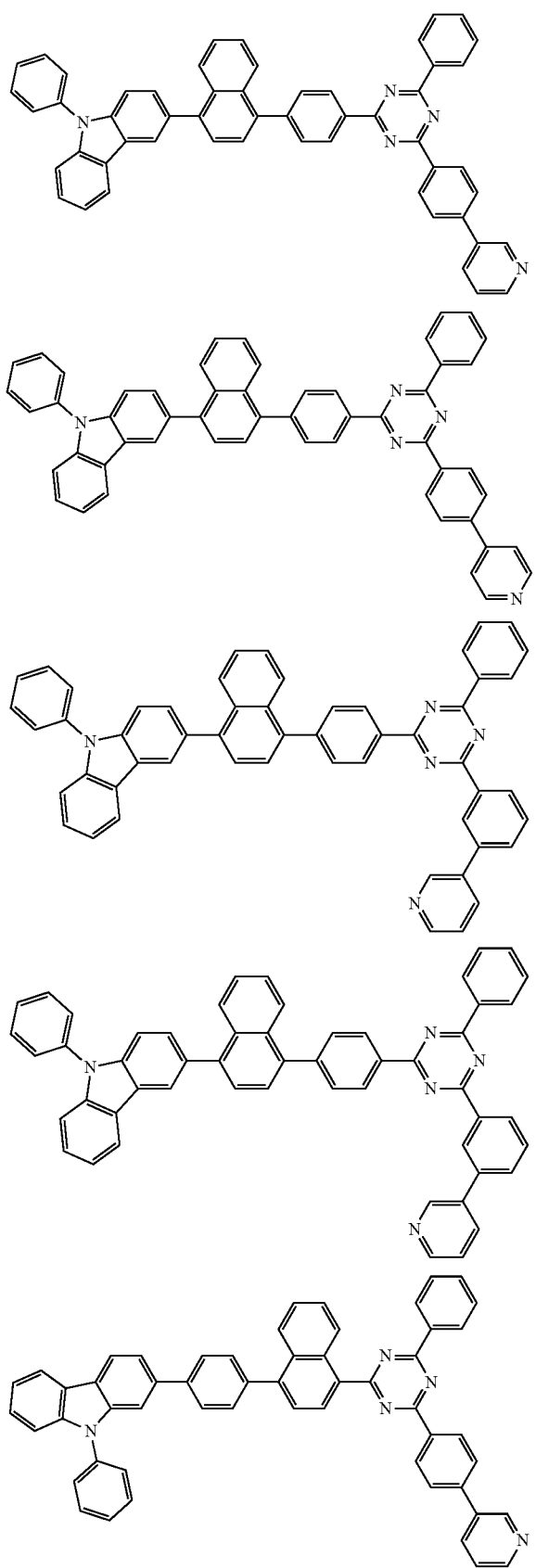
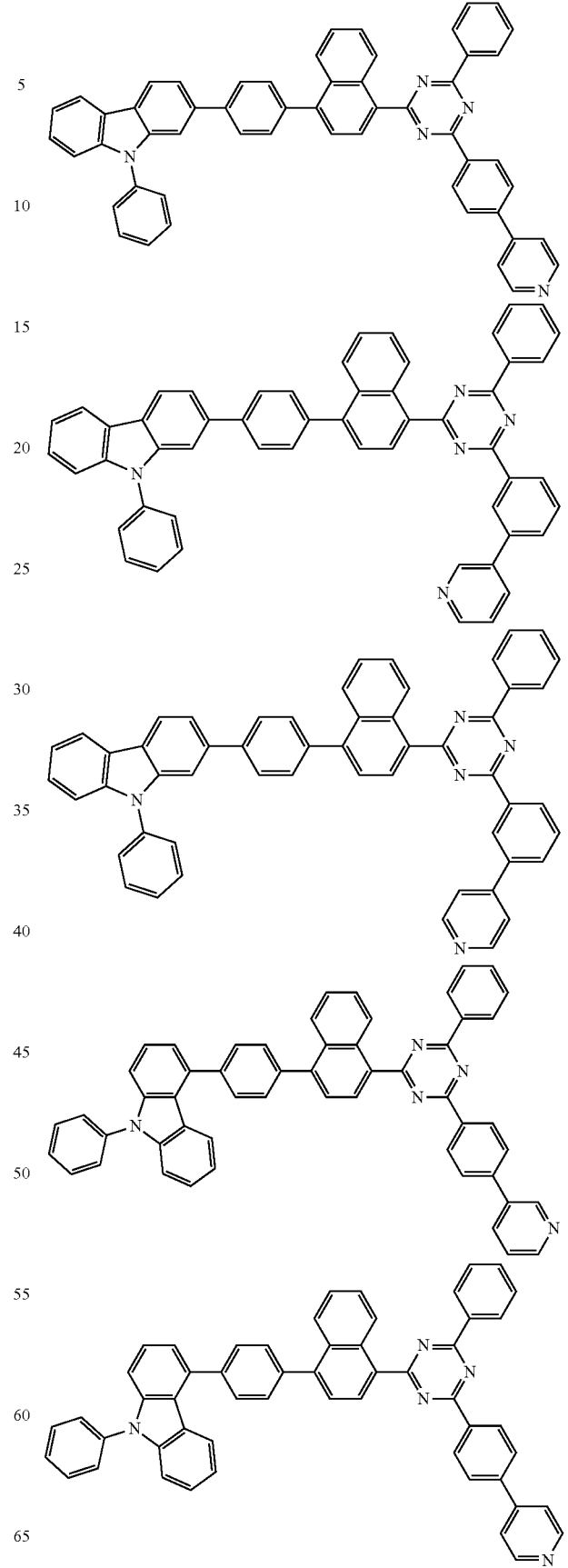

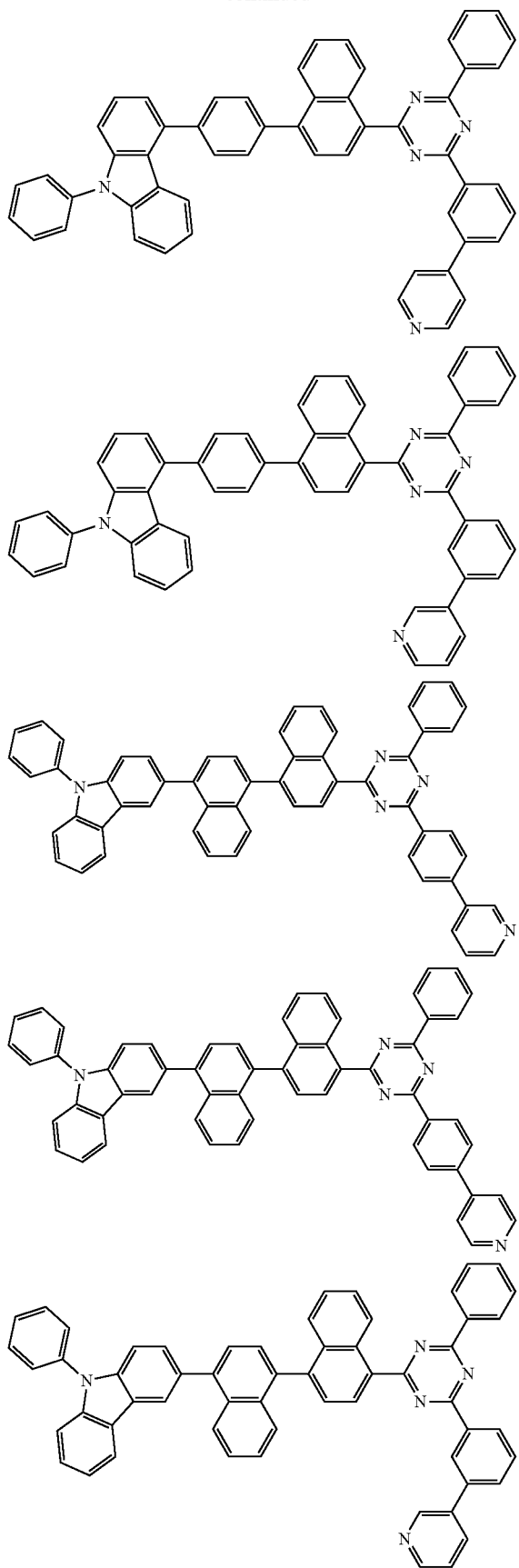
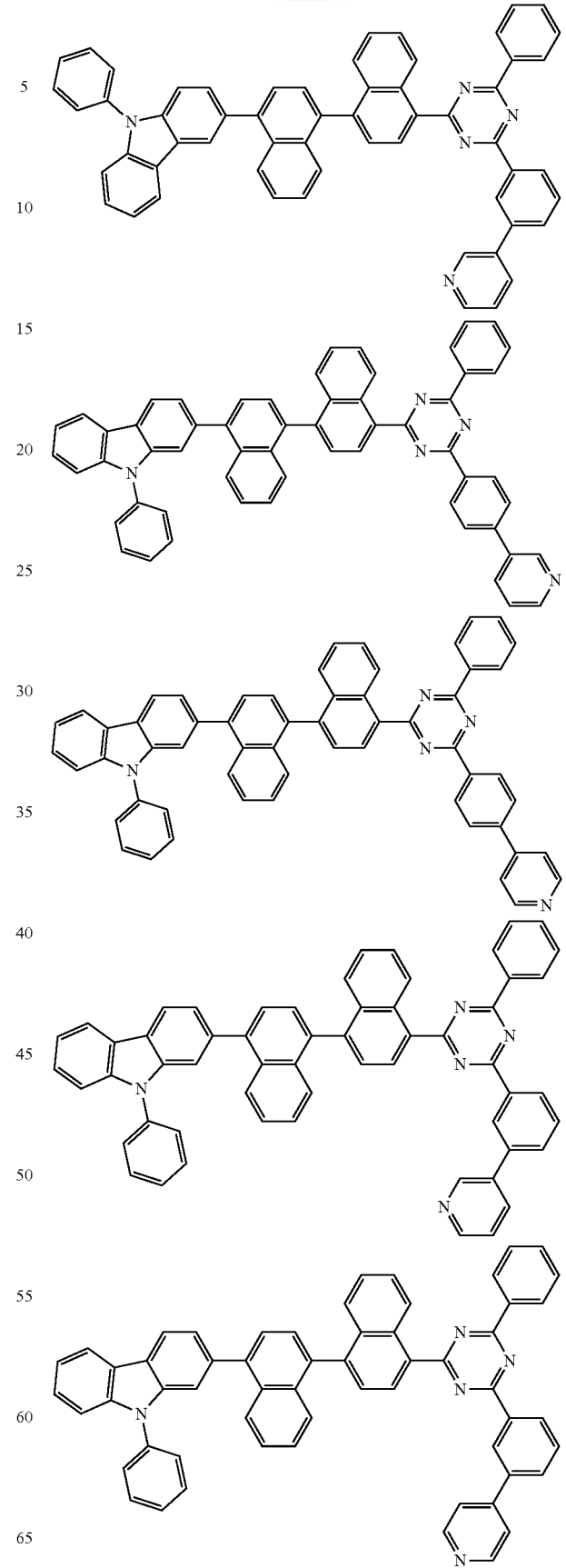

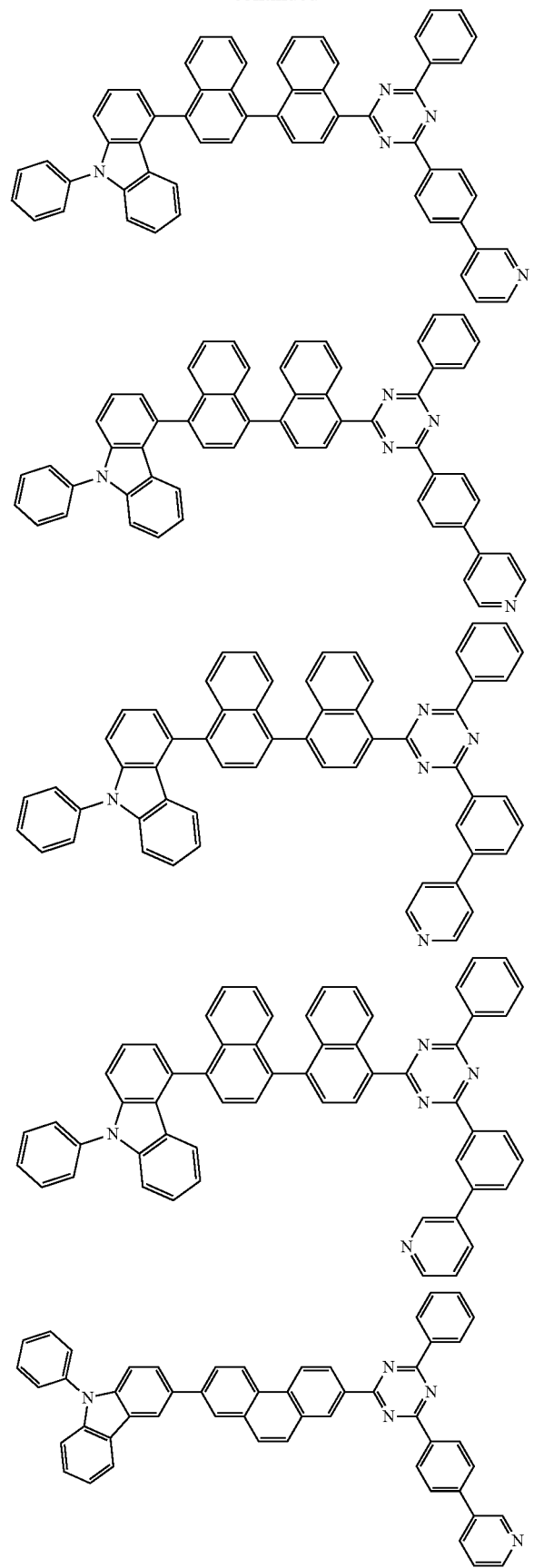
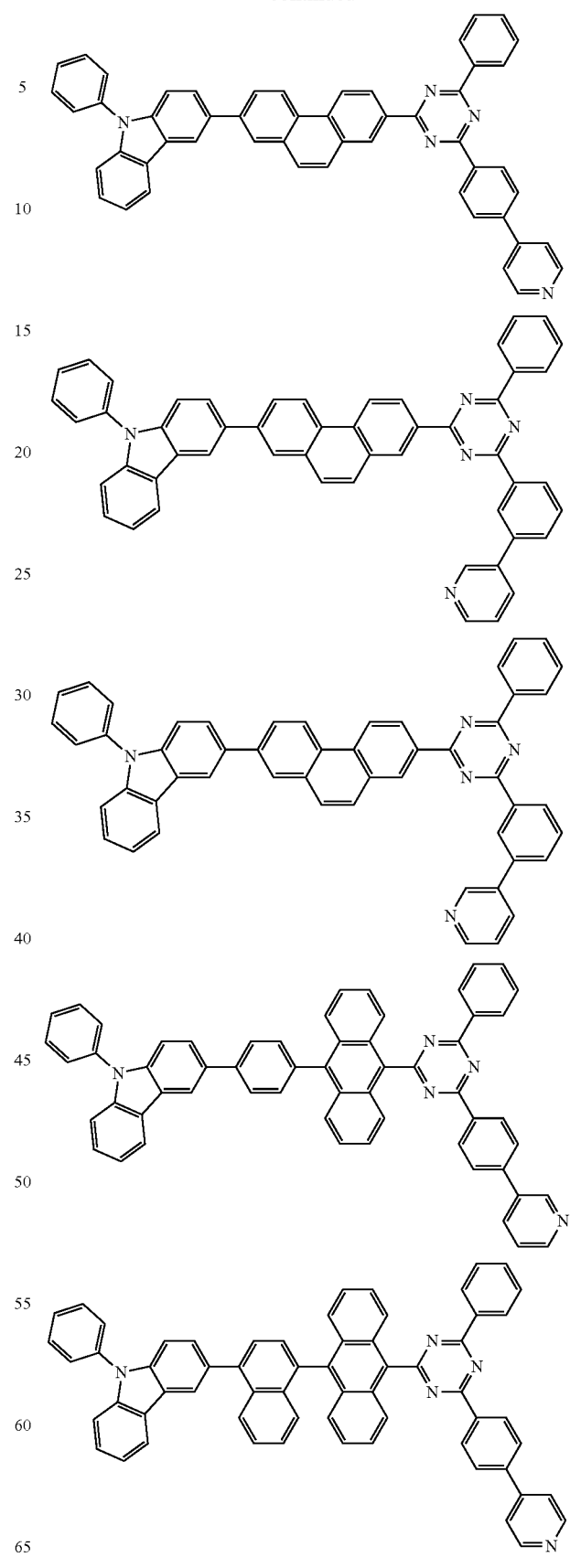

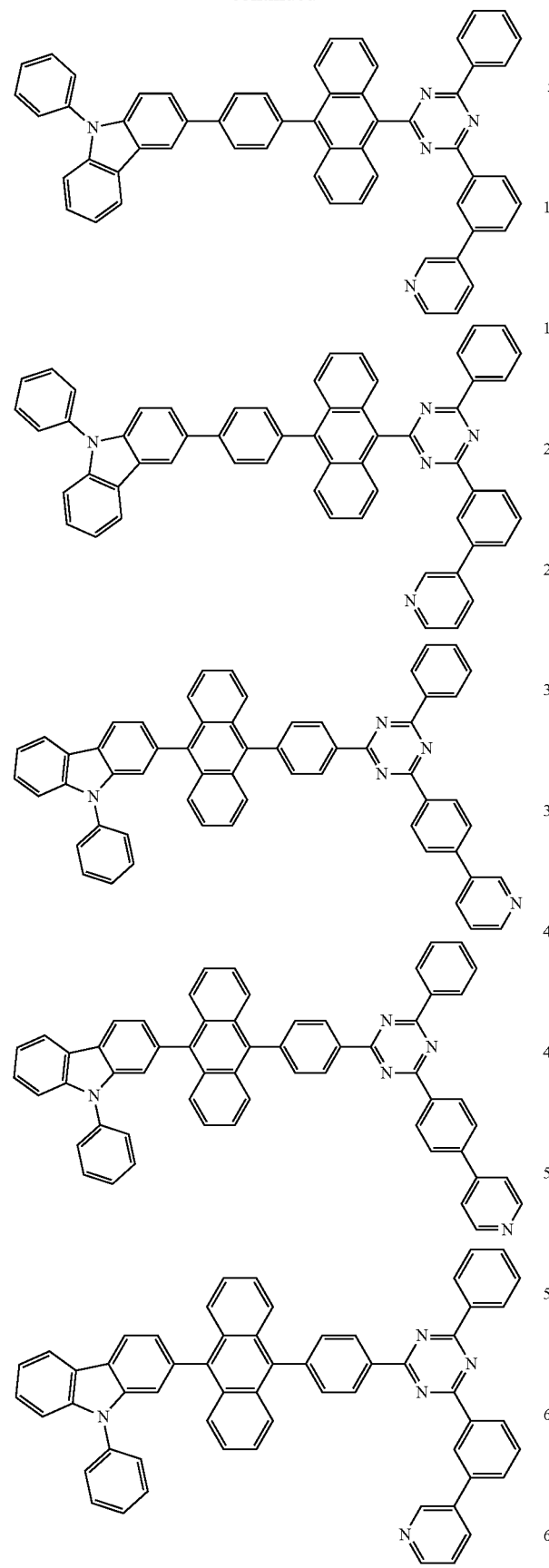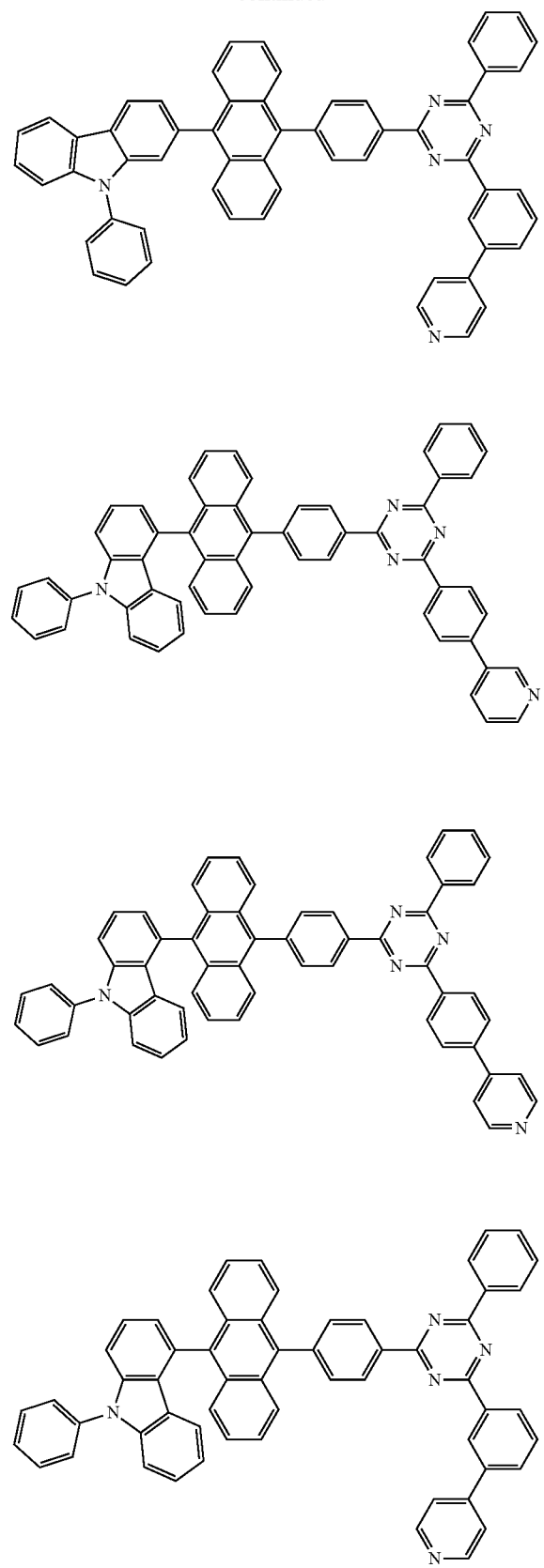

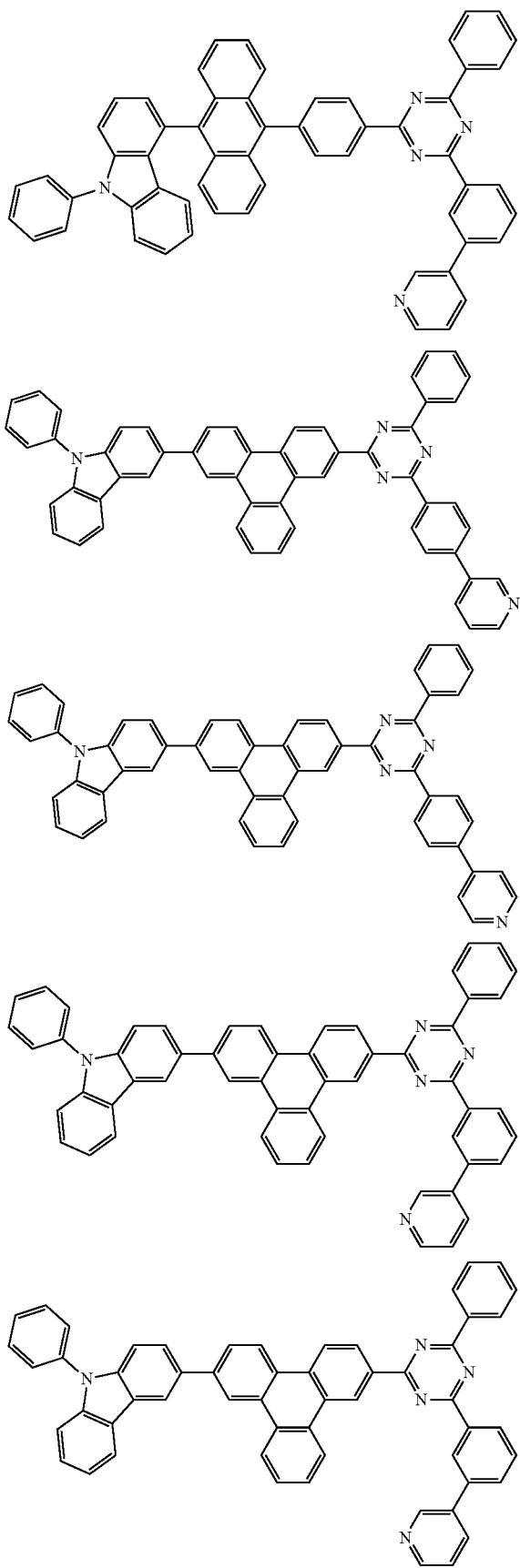
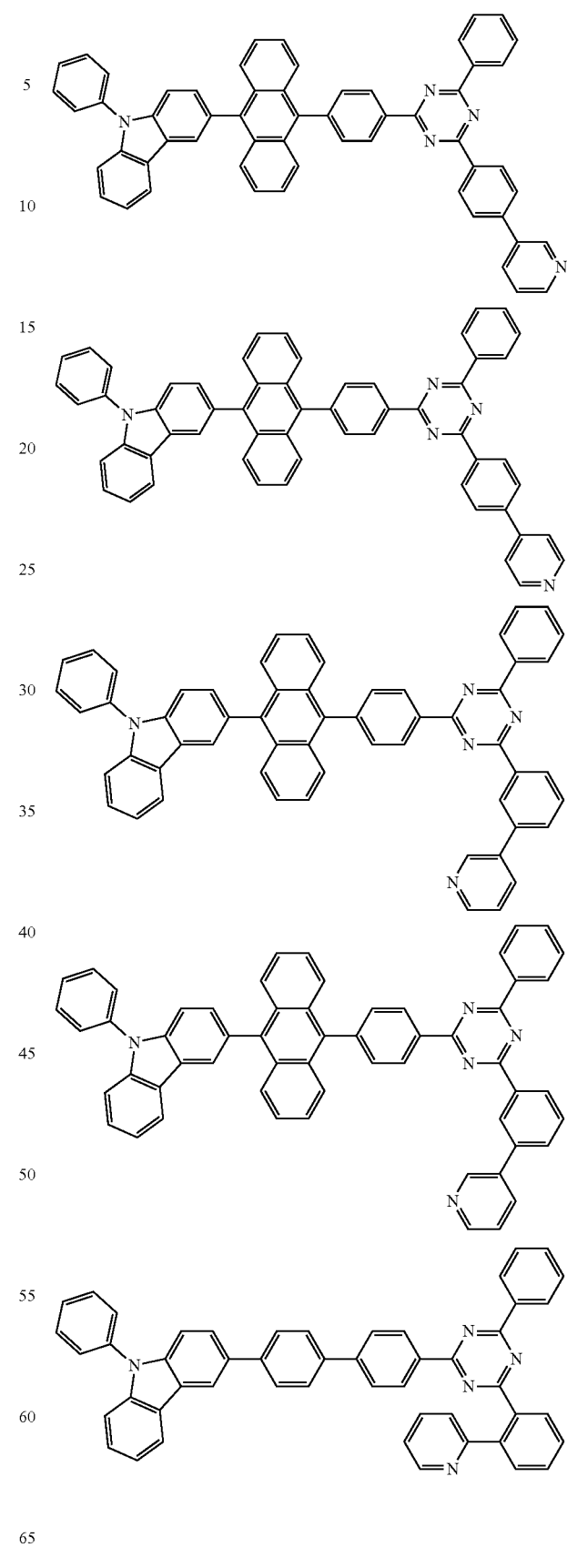

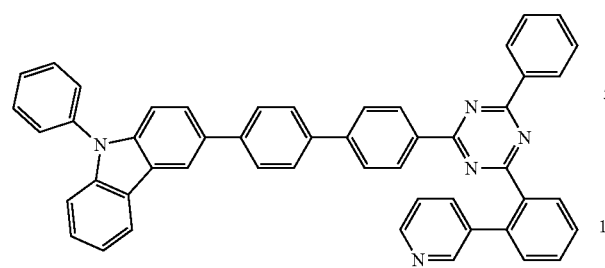
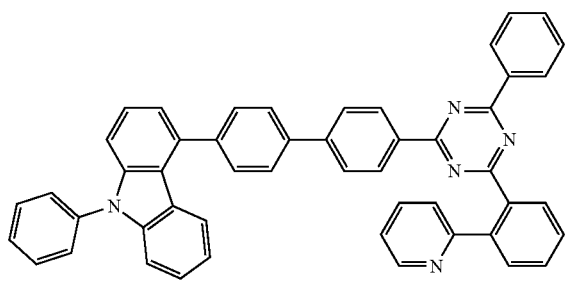

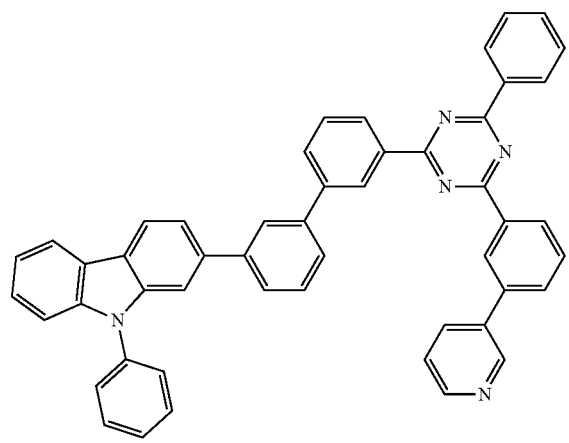
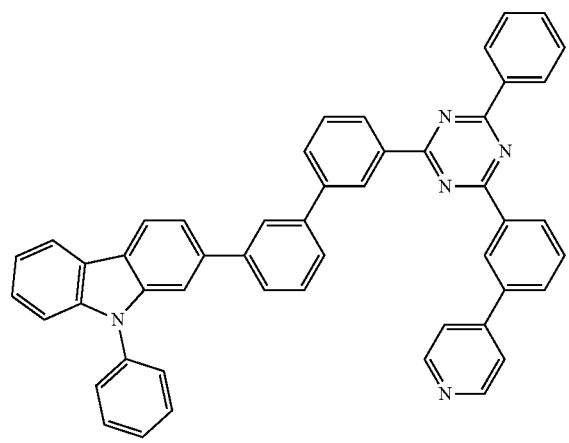
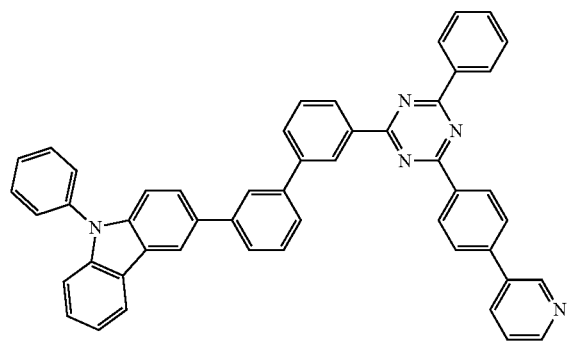
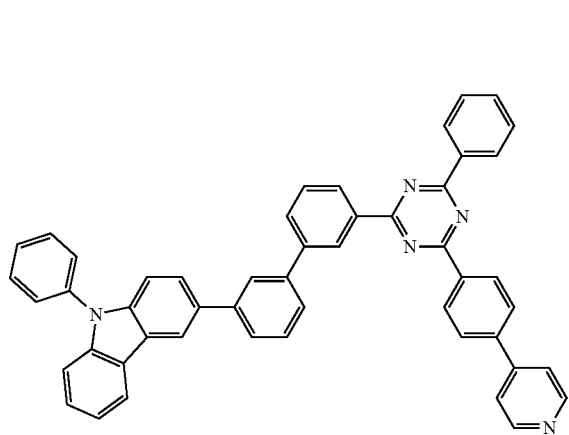
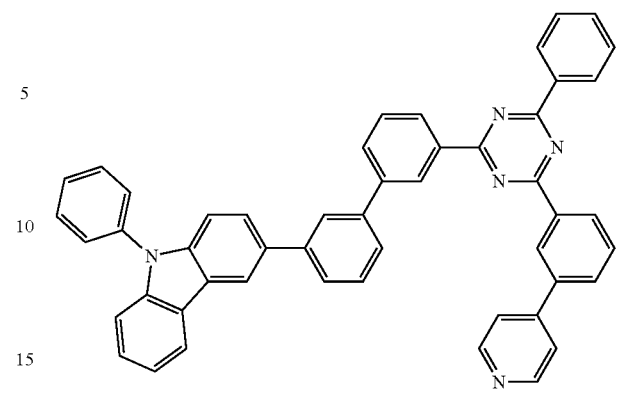
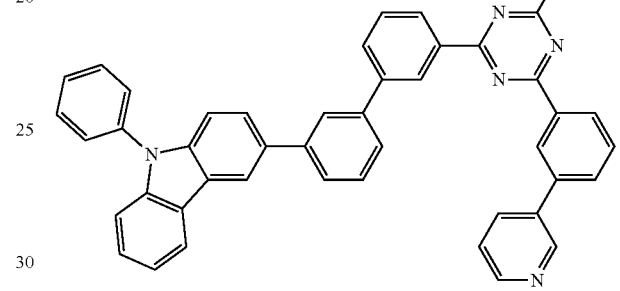
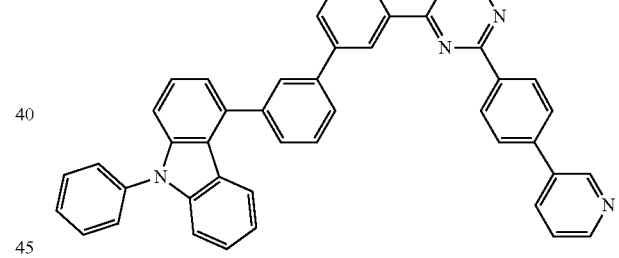
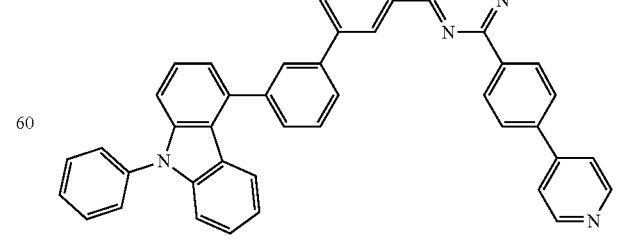

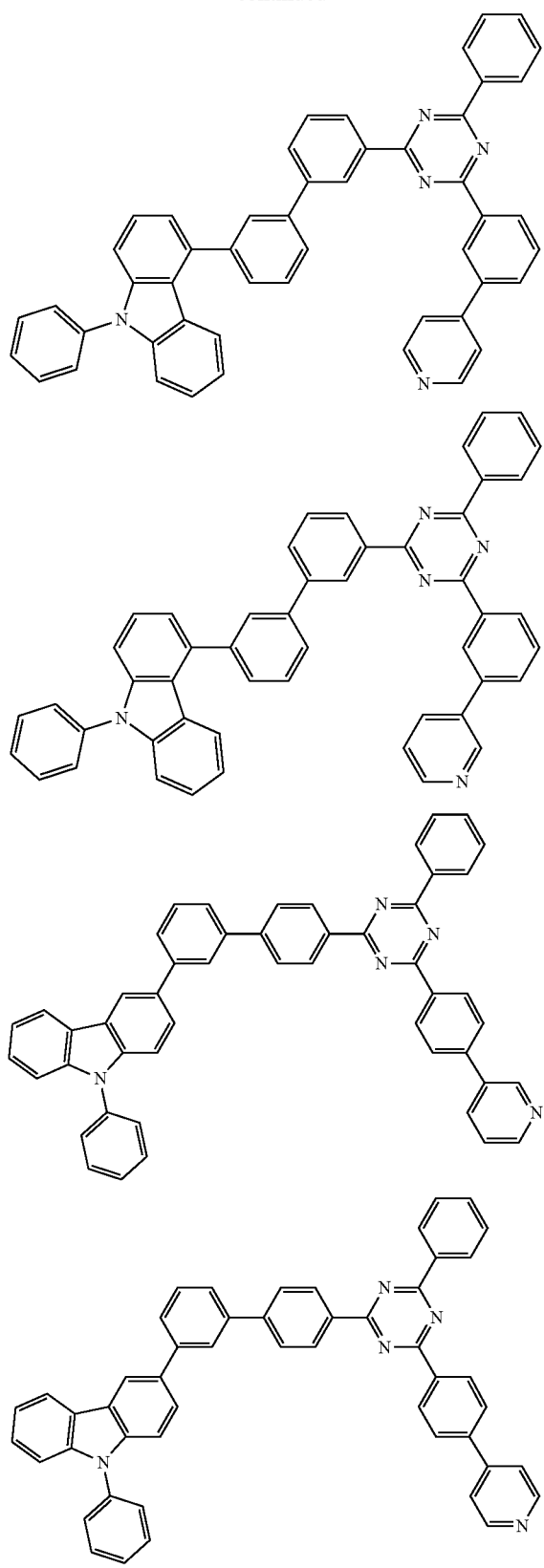
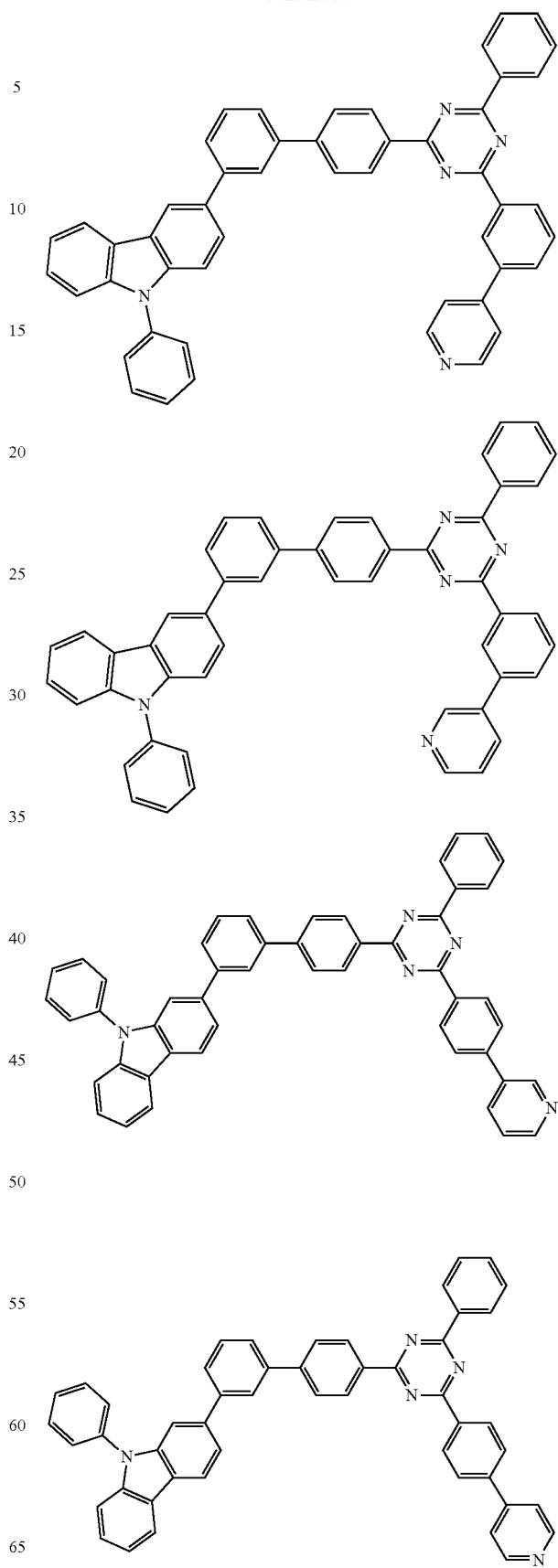

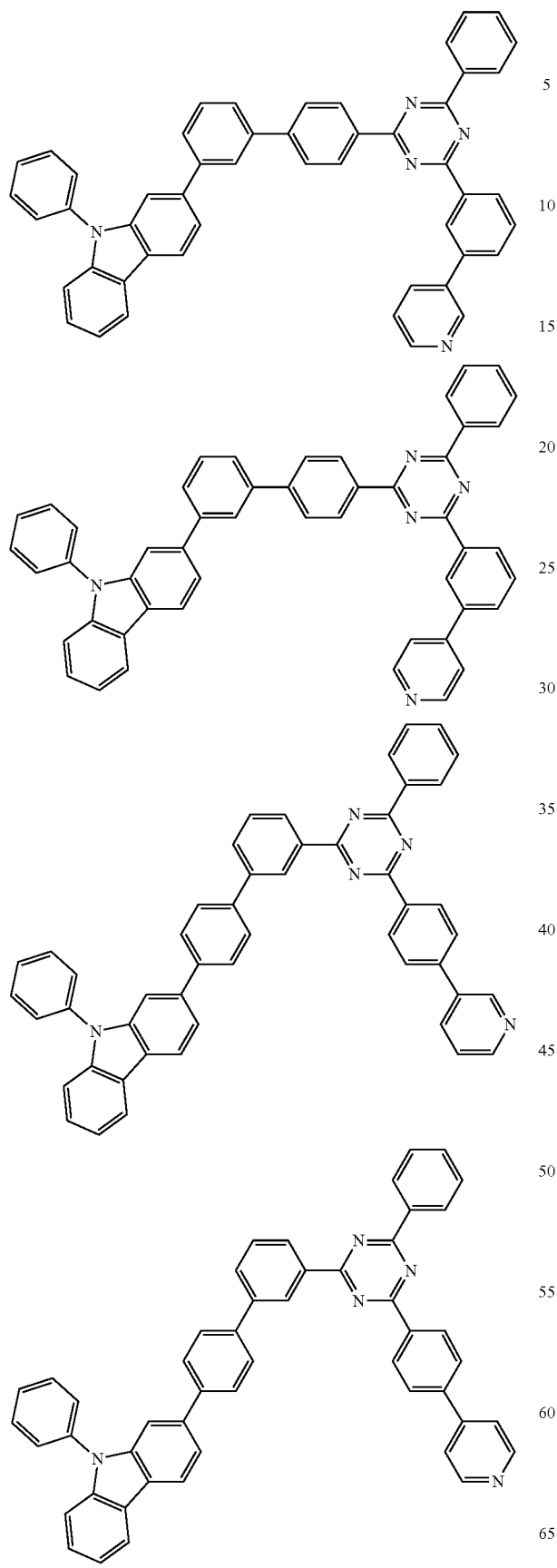
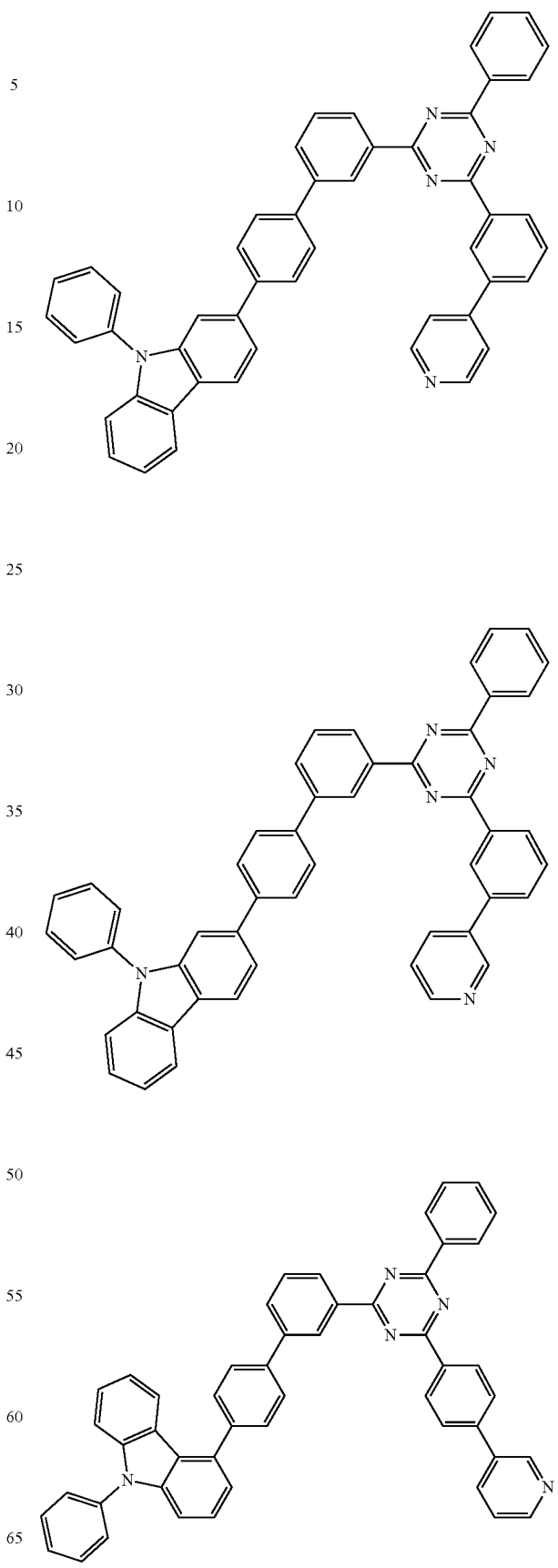

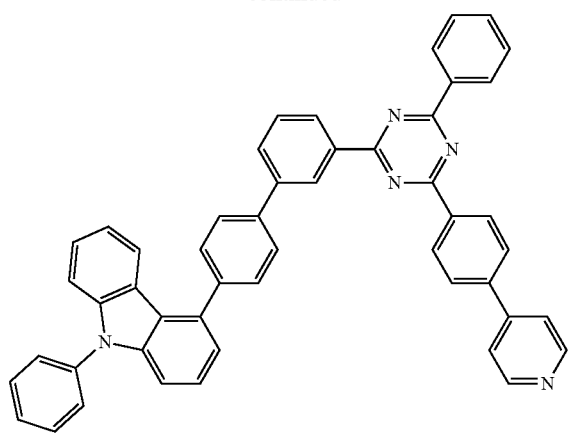
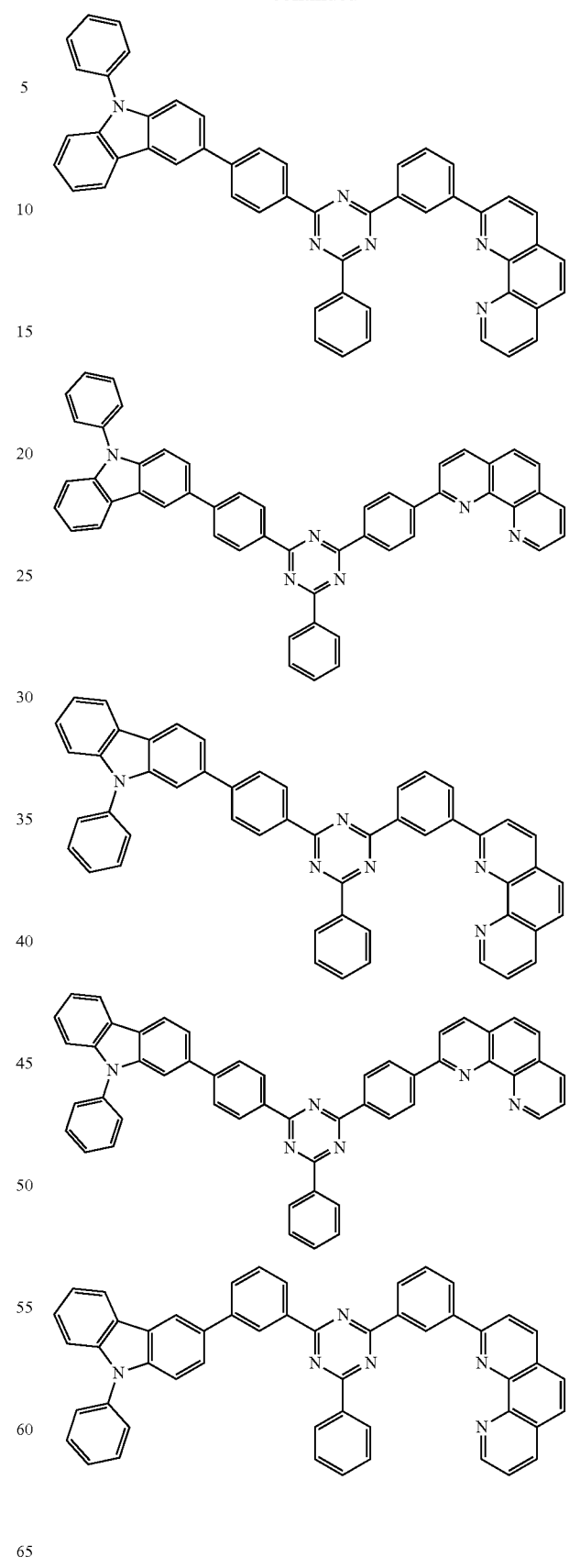

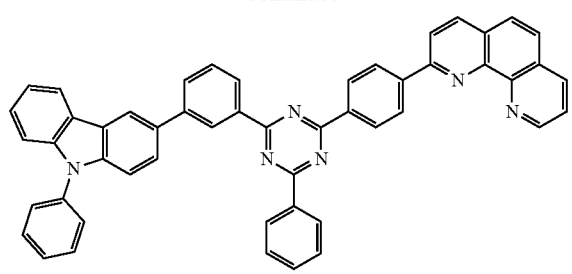
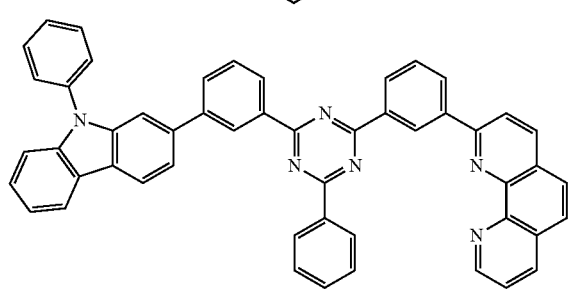
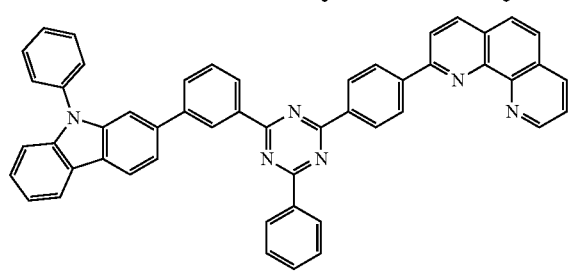
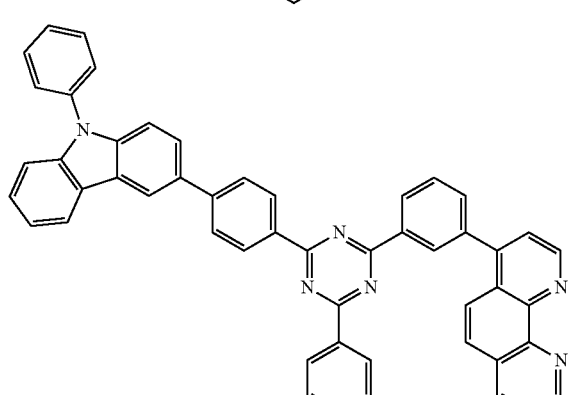
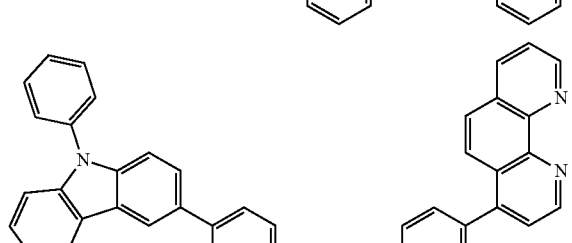
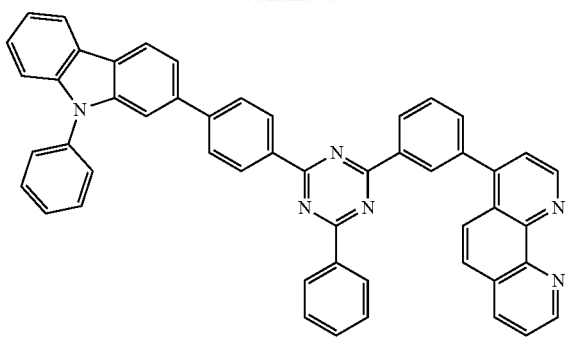
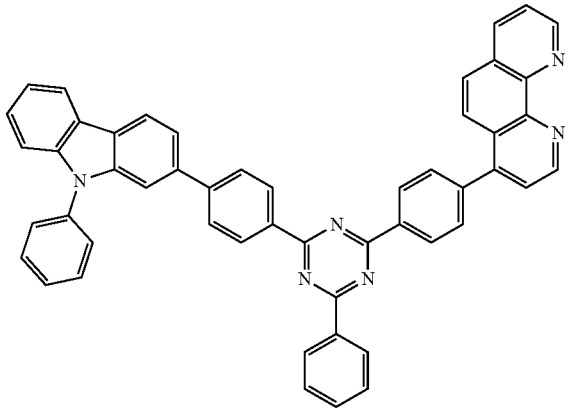

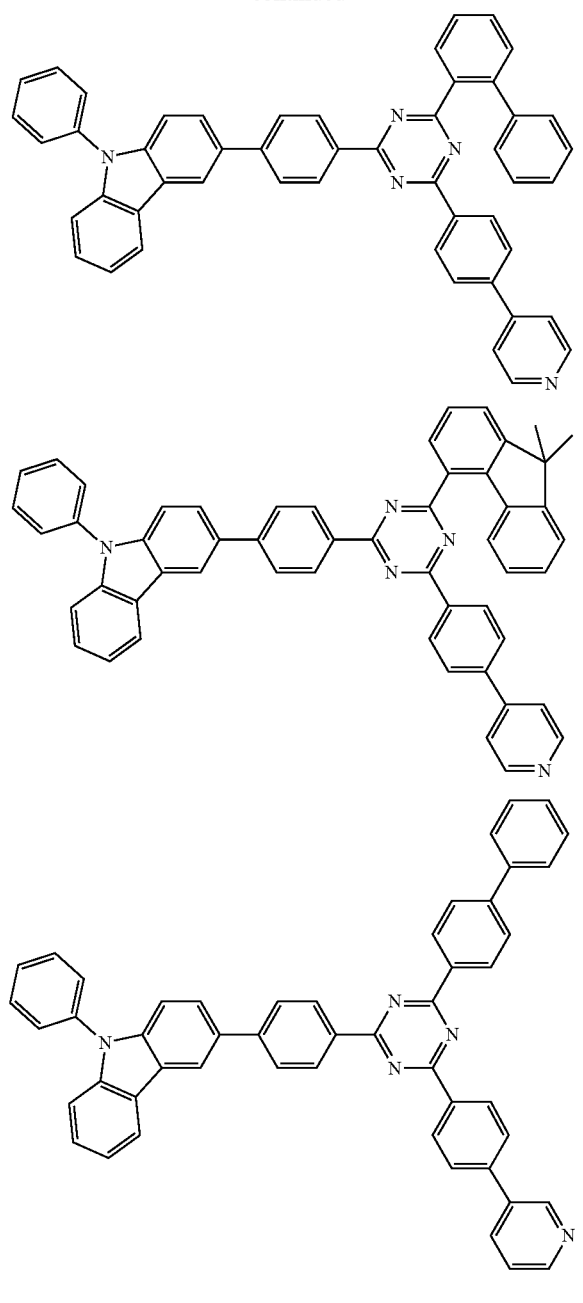
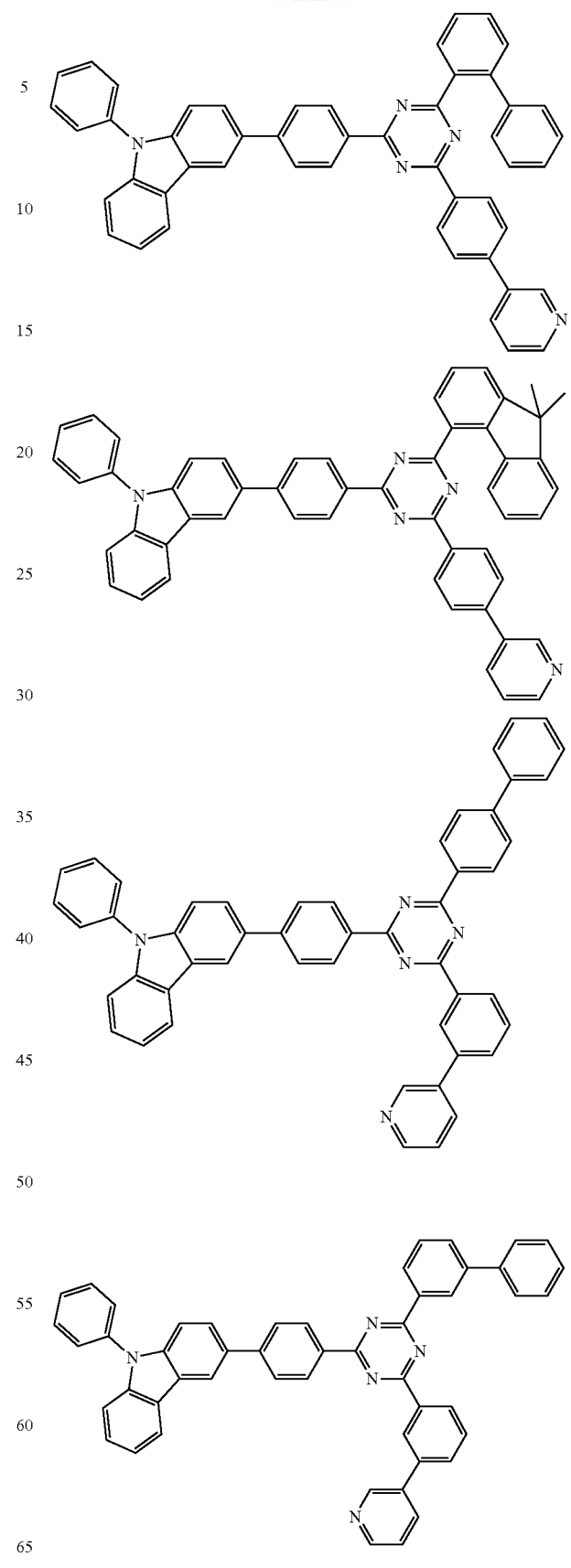

-continued
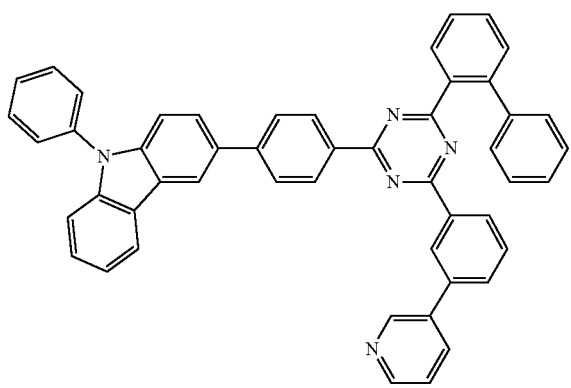
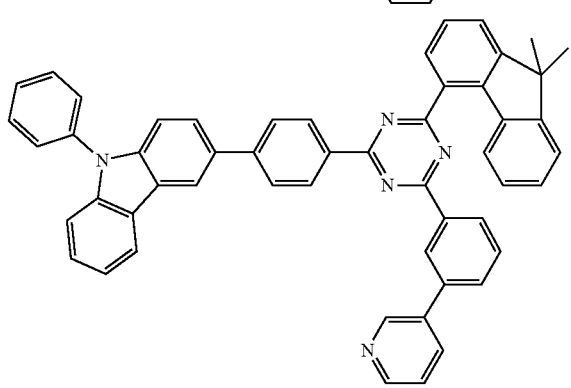
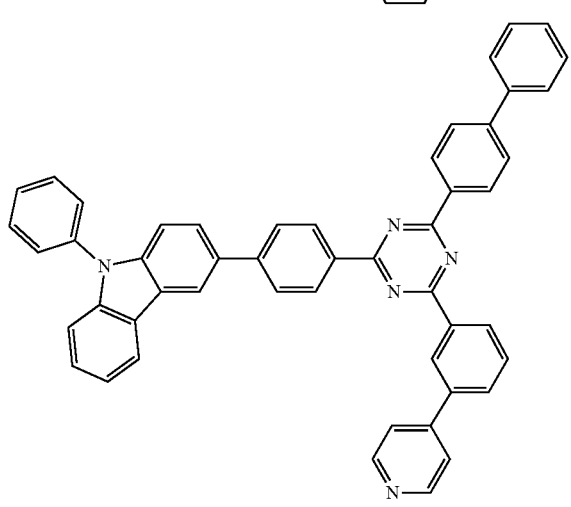
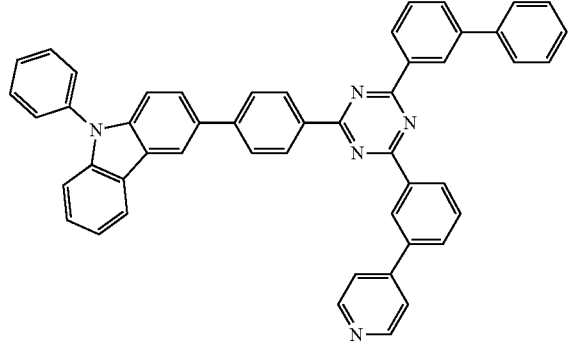
-continued
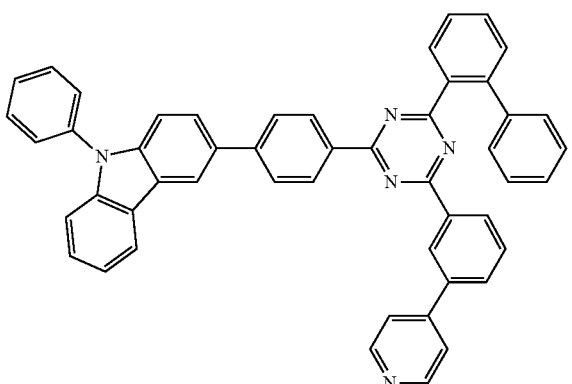
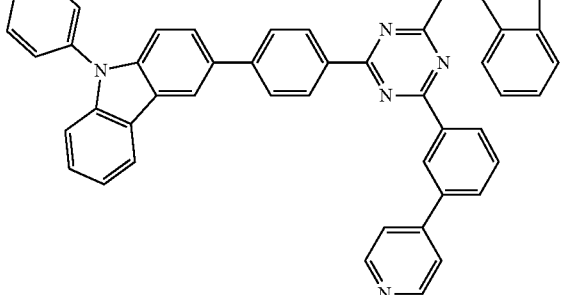
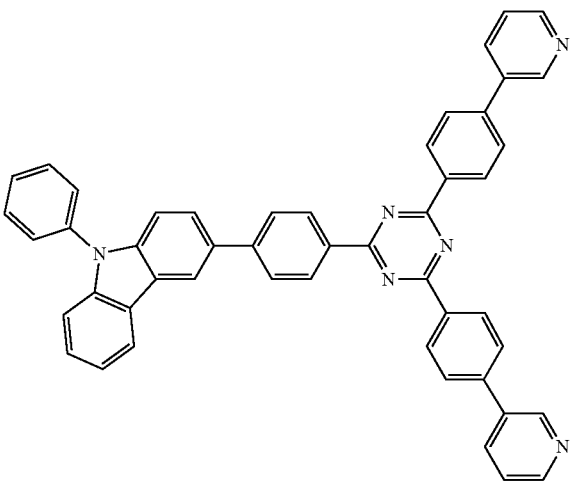
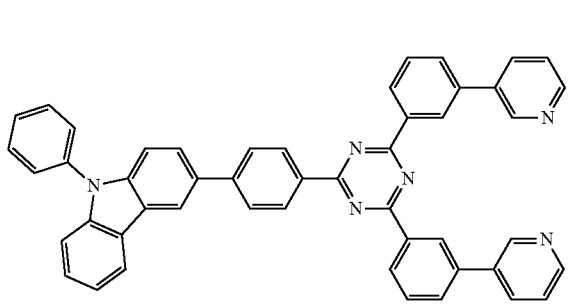

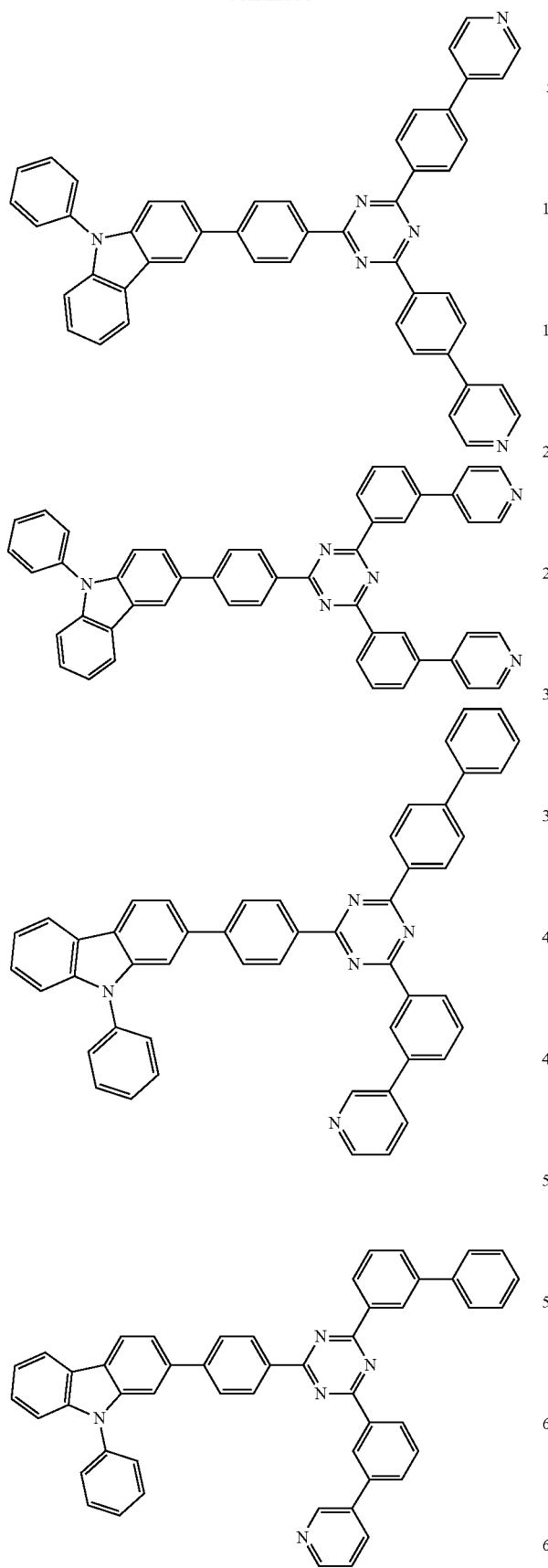
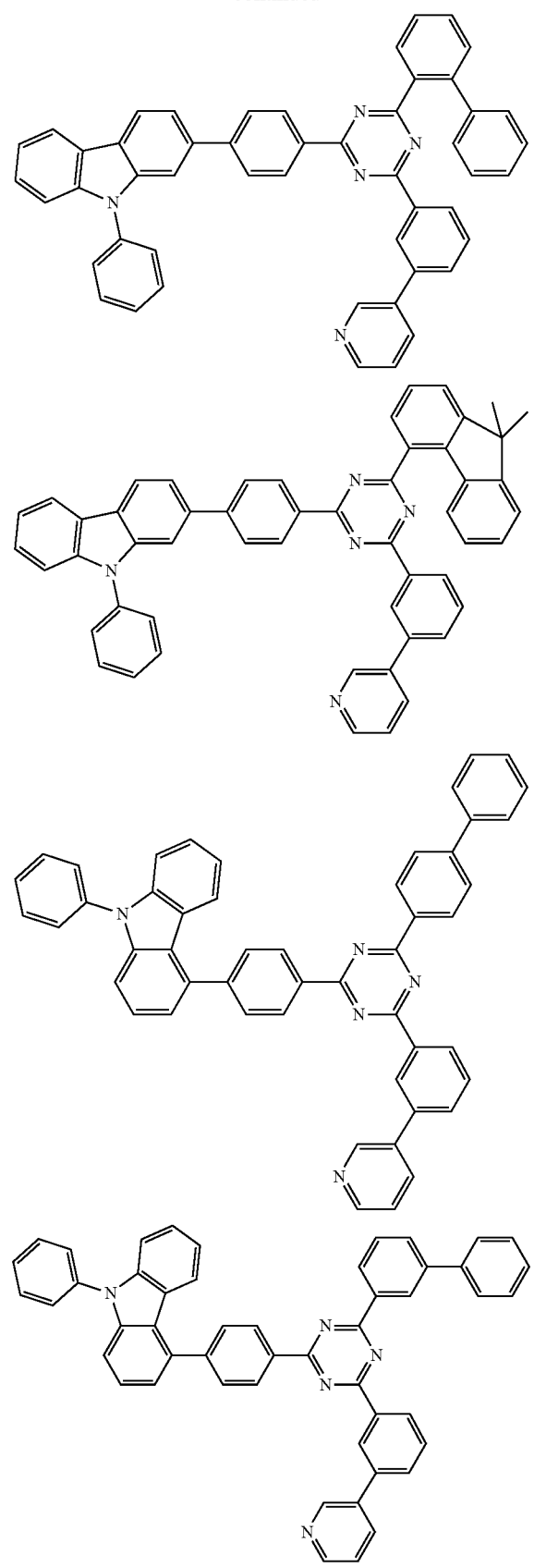

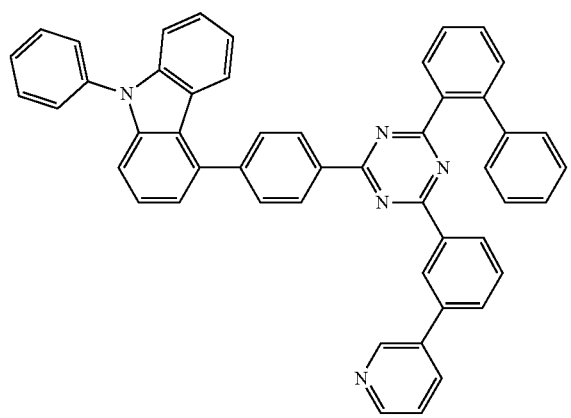
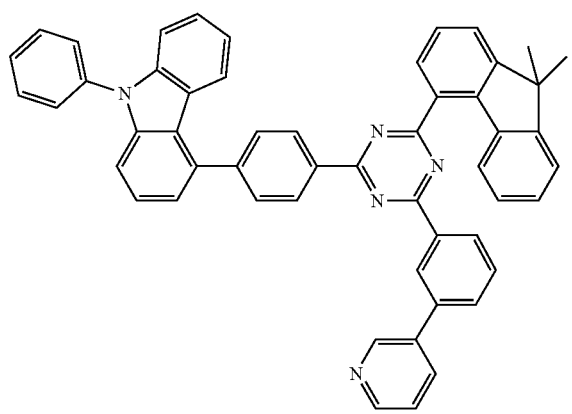
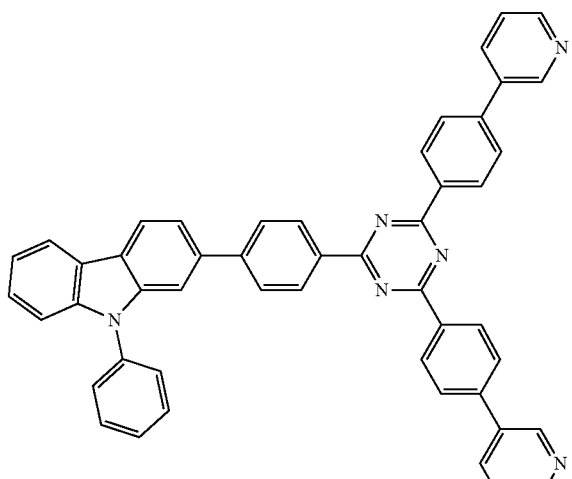
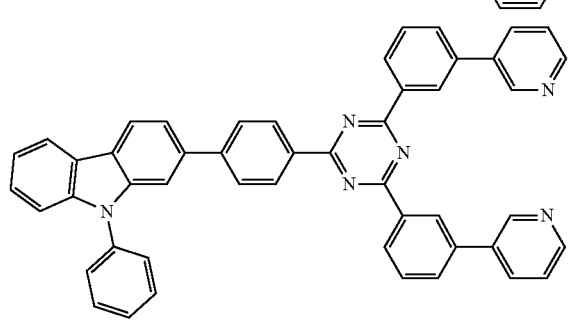
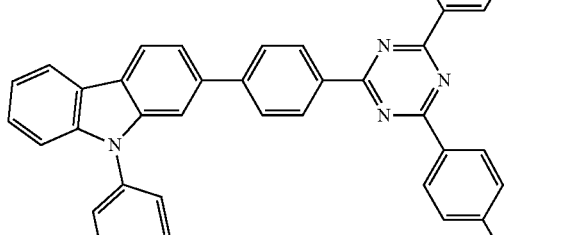
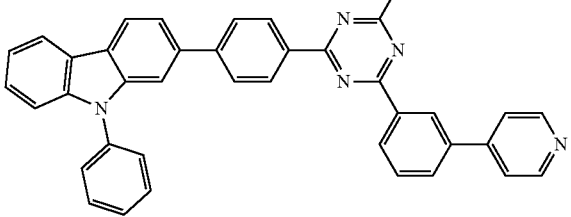

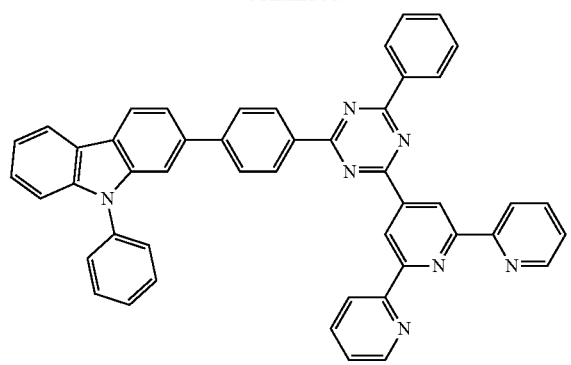
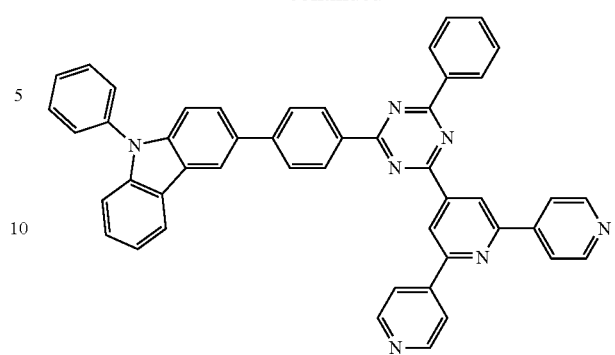

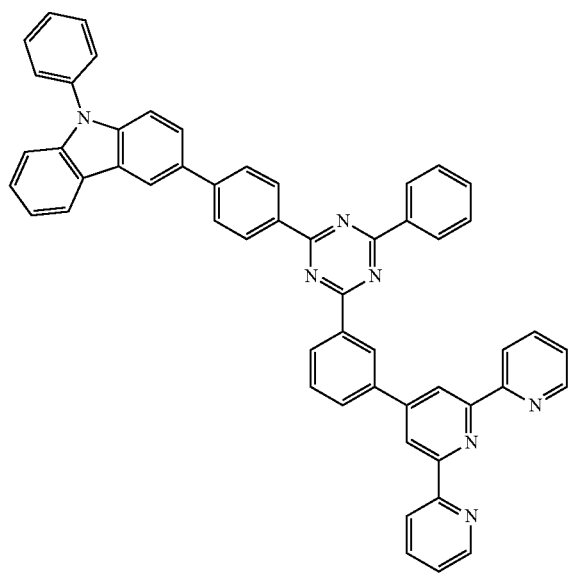
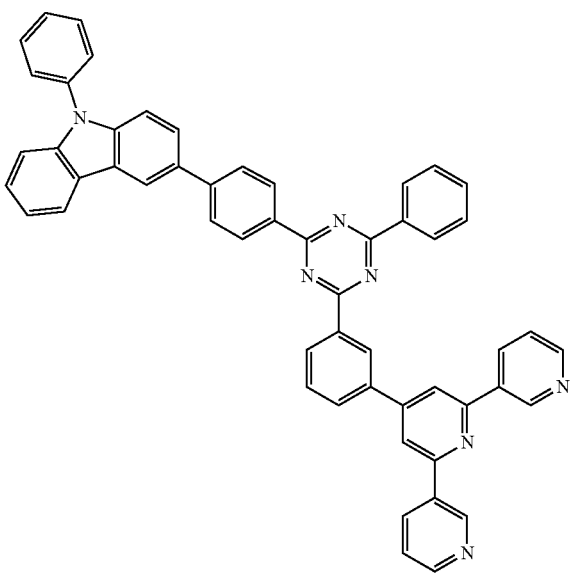

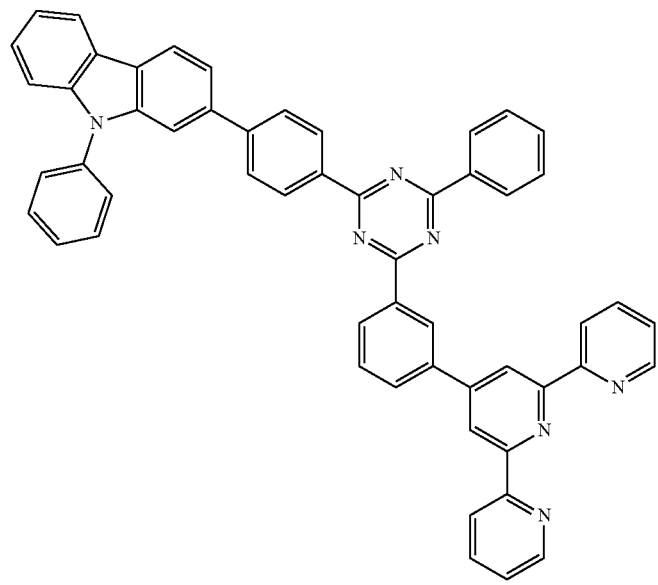
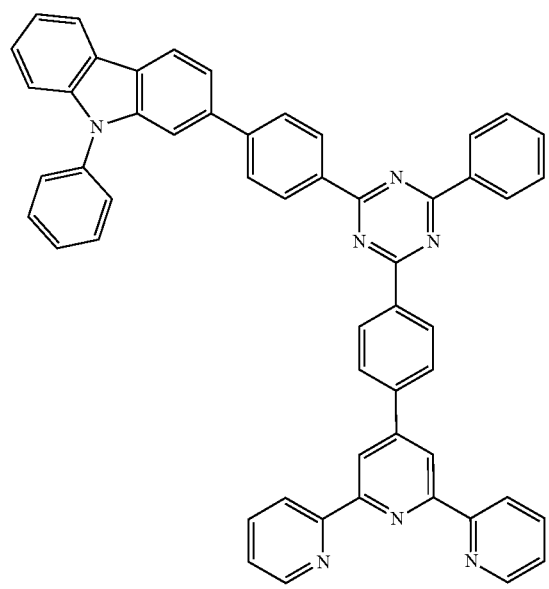

-continued
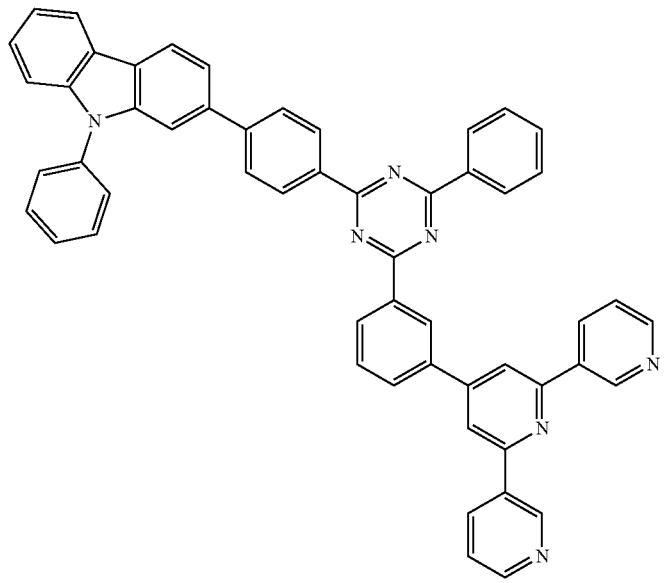
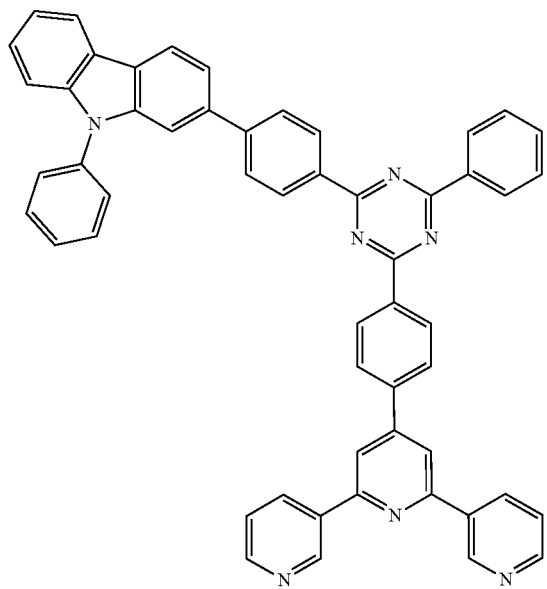
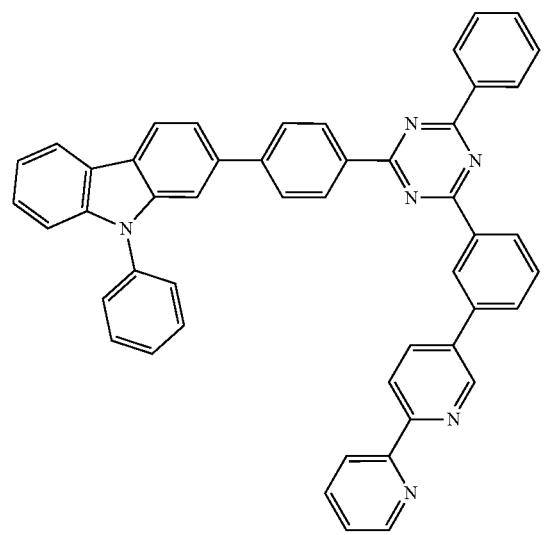
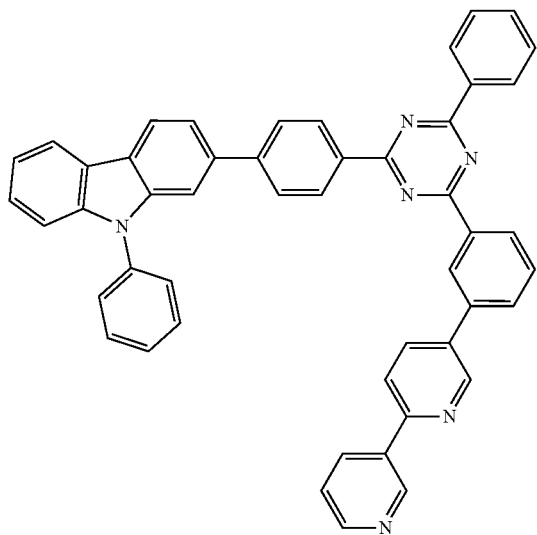
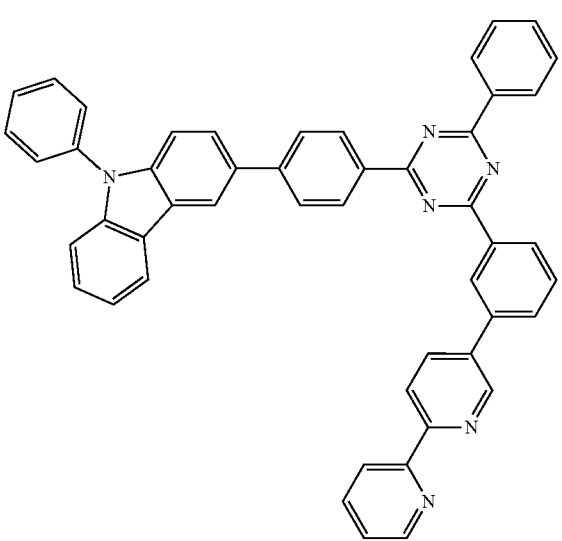

-continued
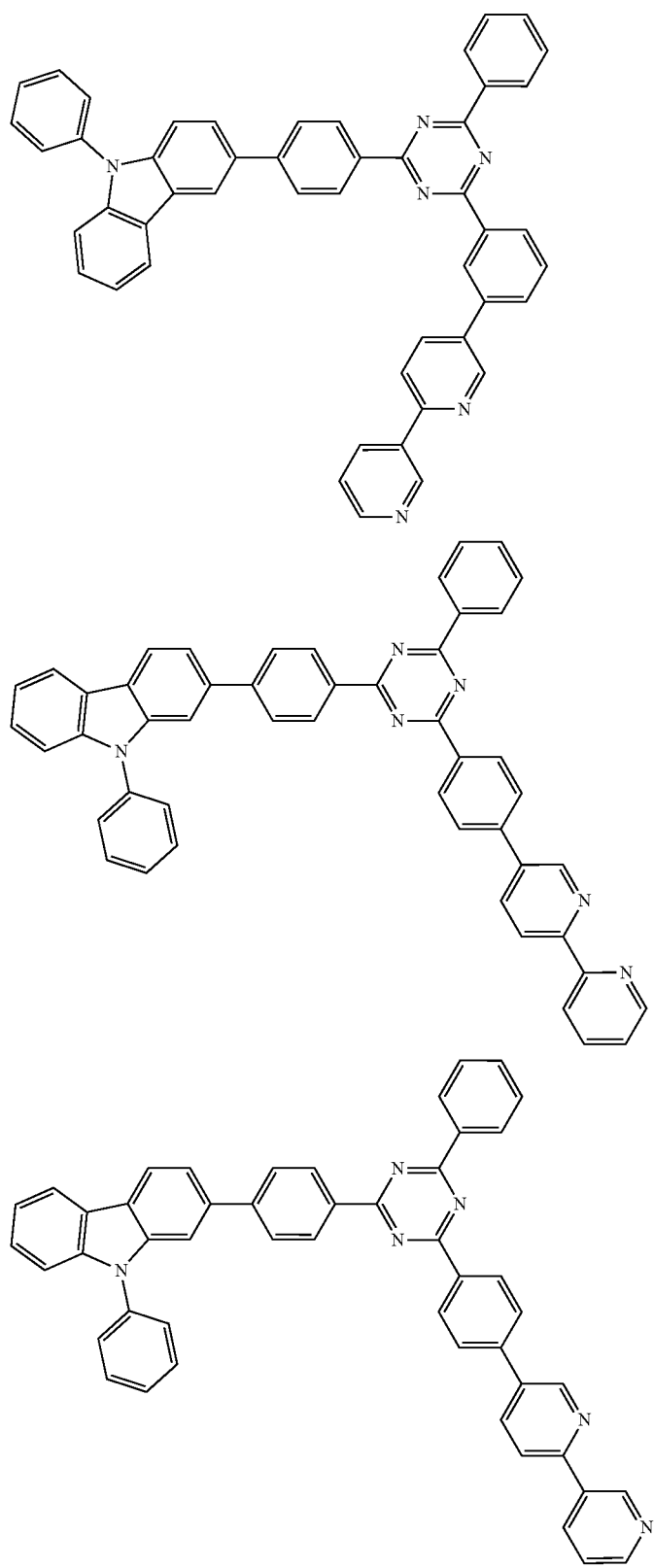

-continued
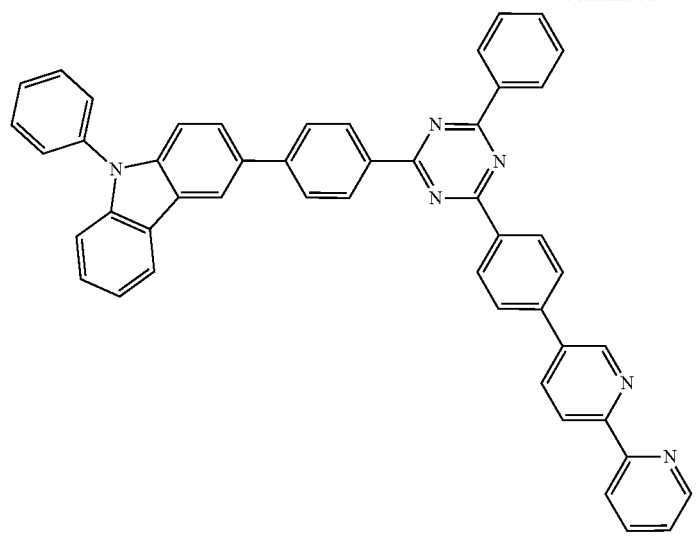
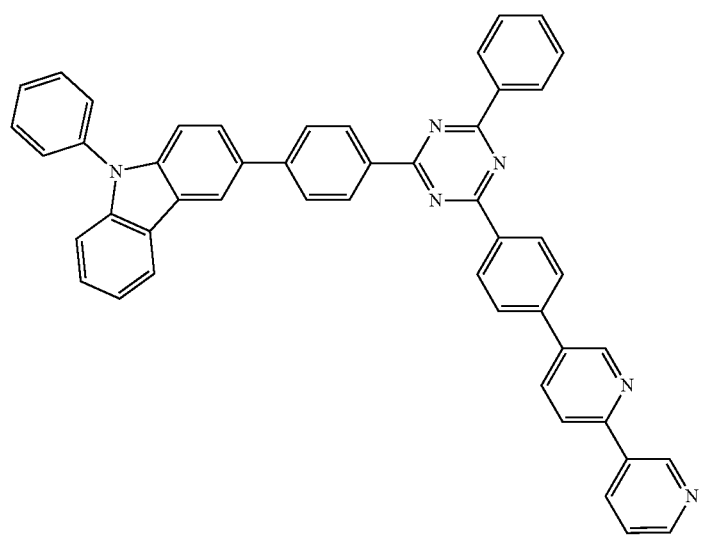
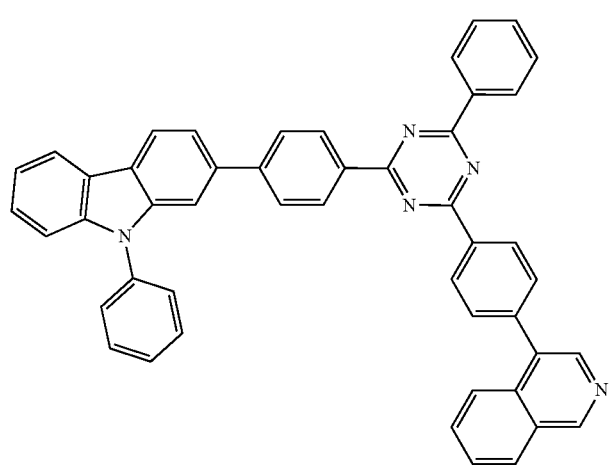

-continued
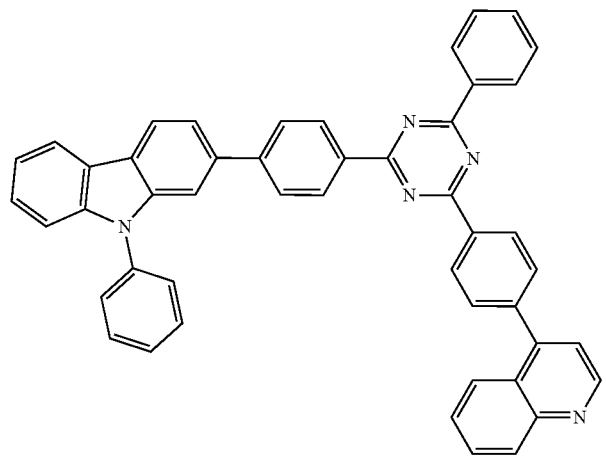
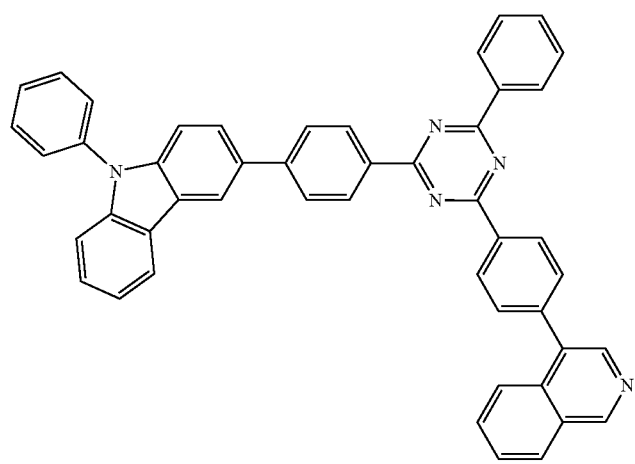
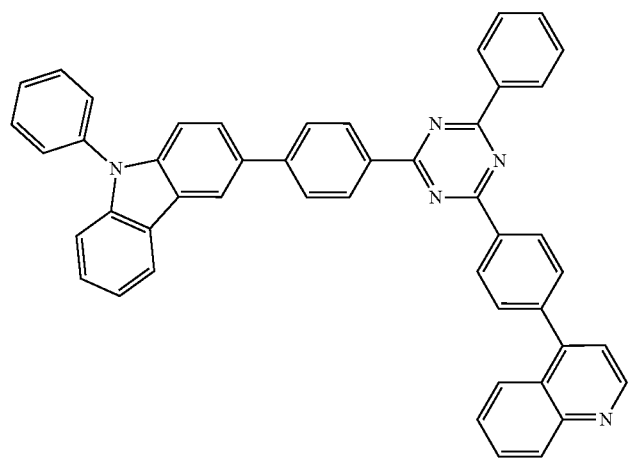

-continued
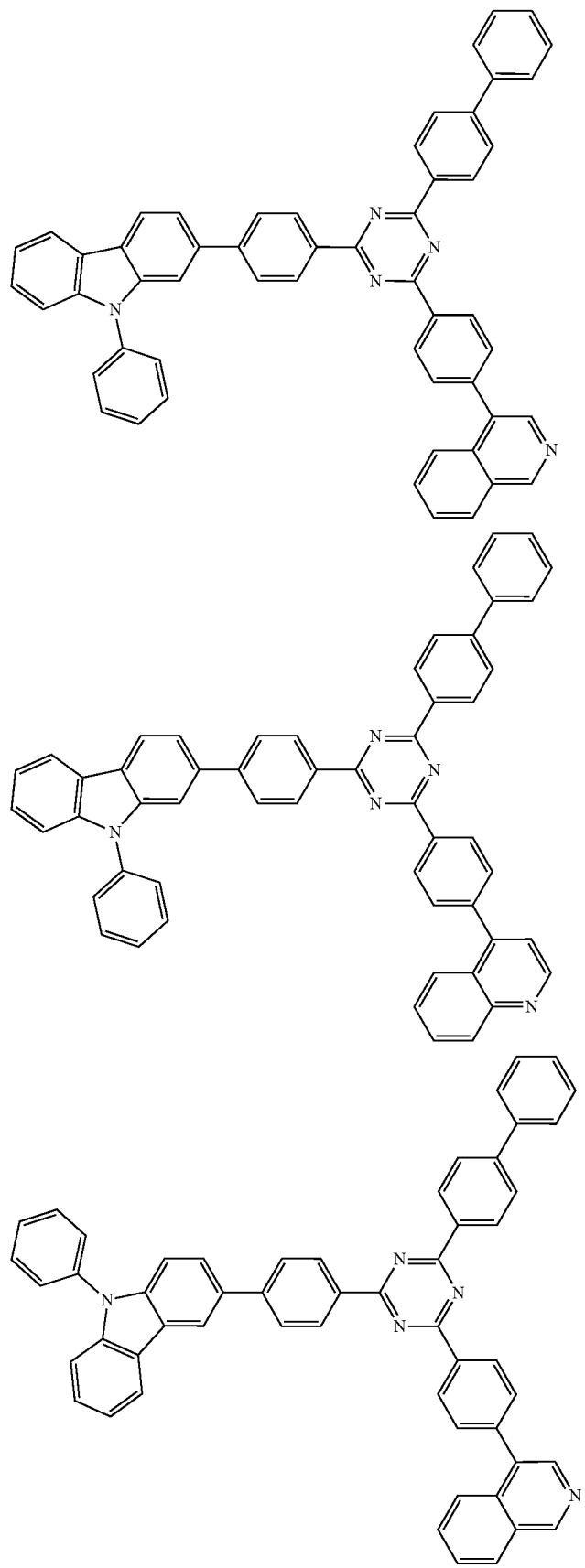

-continued
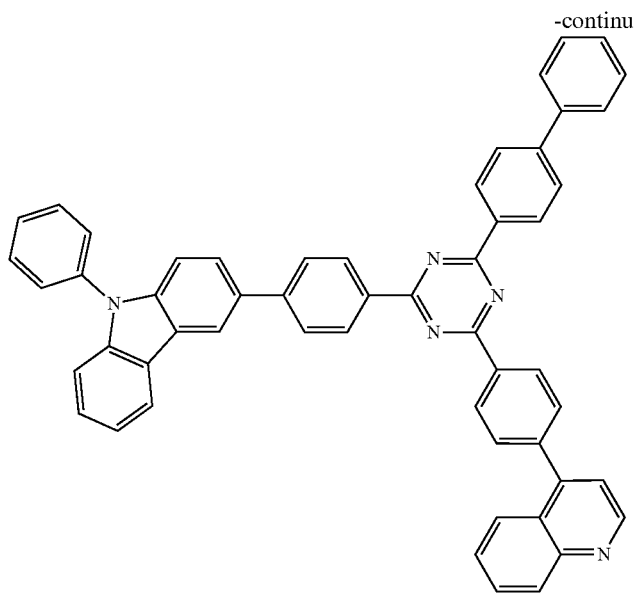
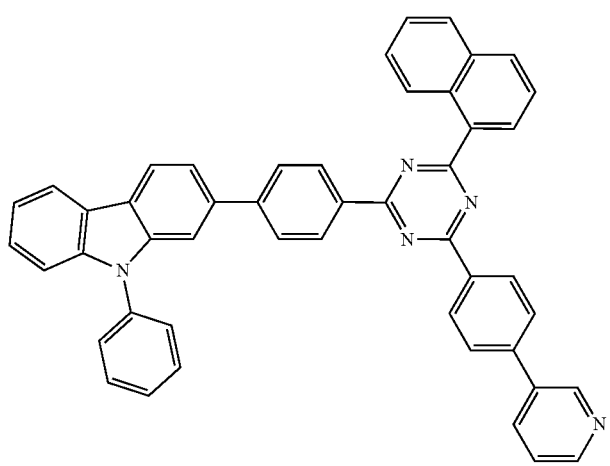
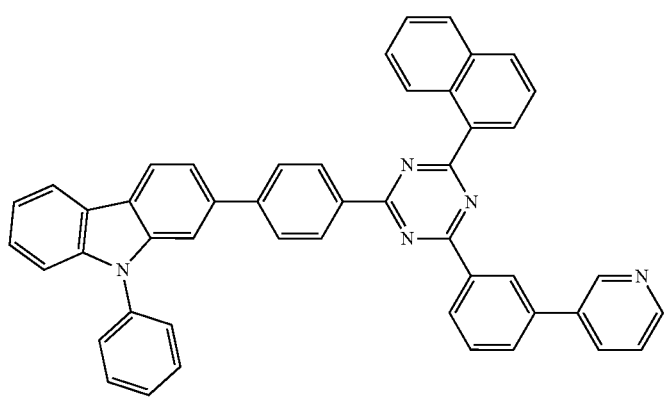

-continued
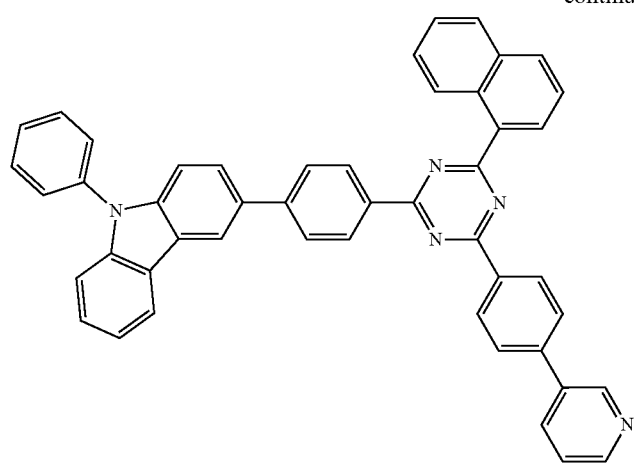
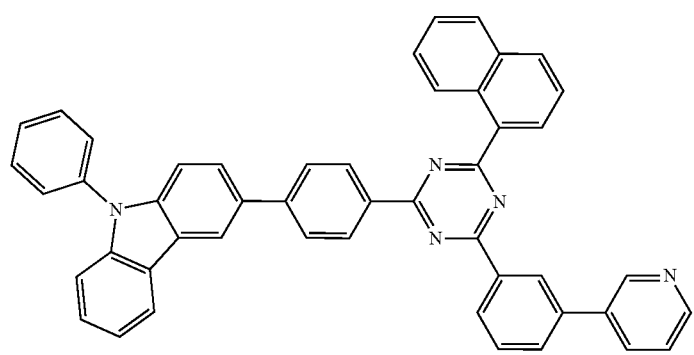
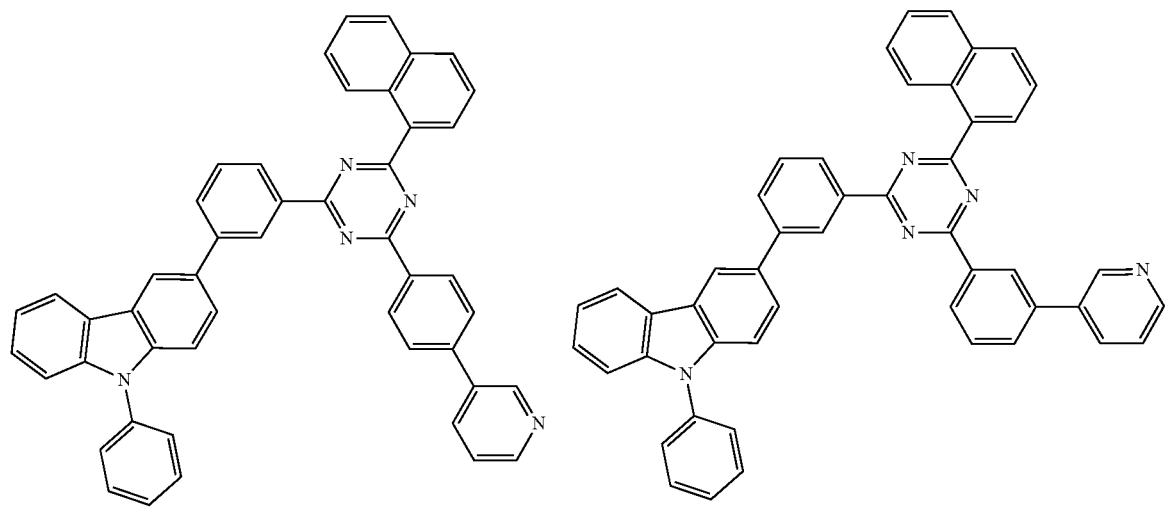

-continued
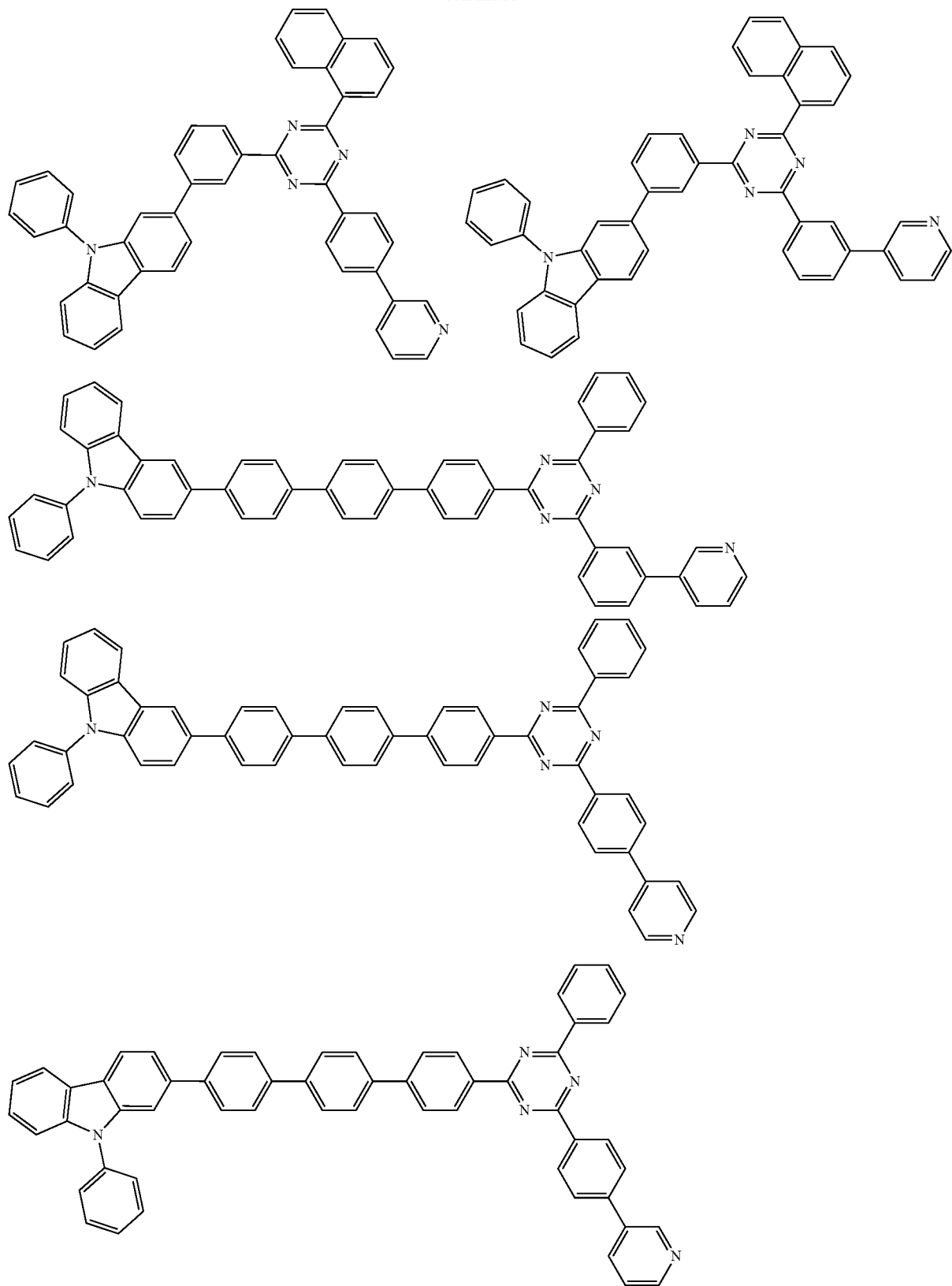

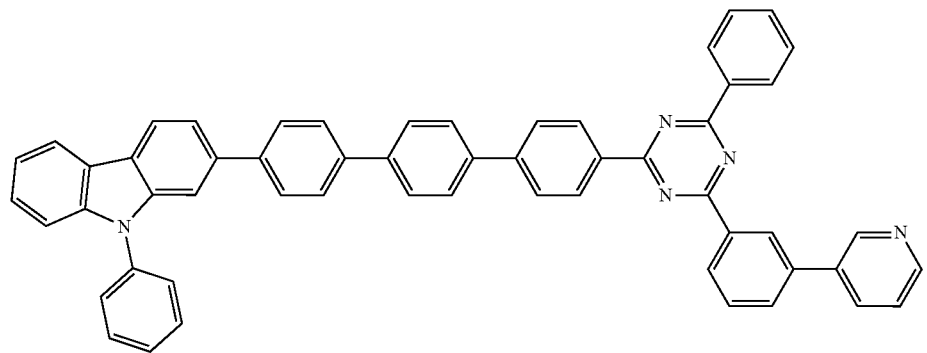
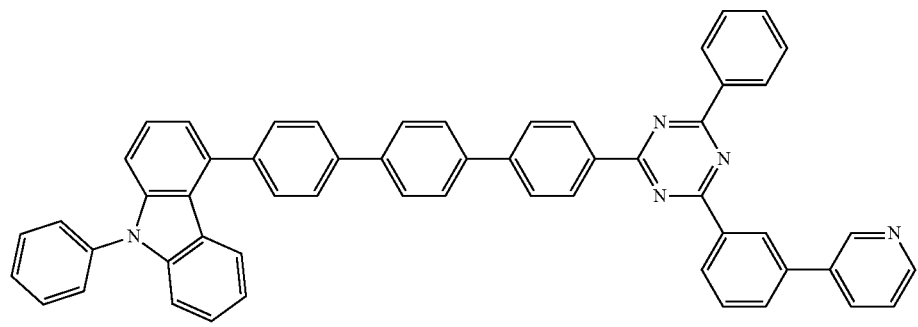
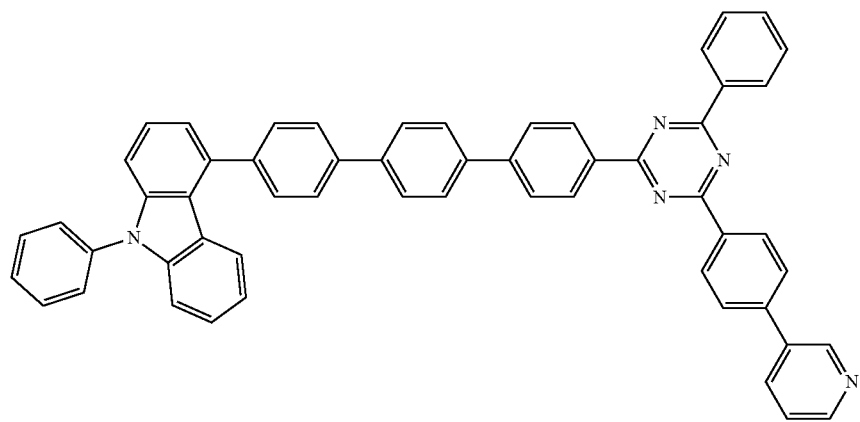
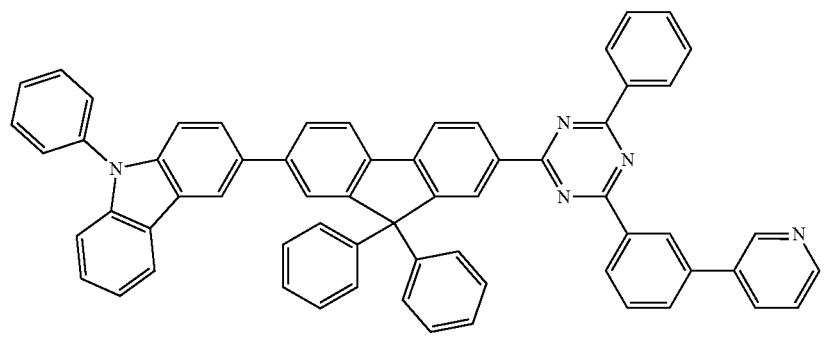

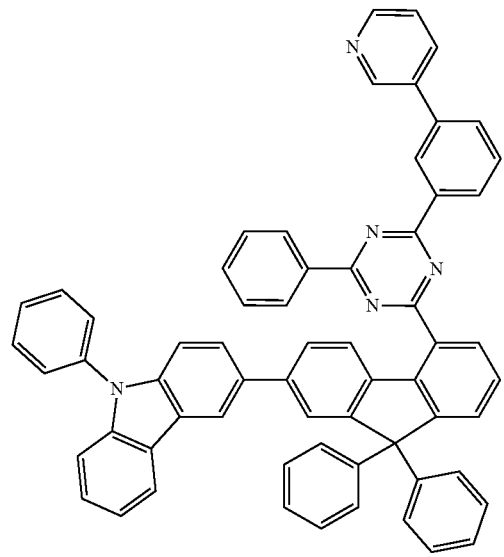
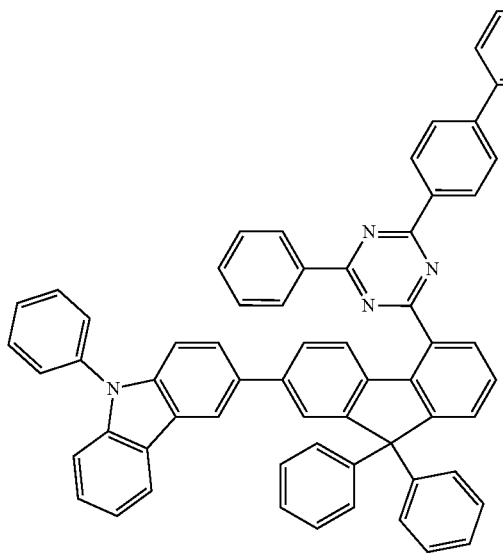
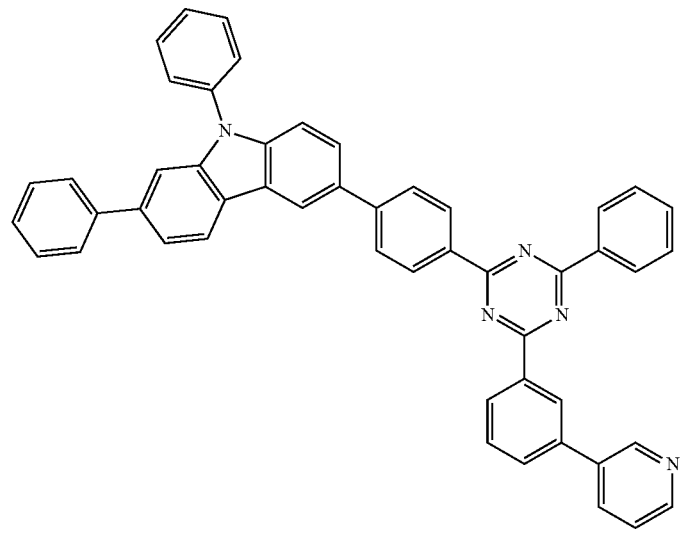
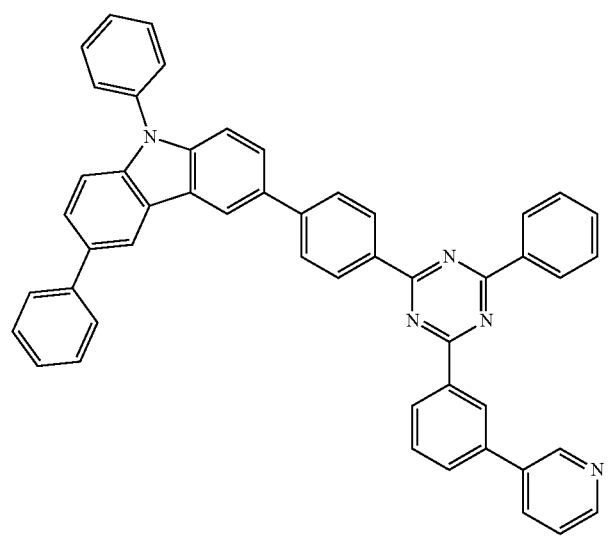

-continued
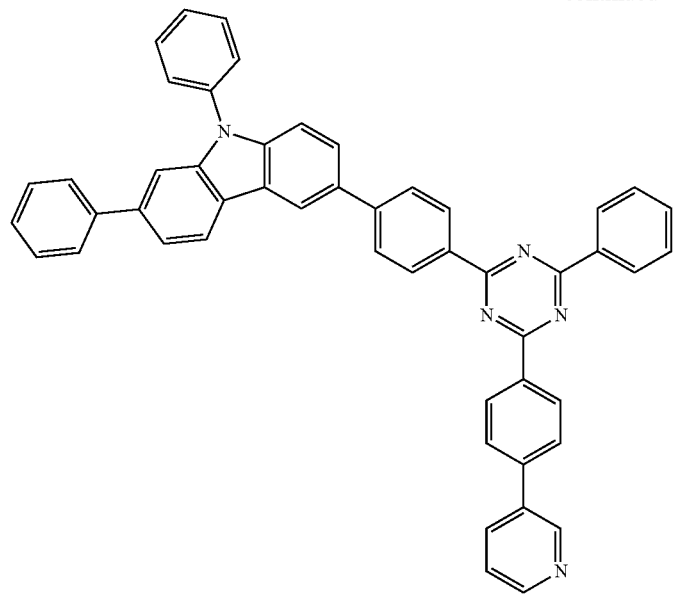
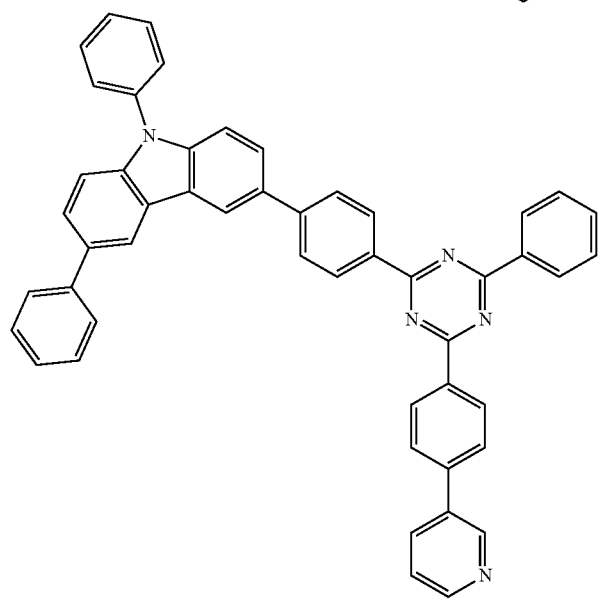
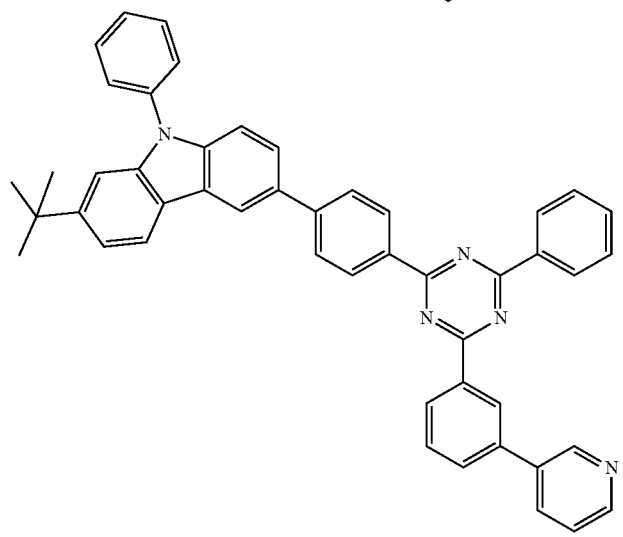

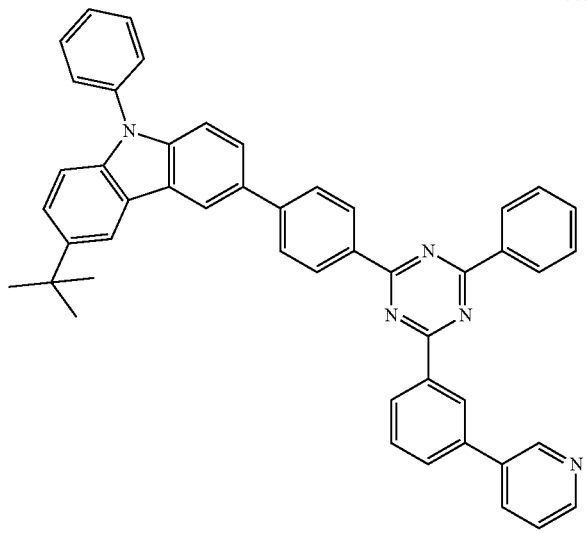
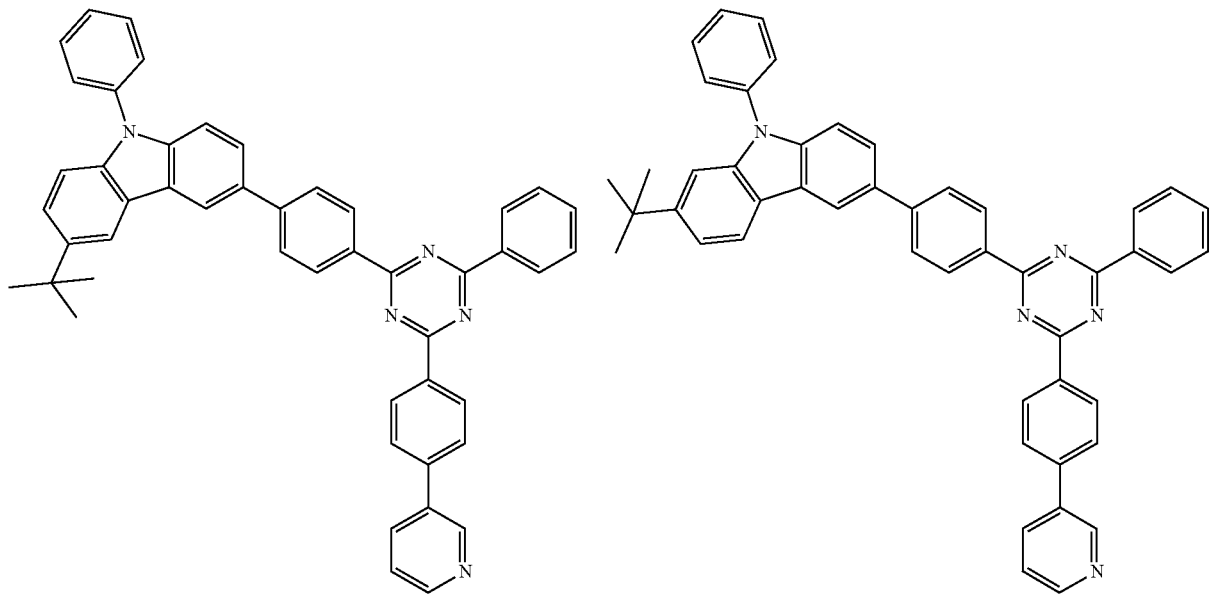
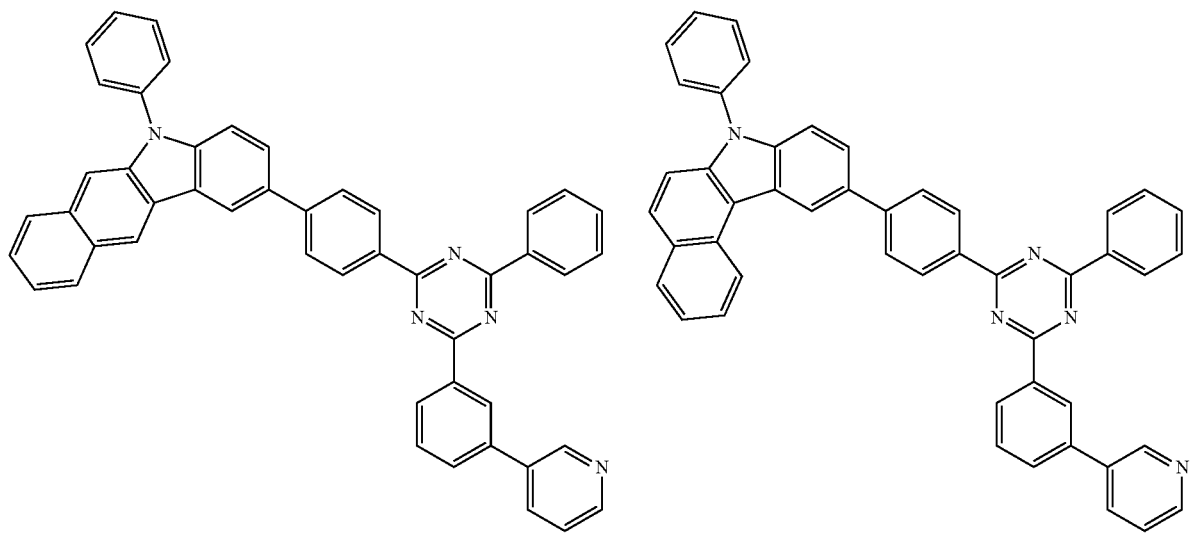

85
-continued
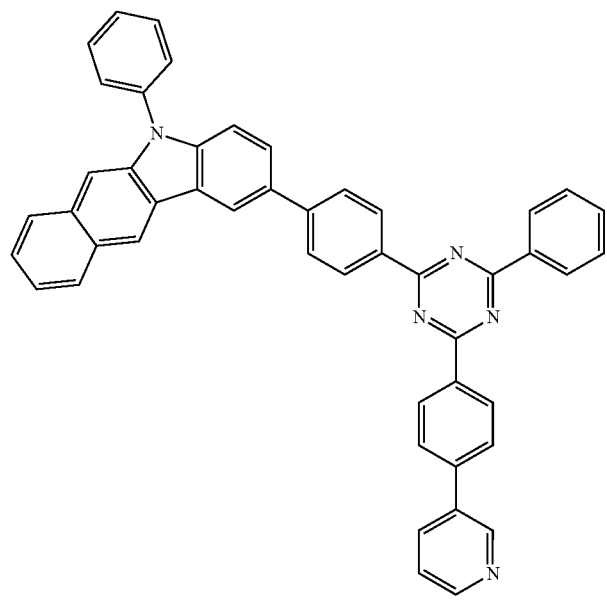
86
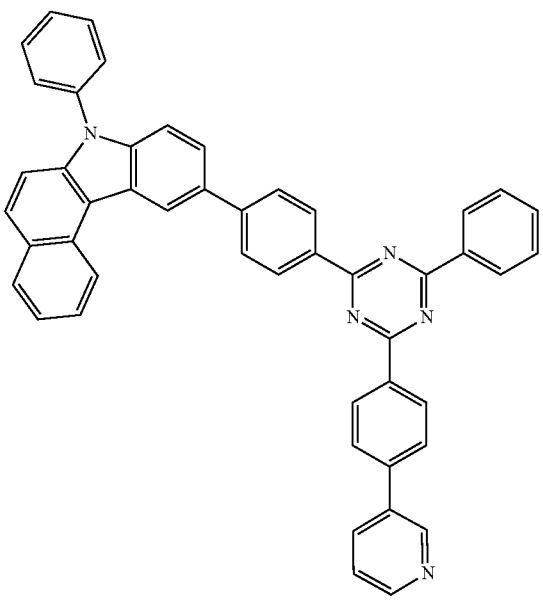
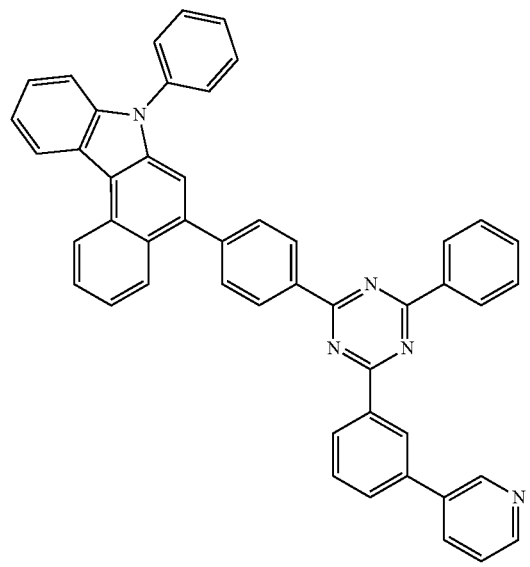
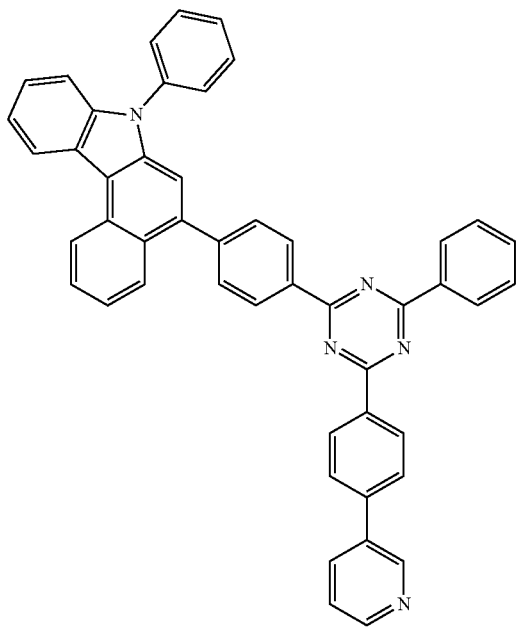

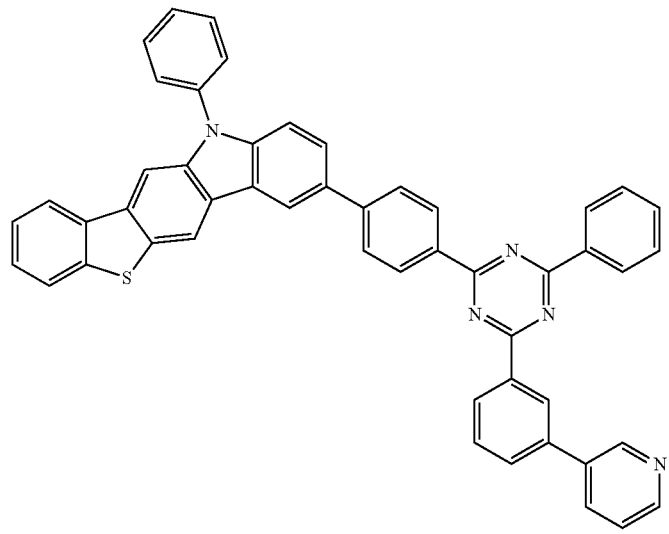
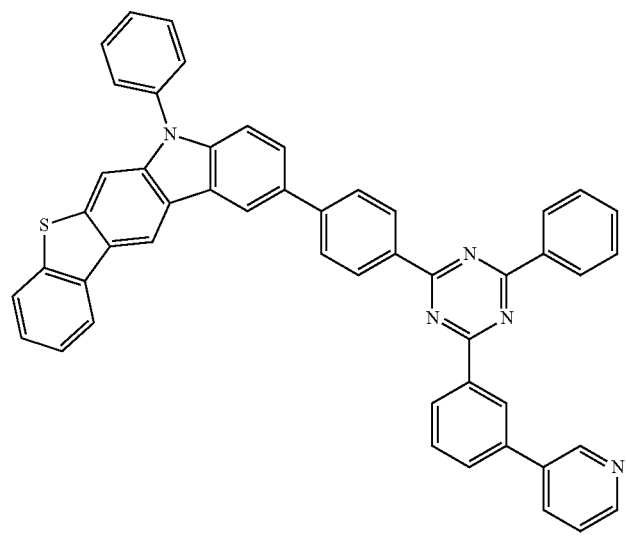
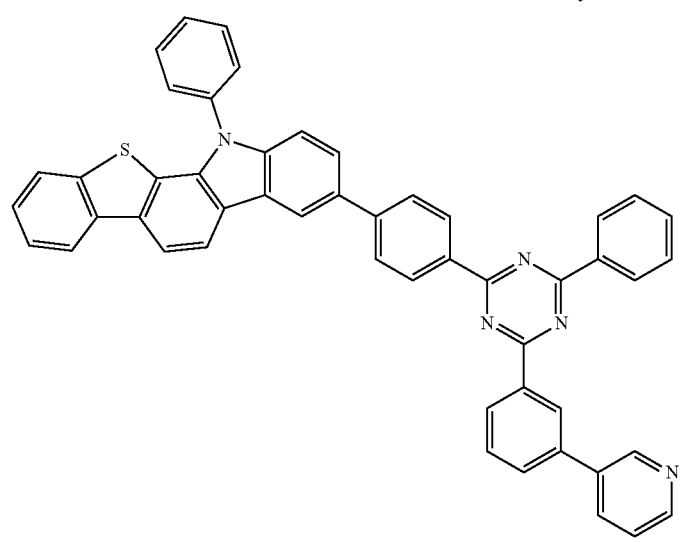

-continued
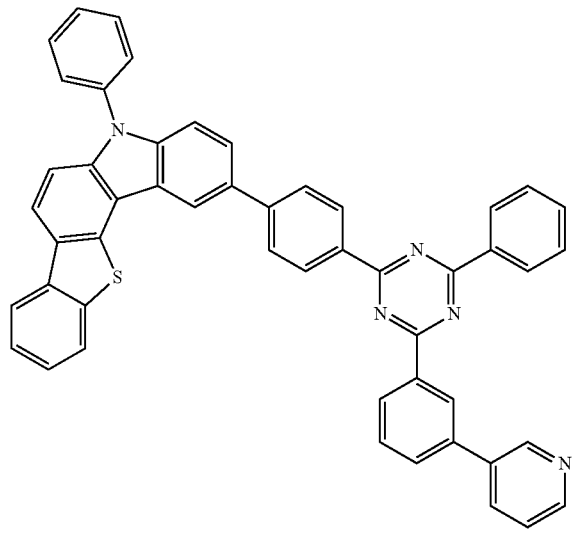
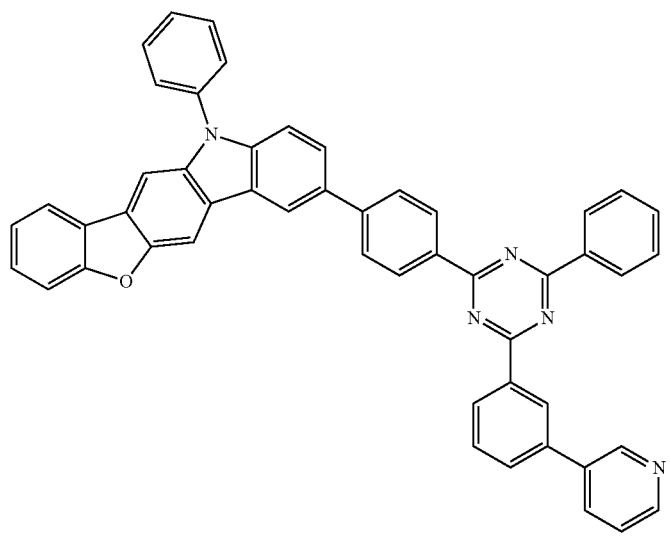
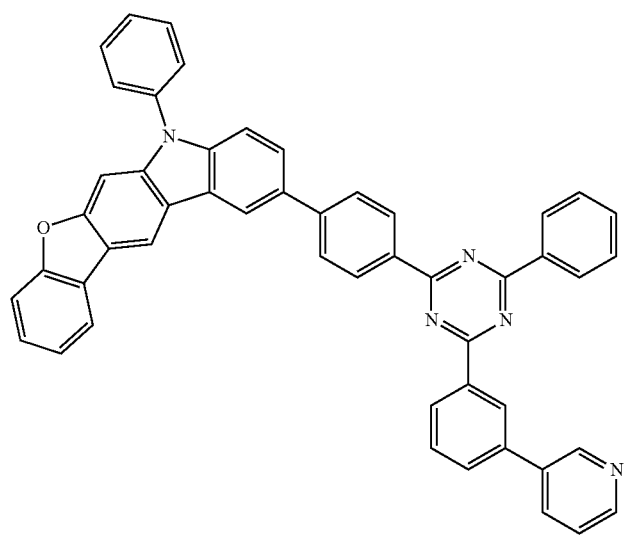

-continued
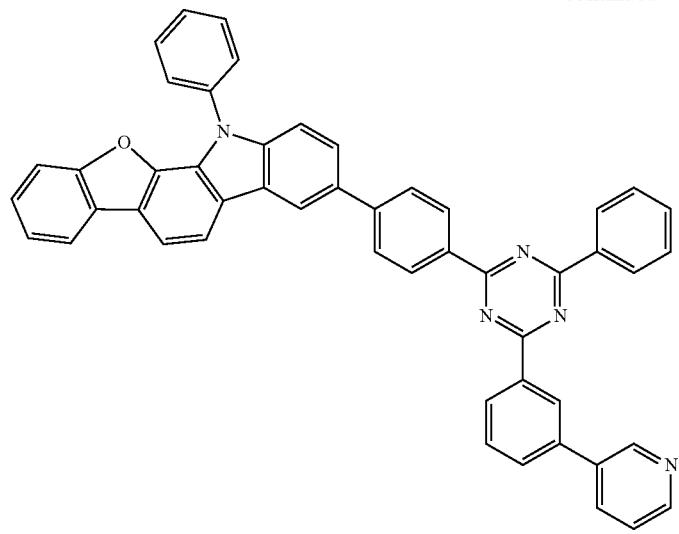
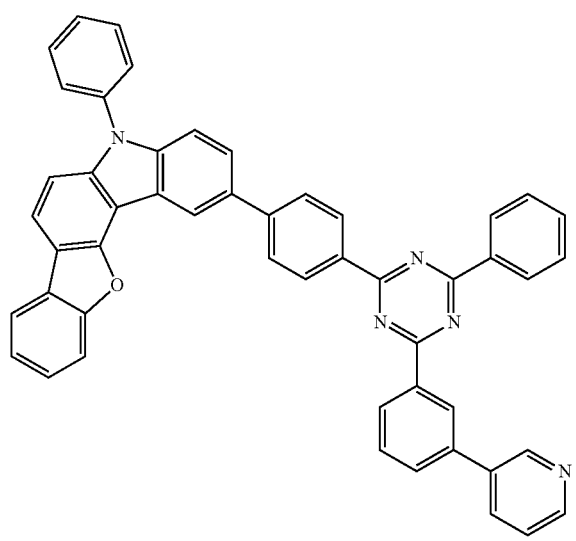
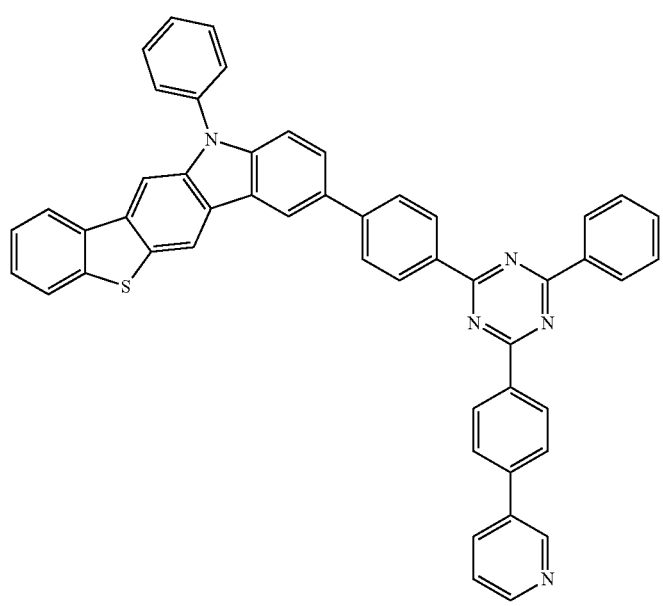

-continued
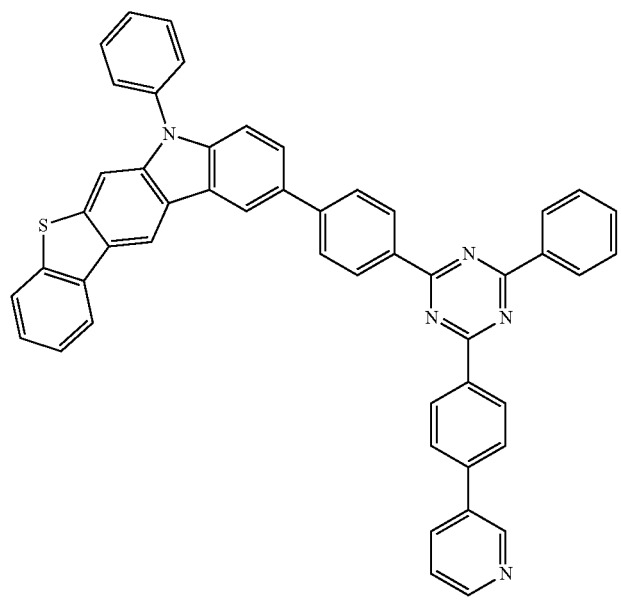
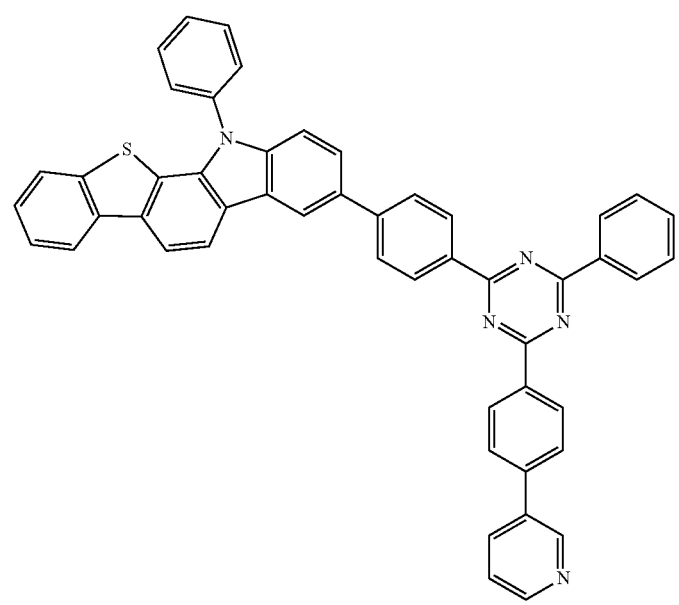

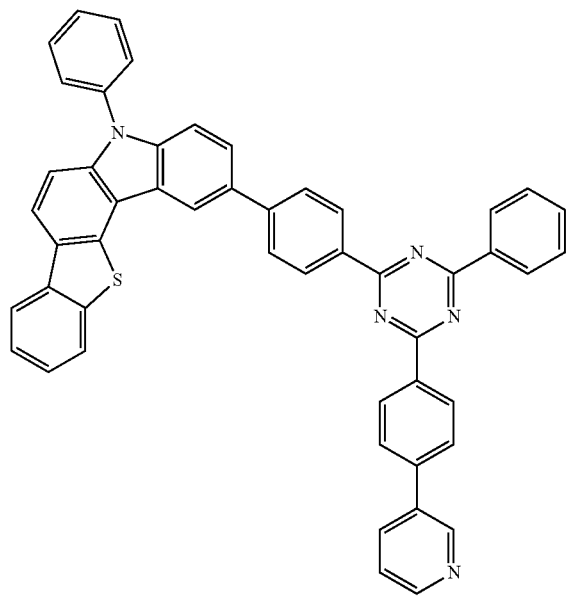
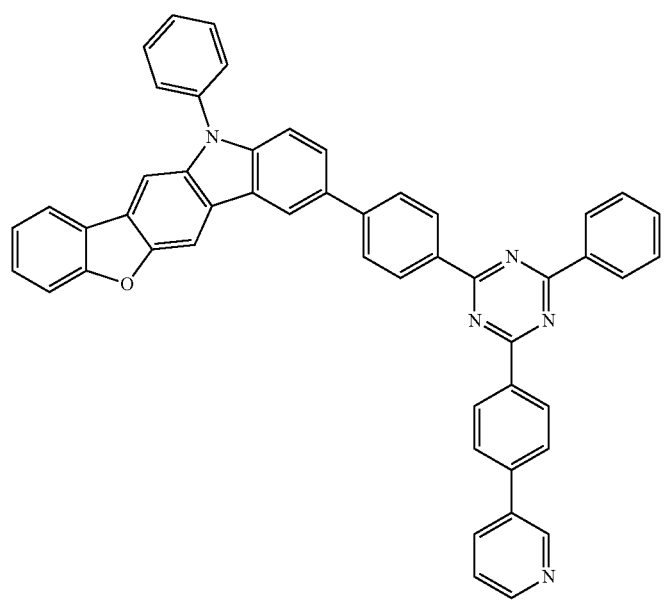

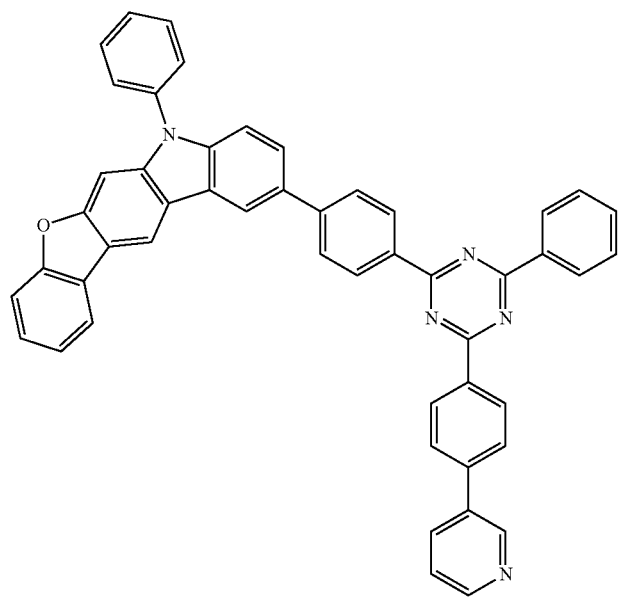
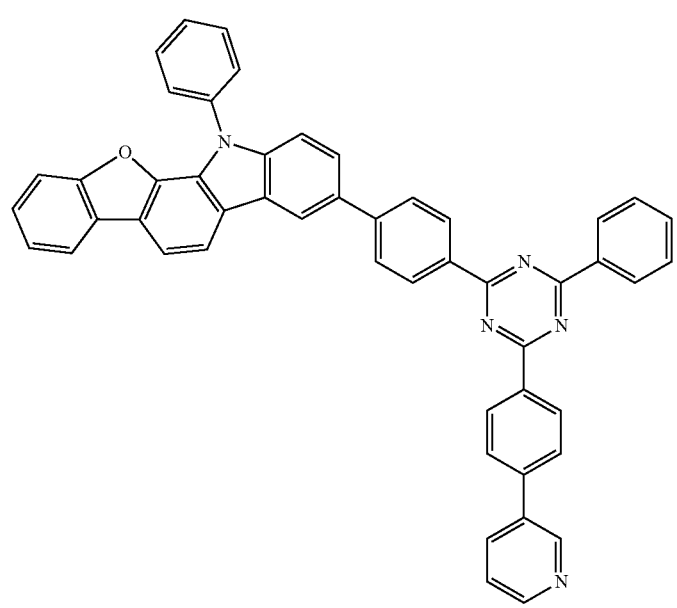

-continued
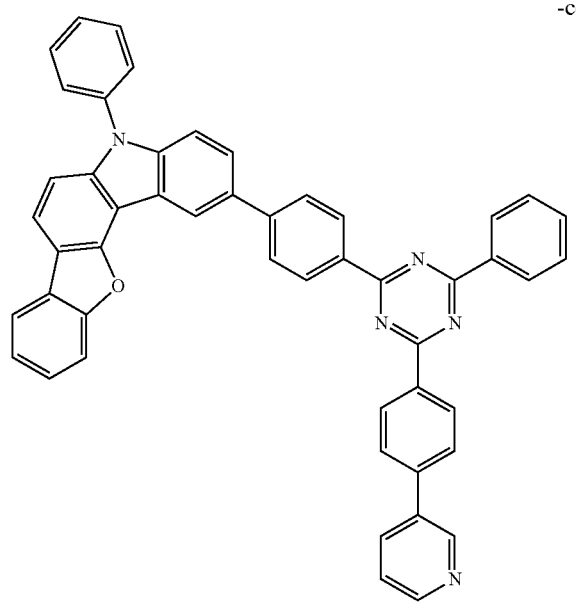
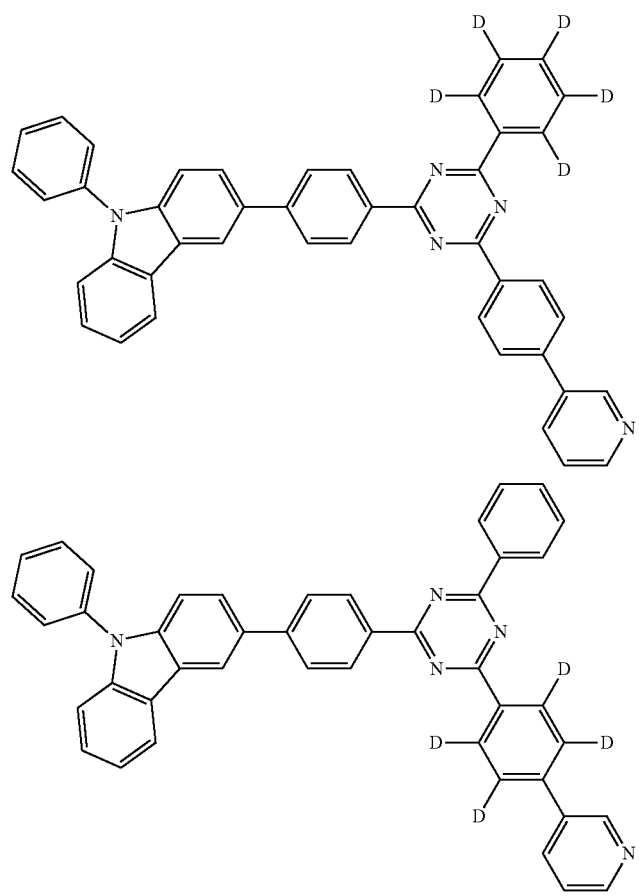

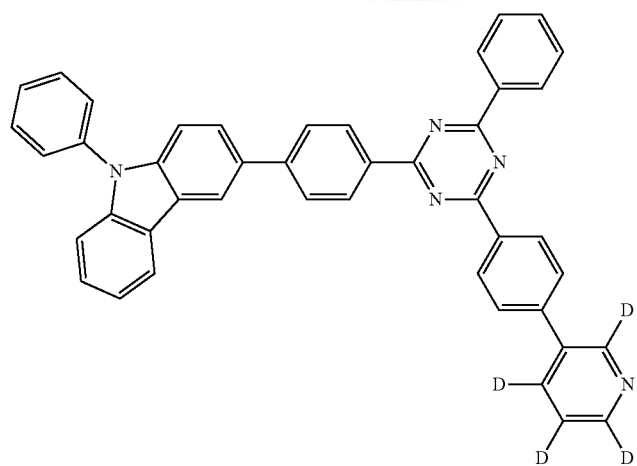
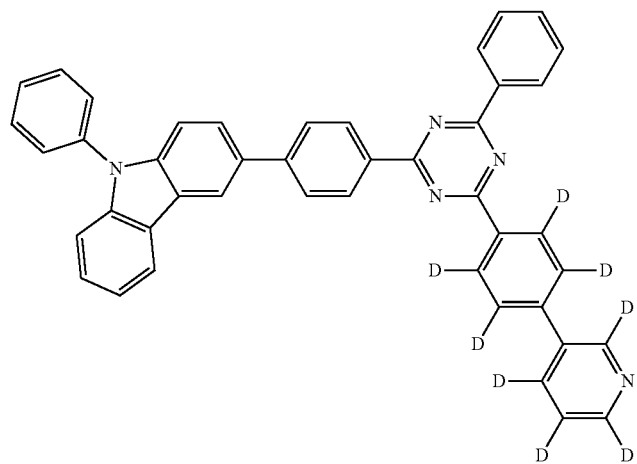
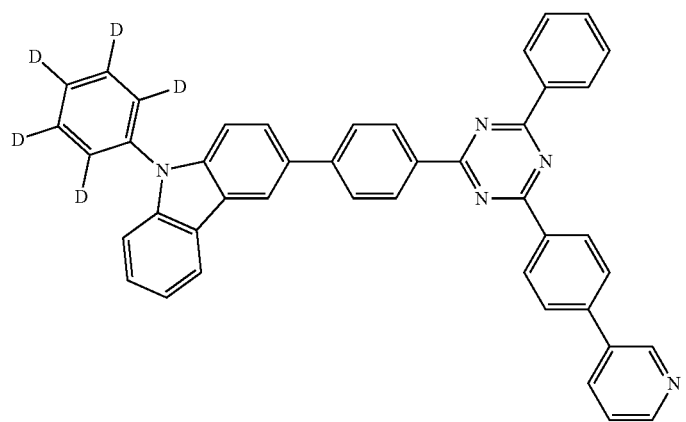

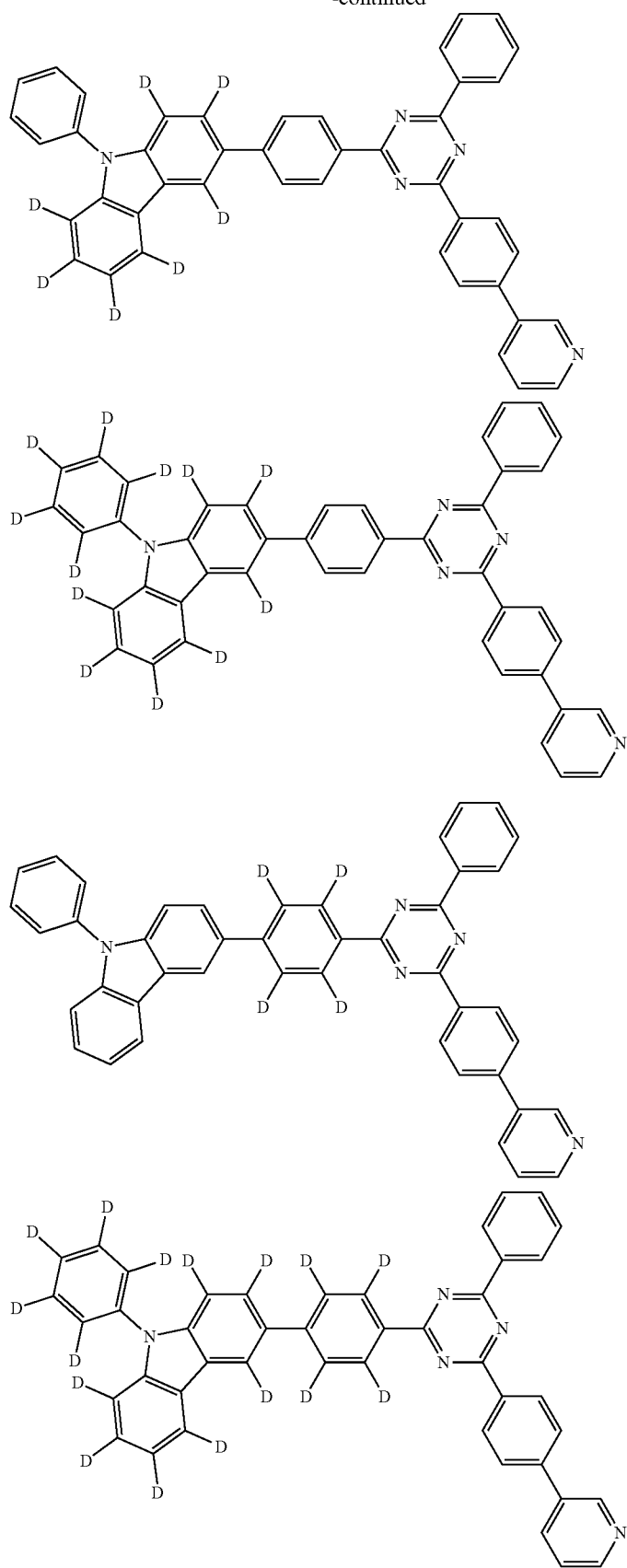

-continued
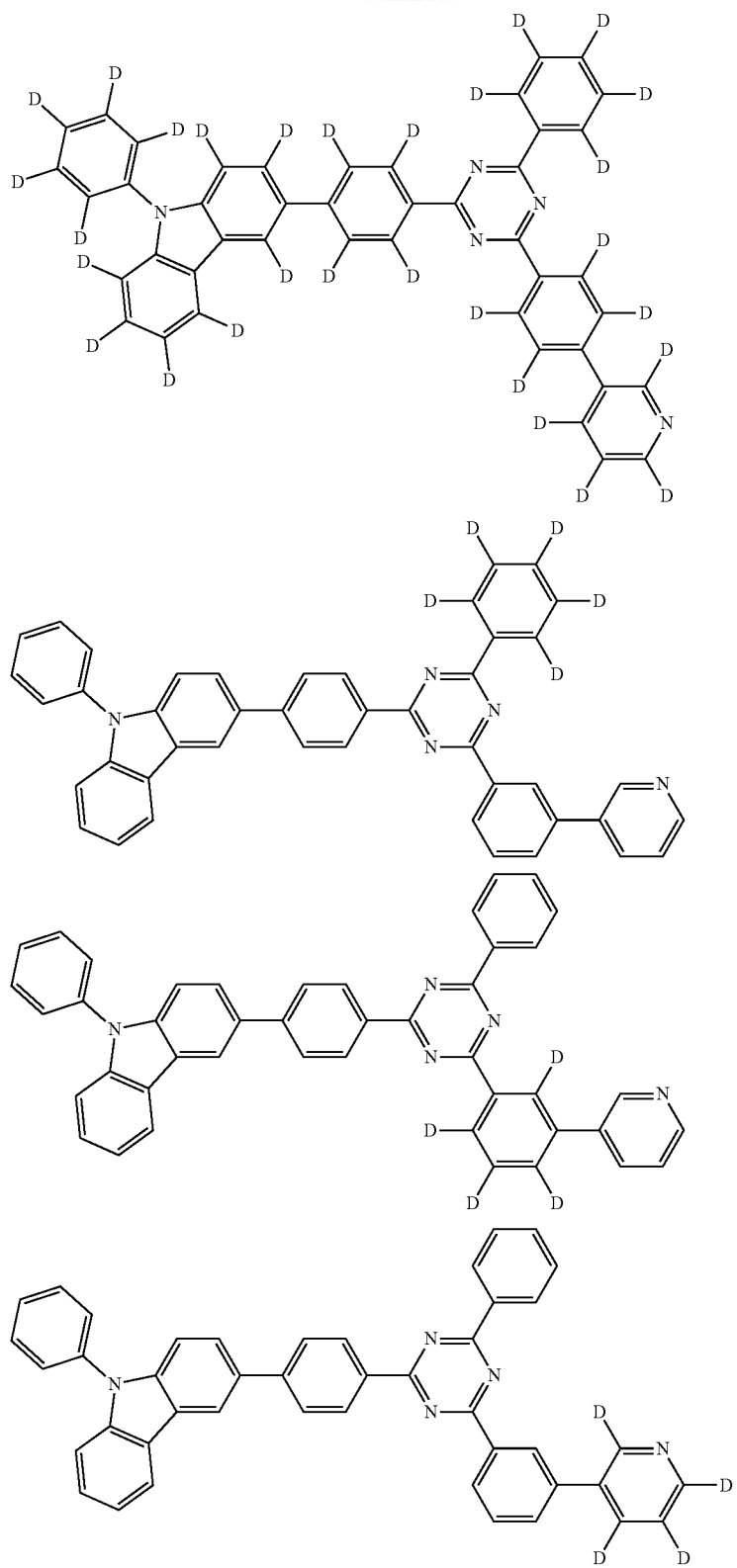

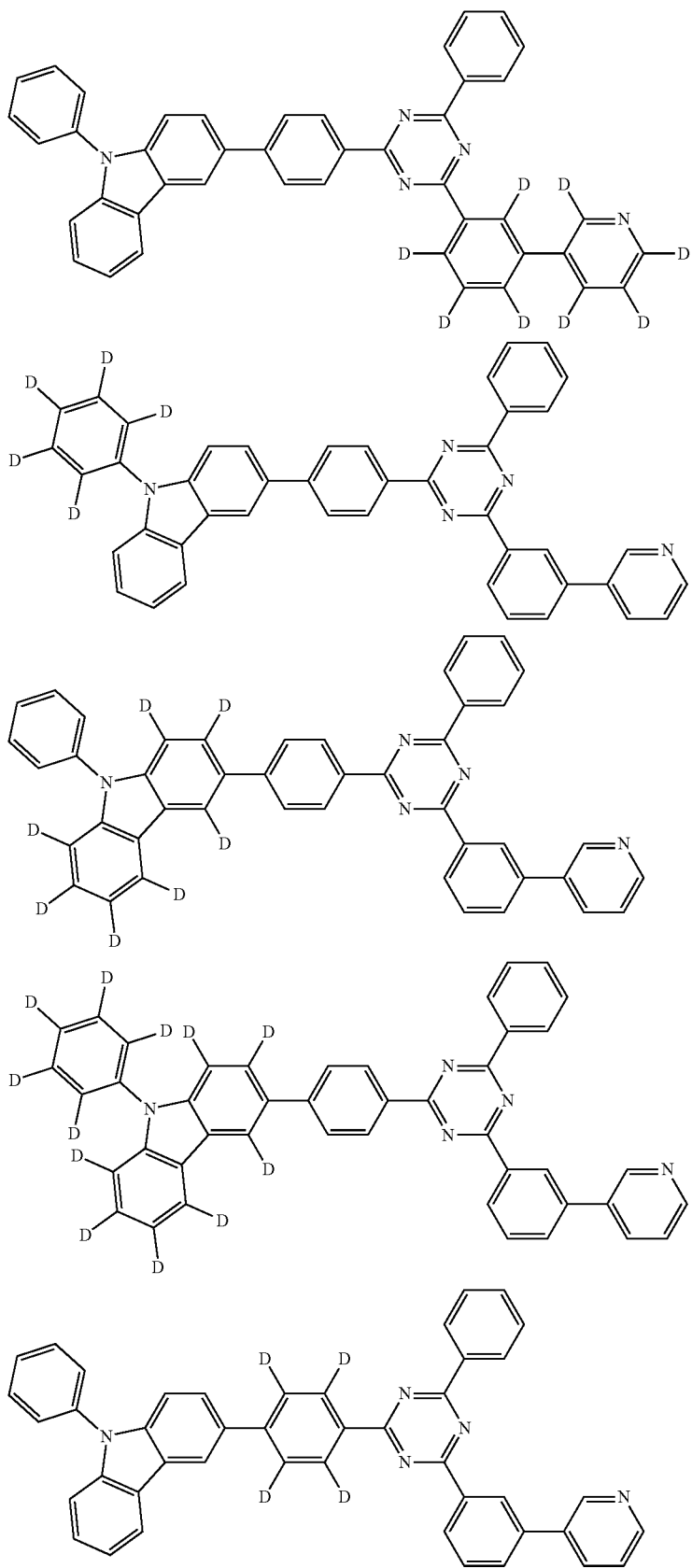

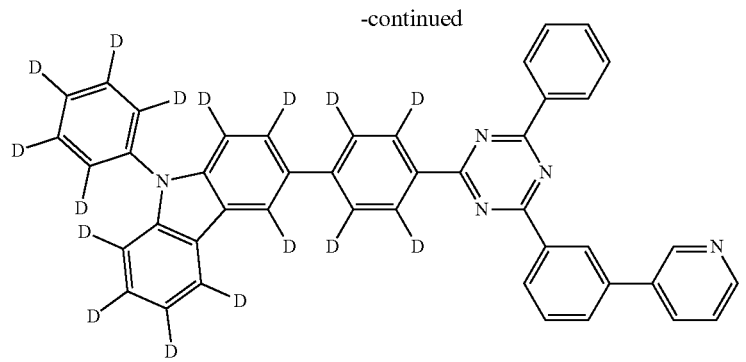

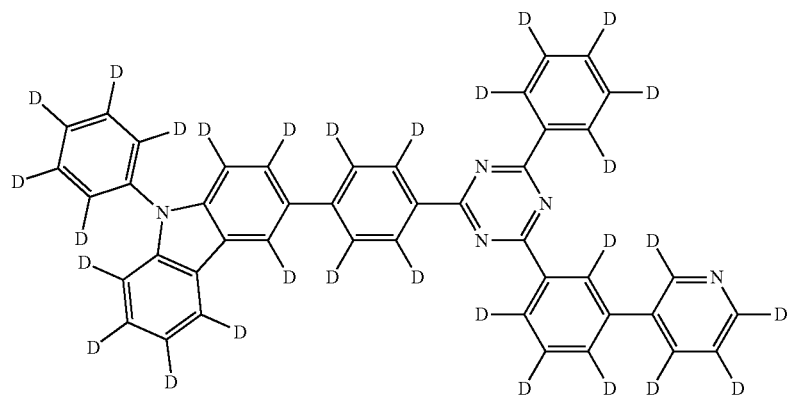 [SMILES: [2H]c1nc([2H])c(-c2c([2H])c([2H])c([2H])c(-c3nc(-c4c([2H])c([2H])c([2H])c([2H])c4[2H])nc(-c4c([2H])c([2H])c(-c5c([2H])c([2H])c6c(c5[2H])c5c([2H])c([2H])c([2H])c([2H])c5n6-c5c([2H])c([2H])c([2H])c([2H])c5[2H])c([2H])c4[2H])n3)c2[2H])c([2H])c1[2H]]

Synthesis of the Compounds of Formula (1)

The general concept for the preparation of the compounds of formula (I) is exemplified in the following scheme (wherein -(L)$_p$-, Ar$_1$ and Ar$_2$ are phenyl groups):

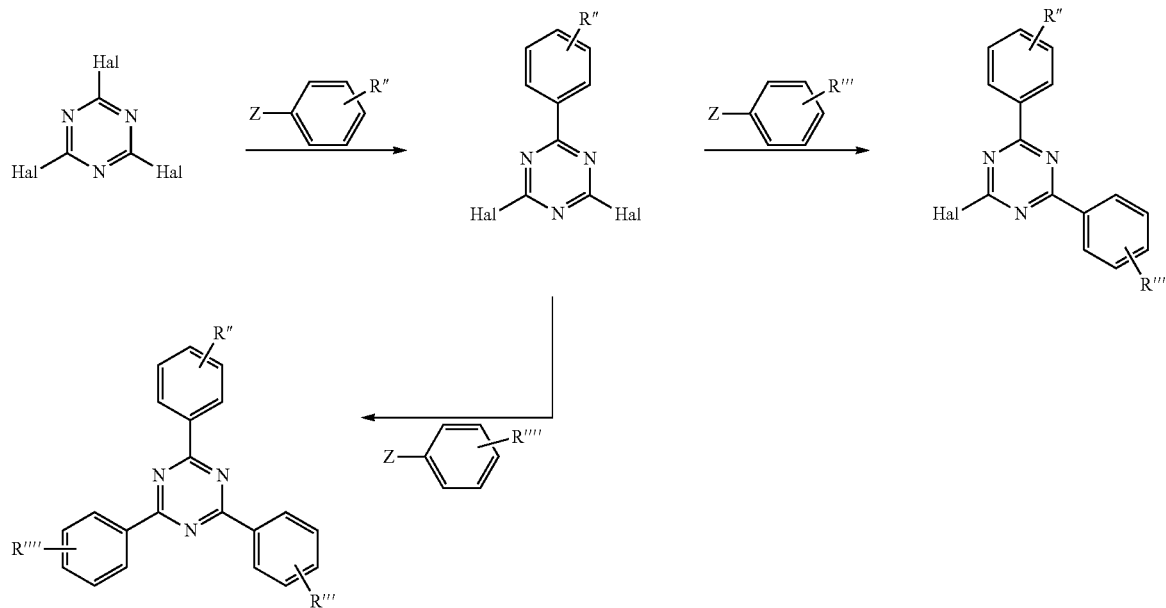

wherein

Z represents —BQ$_2$, wherein Q is an unsubstituted alkyl group having 1 to 8 carbon atoms, an unsubstituted cycloalkyl group having 3 to 6 carbon atoms or a cycloalkyl group having 3 to 6 carbon atoms, substituted by one or two unsubstituted alkyl groups having 1 to 8 carbon atoms, a unsubstituted alkoxy group having 1 to 8 carbon atoms, a hydroxyl group, wherein two alkyl groups Q or two alkoxy groups Q together may form a five or six membered substituted or unsubstituted ring, or —MgX, wherein X is halide, or —Li, preferably —BQ$_2$, wherein Q is an unsubstituted alkyl group having 1 to 8 carbon atoms, an unsubstituted cycloalkyl group having 3 to 6 carbon atoms or a cycloalkyl group having 3 to 6 carbon atoms, substituted by one or two unsubstituted alkyl groups having 1 to 8 carbon atoms, a unsubstituted alkoxy group having 1 to 8 carbon atoms, a hydroxyl group, wherein two alkyl groups Q or two alkoxy groups Q together may form a five or six membered substituted or unsubstituted ring, more preferably —BQ$_2$, wherein two alkyl groups Q or two alkoxy groups Q together may form a five or six membered substituted or unsubstituted ring, Hal is a halide, preferably selected from the group consisting of I, F, Cl and Br, or a pseudohalide, preferably selected from the group consisting of mesylate, triflate, tosylate and nonaflate.

In the case that Z is —BQ$_2$, the compounds are for example prepared from the corresponding halides in the presence of a borylation reagent:

Suitable borylation reagents are boronic acids or boronic esters, for example alkyl-, alkenyl-, alkynyl-, and aryl-boronic esters. Preferred borylation reagents have the general formula Q$_2$BH or Q$_2$B-BQ$_2$, wherein Q is defined above. For example, Pinacolborane (Hbpin), Bis(pinacolato) diboron (B$_2$Pin$_2$), and bis(catecholato)diborane (B$_2$Cat$_2$). Further suitable borylation reagents are dioxaborolanes, for example 2-isopropoxy-4,4,5,5-tetramethyl-1,3,2-dioxaborolane.

The borylation can be carried out in the presence or in the absence of a catalyst.

In the case that the borylation is carried out in the absence of a catalyst, the halide is for example treated with an organolithium reagent followed by borylation with a borylation agent. Suitable borylation agents are mentioned above.

In the case that the borylation is carried out in the presence of a catalyst, preferred catalysts are Pd catalysts. Suitable Pd catalysts are for example Pd(0) complexes with bidentate ligands like dba (dibenzylideneacetone), or Pd(II) salts like PdCl$_2$ or Pd(OAc)$_2$ in combination with bidentate phosphine ligands such as dppf ((diphenylphosphino)ferrocene), dppp ((diphenylphosphino)propane), BINAP (2,2'-Bis(diphenylphosphino)-1,1'-binaphthyl), Xantphos (4,5-Bis(diphenylphosphino)-9,9-dimethylxanthene), DPEphos (Bis[(2-diphenylphosphino)phenyl]ether) or Josiphos, or in combination with monodentate phosphine-ligands like triphenylphosphine, tri-ortho-tolyl phosphine, tri-tert-butylphosphine, tricyclohexylphosphine, 2-Dicyclohexylphosphino-2',6'-dimethoxybiphenyl (SPhos), 2-Dicyclohexylphosphino-2',4',6'-triisopropylbiphenyl (XPhos), or N-heterocyclic carbenes such as 1,3-Bis(2,6-diisopropylphenyl)imidazol-2-ylidene (IPr), 1,3-Dimesityl-imidazol-2-ylidene (Imes).

Hal and —BQ$_2$ are as defined above.

Josiphos:

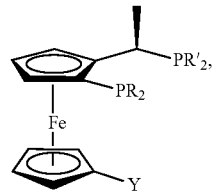

wherein R and R' are generally substituted or unsubstituted phenyl.

The residues, groups and indices R'', R''', R'''' are suitably substituted derivatives of Ar$_1$, Ar$_2$ and L as defined above.

Compounds of the formula

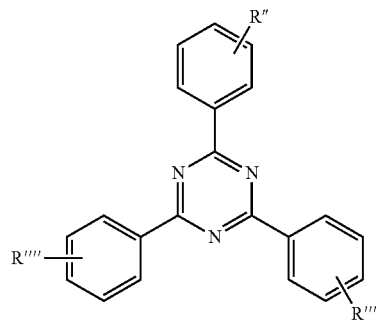

can be further derivatized if necessary.

Details of the reaction steps and process conditions are mentioned in the examples of the present application. The production method of the compounds of formula (I) according to the present invention is not particularly limited and it is produced according to known methods, for example, by a Suzuki coupling as described in *Journal of American Chemistry Society*, 1999, 121, 9550 to 9561 or *Chemical Reviews*, 1995, 95, 2457 to 2483 or Kumada coupling described in *Org. Lett.*, 2010, 12, 2298-2301 or *Angew. Chem.*, 2002, 114, 4218-4221.

It has been found that the compounds of formula (I) are particularly suitable for use in applications in which charge carrier conductivity is required, especially for use in organic electronics applications, for example selected from switching elements such as organic transistors, e.g. organic FETs and organic TFTs, organic solar cells and organic light-emitting diodes (OLEDs).

The term organic EL device (organic electroluminescence device) is used interchangeably with the term organic light-emitting diode (OLED) in the present application; i.e. both terms have the same meaning in the sense of the present application.

The present invention further relates to a material for an organic EL device comprising at least one compound of formula (I).

The organic transistor generally includes a semiconductor layer formed from an organic layer with charge transport capacity; a gate electrode formed from a conductive layer; and an insulating layer introduced between the semiconductor layer and the conductive layer. A source electrode and a drain electrode are mounted on this arrangement in order thus to produce the transistor element. In addition, further layers known to those skilled in the art may be present in the organic transistor. The layers with charge transport capacity may comprise the compound of formula (I).

The organic solar cell (photoelectric conversion element) generally comprises an organic layer present between two plate-type electrodes arranged in parallel. The organic layer may be configured on a comb-type electrode. There is no particular restriction regarding the site of the organic layer and there is no particular restriction regarding the material of the electrodes. When, however, plate-type electrodes arranged in parallel are used, at least one electrode is preferably formed from a transparent electrode, for example an ITO electrode or a fluorine-doped tin oxide electrode. The organic layer is formed from two sublayers, i.e. a layer with p-type semiconductor properties or hole transport capacity, and a layer formed with n-type semiconductor properties or charge transport capacity. In addition, it is possible for further layers known to those skilled in the art to be present in the organic solar cell. The layers with charge transport capacity may comprise the compound of formula (I).

The compounds of formula (I) being particularly suitable in OLEDs for use as charge and/or exciton-blocking material, i.e. as hole/exciton-blocking material, and/or charge-transporting material, i.e. hole-transporting material or electron-transporting material, preferably as electron-transporting material and/or hole-blocking material.

In the case of use of the inventive compounds of formula (I) in OLEDs, OLEDs having good overall properties, preferably a long lifetime and/or a low driving voltage are obtained.

Organic Electroluminescence Device

According to one aspect of the present invention, a material for an organic electroluminescence device, comprising at least one compound of formula (I) is provided.

According to another aspect of the invention, the following organic electroluminescence device is provided, comprising at least one compound of formula (I). The organic electroluminescence device generally comprises: a cathode, an anode, and one or more organic thin film layers comprising an emitting layer disposed between the cathode and the anode, wherein at least one layer of the organic thin film layers comprises at least one compound of formula (I).

In the present specification, regarding "one or more organic thin film layers disposed between the cathode and the anode", if only one organic layer is present between the cathode and the anode, it means the layer, and if plural organic layers are present between the cathode and the anode, it means at least one layer thereof.

According to another aspect of the invention, the use of a compound of formula (I) according to the present invention in an organic electroluminescence device is provided.

In one embodiment, the organic EL device has a hole-transporting layer between the anode and the emitting layer.

In one embodiment, the organic EL device has an electron-transporting layer between the cathode and the emitting layer.

In one embodiment, the organic EL device has a hole-blocking layer between the electron-transporting layer and the emitting layer.

Layer(s) Between the Emitting Layer and the Anode:

In the organic EL device according to the present invention, one or more organic thin film layers may be present between the emitting layer and the anode. If only one organic layer is present between the emitting layer and the anode, it means that layer, and if plural organic layers are present, it means at least one layer thereof. For example, if two or more organic layers are present between the emitting layer and the anode, an organic layer nearer to the emitting layer is called the "hole-transporting layer", and an organic layer nearer to the anode is called the "hole-injecting layer".

Each of the "hole-transporting layer" and the "holeinjecting layer" may be a single layer or may be formed of two or more layers. One of these layers may be a single layer and the other may be formed of two or more layers.

Layer(s) Between the Emitting Layer and the Cathode:

Similarly, one or more organic thin film layers may be present between the emitting layer and the cathode, in the organic EL device according to the present invention (electron-transporting zone, at least including an electron-transporting layer and preferably also an electron-injecting layer and/or a hole-blocking layer). If only one organic layer is present between the emitting layer and the cathode it means that layer, and if plural organic layers are present, it means at least one layer thereof. For example, if two or more organic layers are present between the emitting layer and the cathode, an organic layer nearest to the emitting layer is called the "hole-blocking layer", an organic layer nearest to the "hole-blocking layer" is called the "electron-transporting layer", and an organic layer nearer to the cathode is called the "electron-injecting layer". Each of the "hole-blocking layer", "electron-transporting layer" and the "electron-injecting layer" may be a single layer or may be formed of two or more layers. One of these layers may be a single layer and the other may be formed of two or more layers.

The one or more organic thin film layers between the emitting layer and the cathode, preferably the "electron-transporting zone", preferably comprises a compound represented by formula (I).

Therefore, in a preferred embodiment, the organic thin film layers of the organic electroluminescence device comprise an electron-transporting zone provided between the emitting layer and the cathode, wherein the electron-transporting zone comprises at least one compound represented by formula (I). The compound represented by formula (I) preferably functions as "hole-blocking" material in the hole-blocking layer and/or "electron-transporting" material in the electron-transporting layer.

In an exemplary embodiment, the one or more organic thin film layers of the organic EL device of the present invention at least include the emitting layer and an electron-transporting zone. The electron-transporting zone is provided between the emitting layer and the cathode and at least includes an electron-transporting layer and preferably also an electron injecting layer and/or a hole-blocking layer. The electron-transporting zone may include the electron-injecting layer and an electron-transporting layer and may further include a hole-blocking layer and optionally a space layer. In addition to the above layers, the one or more organic thin film layers may be provided by layers applied in a known organic EL device such as a hole-injecting layer, a hole transporting layer and an electron-blocking layer. The one or more organic thin film layers may include an inorganic compound.

An explanation will be made on the layer configuration of the organic EL device according to one aspect of the invention.

An organic EL device according to one aspect of the invention comprises a cathode, an anode, and one or more organic thin film layers comprising an emitting layer disposed between the cathode and the anode. The organic layer comprises at least one layer composed of an organic compound. Alternatively, the organic layer is formed by laminating a plurality of layers composed of an organic compound. The organic layer may further comprise an inorganic compound in addition to the organic compound.

At least one of the organic layers is an emitting layer. The organic layer may be constituted, for example, as a single emitting layer, or may comprise other layers which can be adopted in the layer structure of the organic EL device. The layer that can be adopted in the layer structure of the organic EL device is not particularly limited, but examples thereof include a hole-transporting zone (a hole-transporting layer, a hole-injecting layer, an electron-blocking layer, an exciton-blocking layer, etc.), an emitting layer, a spacing layer, and an electron-transporting zone (electron-transporting layer, electron-injecting layer, hole-blocking layer, etc.) provided between the cathode and the emitting layer.

The organic EL device according to one aspect of the invention may be, for example, a fluorescent or phosphorescent monochromatic light emitting device or a fluorescent/phosphorescent hybrid white light emitting device.

Further, it may be a simple type device having a single emitting unit or a tandem type device having a plurality of emitting units.

The "emitting unit" in the specification is the smallest unit that comprises organic layers, in which at least one of the organic layers is an emitting layer and light is emitted by recombination of injected holes and electrons.

In addition, the emitting layer described in the present specification is an organic layer having an emitting function. The emitting layer is, for example, a phosphorescent emitting layer, a fluorescent emitting layer or the like, and may be a single layer or a stack of a plurality of layers.

The "emitting unit" may be a stacked type unit having a plurality of phosphorescent emitting layers and/or fluorescent emitting layers. In this case, for example, a spacing layer for preventing excitons generated in the phosphorescent emitting layer from diffusing into the fluorescent emitting layer may be provided between the respective light-emitting layers.

As the simple type organic EL device, a device configuration such as anode/emitting unit/cathode can be given.

Examples for representative layer structures of the emitting unit are shown below. The layers in parentheses are provided arbitrarily:

(a) (Hole-injecting layer/) Hole-transporting layer/Fluorescent emitting layer (/Electron-transporting layer/Electron-injecting layer)
(b) (Hole-injecting layer/) Hole-transporting layer/Phosphorescent emitting layer (/Electron-transporting layer/Electron-injecting layer)
(c) (Hole-injecting layer/) Hole-transporting layer/First fluorescent emitting layer/Second fluorescent emitting layer (/Electron-transporting layer/Electron-injecting layer)
(d) (Hole-injecting layer/) Hole-transporting layer/First phosphorescent layer/Second phosphorescent layer (/Electron-transporting layer/Electron-injecting layer)
(e) (Hole-injecting layer/) Hole-transporting layer/Phosphorescent emitting layer/Spacing layer/Fluorescent emitting layer (/Electron-transporting layer/Electron-injecting layer)
(f) (Hole-injecting layer/) Hole-transporting layer/First phosphorescent emitting layer/Second phosphorescent emitting layer/Spacing layer/Fluorescent emitting layer (/Electron-transporting layer/Electron-injecting layer)
(g) (Hole-injecting layer/) Hole-transporting layer/First phosphorescent layer/Spacing layer/Second phosphorescent emitting layer/Spacing layer/Fluorescent emitting layer (/Electron-transporting layer/Electron-injecting layer)
(h) (Hole-injecting layer/) Hole-transporting layer/Phosphorescent emitting layer/Spacing layer/First fluorescent emitting layer/Second fluorescent emitting layer (/Electron-transporting Layer/Electron-injecting Layer)
(i) (Hole-injecting layer/) Hole-transporting layer/Electron-blocking layer/Fluorescent emitting layer (/Electron-transporting layer/Electron-injecting layer)
(j) (Hole-injecting layer/) Hole-transporting layer/Electron-blocking layer/Phosphorescent emitting layer (/Electron-transporting layer/Electron-injecting layer)
(k) (Hole-injecting layer/) Hole-transporting layer/Exciton-blocking layer/Fluorescent emitting layer (/Electron-transporting layer/Electron-injecting layer)
(l) (Hole-injecting layer/) Hole-transporting layer/Exciton-blocking layer/Phosphorescent emitting layer (/Electron-transporting layer/Electron-injecting layer)
(m) (Hole-injecting layer/) First hole-transporting Layer/Second hole-transporting Layer/Fluorescent emitting layer (/Electron-transporting layer/electron-injecting Layer)
(n) (Hole-injecting layer/) First hole-transporting layer/Second hole-transporting layer/Fluorescent emitting layer (/First electron-transporting layer/Second electron-transporting layer/Electron-injection layer)
(o) (Hole-injecting layer/) First hole-transporting layer/Second hole-transporting layer/Phosphorescent emitting layer (/Electron-transporting layer/Electron-injecting Layer)
(p) (Hole-injecting layer/) First hole-transporting layer/Second hole-transporting layer/Phosphorescent emitting layer (/First electron-transporting Layer/Second electron-transporting layer/Electron-injecting layer)
(q) (Hole-injecting layer/) Hole-transporting layer/Fluorescent emitting layer/Hole-blocking layer (/Electron-transporting layer/Electron-injecting layer)
(r) (Hole-injecting layer/) Hole-transporting layer/Phosphorescent emitting layer/Hole-blocking layer (/Electron-transport layer/Electron-injecting layer)
(s) (Hole-injecting layer/) Hole-transporting layer/Fluorescent emitting layer/Exciton-blocking layer (/Electron-transporting layer/Electron-injecting layer)
(t) (Hole-injecting layer/) Hole-transporting layer/Phosphorescent emitting layer/Exciton-blocking layer (/Electron-transporting layer/Electron-injecting layer)

The layer structure of the organic EL device according to one aspect of the invention is not limited to the examples mentioned above.

For example, when the organic EL device has a hole-injecting layer and a hole-transporting layer, it is preferred that a hole-injecting layer be provided between the hole-transporting layer and the anode. Further, when the organic EL device has an electron-injecting layer and an electron-transporting layer, it is preferred that an electron-injecting layer be provided between the electron-transporting layer and the cathode. Further, each of the hole-injecting layer, the hole-transporting layer, the electron-transporting layer and the electron-injecting layer may be formed of a single layer or be formed of a plurality of layers.

The plurality of phosphorescent emitting layers and/or fluorescent emitting layers may be emitting layers that emit mutually different colors. For example, the emitting unit (f) may include a hole-transporting layer/first phosphorescent layer (red light emission)/second phosphorescent emitting layer (green light emission)/spacing layer/fluorescent emitting layer (blue light emission)/electron-transporting layer.

An electron-blocking layer may be provided between each light emitting layer and the hole-transporting layer or the spacing layer. Further, a hole-blocking layer may be provided between each emitting layer and the electron-transporting layer. By providing the electron-blocking layer or the hole-blocking layer, it is possible to confine electrons or holes in the emitting layer, thereby to improve the recombination probability of carriers in the emitting layer, and to improve light emitting efficiency.

As a representative device configuration of a tandem type organic EL device, for example, a device configuration such as anode/first emitting unit/intermediate layer/second emitting unit/cathode can be given:

The first emitting unit and the second emitting unit are independently selected from the above-mentioned emitting units, for example.

The intermediate layer is also generally referred to as an intermediate electrode, an intermediate conductive layer, a charge generating layer, an electron withdrawing layer, a connecting layer, a connector layer, or an intermediate insulating layer. The intermediate layer is a layer that supplies electrons to the first emitting unit and holes to the second emitting unit, and can be formed from known materials.

The FIGURE shows a schematic configuration of one example of the organic EL device of the invention. The organic EL device 1 comprises a substrate 2, an anode 3, a cathode 4 and an emitting unit 10 provided between the anode 3 and the cathode 4. The emitting unit 10 comprises an emitting layer 5 preferably comprising a host material and a dopant. A hole-injecting and transporting layer 6 or the like may be provided between the emitting layer 5 and the anode 3 and an electron-injecting layer 9 and an electron-transporting layer 8 and/or a hole-blocking layer 7 or the like (electron-transporting zone 11) may be provided between the emitting layer 5 and the cathode 4. An electron-blocking layer may be provided on the anode 3 side of the emitting layer 5. Due to such configuration, electrons or holes can be confined in the emitting layer 5, whereby possibility of generation of excitons in the emitting layer 5 can be improved.

Hereinbelow, an explanation will be made on function, materials, etc. of each layer constituting the organic EL device described in the present specification.

(Substrate)

The substrate is used as a support of the organic EL device. The substrate preferably has a light transmittance of 50% or more in the visible light region with a wavelength of 400 to 700 nm, and a smooth substrate is preferable. Examples of the material of the substrate include soda-lime glass, aluminosilicate glass, quartz glass, plastic and the like. As a substrate, a flexible substrate can be used. The flexible substrate means a substrate that can be bent (flexible), and examples thereof include a plastic substrate and the like. Specific examples of the material for forming the plastic substrate include polycarbonate, polyallylate, polyether sulfone, polypropylene, polyester, polyvinyl fluoride, polyvinyl chloride, polyimide, polyethylene naphthalate and the like. Also, an inorganic vapor deposited film can be used.

(Anode)

As the anode, for example, it is preferable to use a metal, an alloy, a conductive compound, a mixture thereof or the like and having a high work function (specifically, 4.0 eV or more). Specific examples of the material of the anode include indium oxide-tin oxide (ITO: Indium Tin Oxide), indium oxide-tin oxide containing silicon or silicon oxide, indium oxide-zinc oxide, indium oxide containing tungsten oxide or zinc oxide, graphene and the like. In addition, it is also possible to use gold, silver, platinum, nickel, tungsten, chromium, molybdenum, iron, cobalt, copper, palladium, titanium, and nitrides of these metals (e.g. titanium oxide).

The anode is normally formed by depositing these materials on the substrate by a sputtering method. For example, indium oxide-zinc oxide can be formed by a sputtering method by using a target in which 1 to 10 mass % zinc oxide is added relative to indium oxide. Further, indium oxide containing tungsten oxide or zinc oxide can be formed by a sputtering method by using a target in which 0.5 to 5 mass % of tungsten oxide or 0.1 to 1 mass % of zinc oxide is added relative to indium oxide.

As other methods for forming the anode, a vacuum deposition method, a coating method, an inkjet method, a spin coating method or the like can be given. When silver paste or the like is used, it is possible to use a coating method, an inkjet method or the like.

The hole-injecting layer formed in contact with the anode is formed by using a material that allows easy hole injection regardless of the work function of the anode. For this reason, in the anode, it is possible to use a common electrode material, e.g. a metal, an alloy, a conductive compound and a mixture thereof. Specifically, a material having a small work function such as alkaline metals such as lithium and cesium; alkaline earth metals such as calcium and strontium; alloys containing these metals (for example, magnesium-silver and aluminum-lithium); rare earth metals such as europium and ytterbium; and an alloy containing rare earth metals.

(Hole-Transporting Layer)/(Hole-Injecting Layer/Electron-Blocking Layer)

The hole-transporting layer is an organic layer that is formed between the emitting layer and the anode, and has a function of transporting holes from the anode to the emitting layer. If the hole-transporting layer is composed of plural layers, an organic layer that is nearer to the anode may often be defined as the hole-injecting layer. The hole-injecting layer has a function of injecting holes efficiently to the organic layer unit from the anode. Said hole-injecting layer is generally used for stabilizing hole injection from anode to hole-transporting layer which is generally consist of organic materials. Organic material having good contact with anode or organic material with p-type doping is preferably used for the hole-injecting layer.

p-doping usually consists of one or more p-dopant materials and one or more matrix materials. Matrix materials preferably have shallower HOMO level and p-dopant preferably have deeper LUMO level to enhance the carrier density of the layer. Aryl or heteroaryl amine compounds are preferably used as the matrix materials. Specific examples for the matrix material are the same as that for hole-transporting layer which is explained at the later part. Specific examples for p-dopant are the below mentioned acceptor materials, preferably the quinone compounds with one or more electron withdrawing groups, such as $F_4$TCNQ, 1,2,3-Tris[(cyano)(4-cyano-2,3,5,6-tetrafluorophenyl)methylene]cyclopropane.

Acceptor materials, or fused aromatic hydrocarbon materials or fused heterocycles which have high planarity, are preferably used as p-dopant materials for the hole-injecting layer. Specific examples for acceptor materials are, the quinone compounds with one or more electron withdrawing groups, such as $F_4$TCNQ(2,3,5,6-tetrafluoro-7,7,8,8-tetracyanoquinodimethane), and 1,2,3-tris[(cyano)(4-cyano-2,3,5,6-tetrafluorophenyl)methylene]cyclopropane; hexa-azatriphenylene compounds with one or more electron withdrawing groups, such as hexa-azatriphenylene-hexanitrile; aromatic hydrocarbon compounds with one or more electron withdrawing groups; and aryl boron compounds with one or more electron withdrawing groups.

The ratio of the p-type dopant is preferably less than 20% of molar ratio, more preferably less than 10%, such as 1%, 3%, or 5%, related to the matrix material.

The hole-transporting layer is generally used for injecting and transporting holes efficiently, and aromatic or heterocyclic amine compounds are preferably used.

Specific examples for compounds for the hole-transporting layer are represented by the general formula (H),

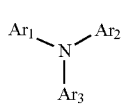

(H)

wherein
Ar$_1$ to Ar$_3$ each independently represents substituted or unsubstituted aryl group having 5 to 50 carbon atoms or substituted or unsubstituted heterocyclic group having 5 to 50 ring atoms, preferably phenyl group, biphenyl group, terphenyl group, naphthyl group, phenanthryl group, triphenylenyl group, fluorenyl group, spirobifluorenyl group, indenofluorenyl group, carbazolyl group, dibenzofuranyl group, dibenzothiophenyl group, carbazole substituted aryl group, dibenzofuran substituted aryl group or dibenzothiophene substituted aryl group; two or more substituents selected among Ar$^1$ to Ar$^3$ may be bonded to each other to form a ring structure, such as a carbazole ring structure, or a acridane ring structure.

Preferably, at least one of Ar$_1$ to Ar$_3$ have additional one aryl or heterocyclic amine substituent, more preferably Ar$_1$ has an additional aryl amino substituent, at the case of that it is preferable that Ar$_1$ represents substituted or unsubstituted biphenylene group, substituted or unsubstituted fluorenylene group.

A second hole-transporting layer is preferably inserted between the first hole-transporting layer and the emitting layer to enhance device performance by blocking excess electrons or excitons.

Specific examples for second hole-transporting layer are the same as for the the first hole-transporting layer. It is preferred that second hole-transporting layer has higher triplet energy to block triplet excitons, especially for phosphorescent green device, such as bicarbazole compounds, biphenylamine compounds, triphenylenyl amine compounds, fluorenyl amine compounds, carbazole substituted arylamine compounds, dibenzofuran substituted arylamine compounds, and dibenzothiophene substituted arylamine compounds.

This second hole-transporting layer also called electron-blocking layer provided adjacent to the emitting layer has a function of preventing leakage of electrons from the emitting layer to the hole-transporting layer.

(Emitting Layer)

The emitting layer is a layer containing a substance having a high emitting property (emitter material or dopant material). As the dopant material, various materials can be used. For example, a fluorescent emitting compound (fluorescent dopant), a phosphorescent emitting compound (phosphorescent dopant) or the like can be used. A fluorescent emitting compound is a compound capable of emitting light from the singlet excited state, and an emitting layer containing a fluorescent emitting compound is called a fluorescent emitting layer. Further, a phosphorescent emitting compound is a compound capable of emitting light from the triplet excited state, and an emitting layer containing a phosphorescent emitting compound is called a phosphorescent emitting layer.

The emitting layer preferably comprises at least one dopant material and at least one host material that allows it to emit light efficiently. In some literatures, a dopant material is called a guest material, an emitter or an emitting material. In some literatures, a host material is called a matrix material.

A single emitting layer may comprise plural dopant materials and plural host materials. Further, plural emitting layers may be present.

In the present specification, a host material combined with the fluorescent dopant is referred to as a "fluorescent host" and a host material combined with the phosphorescent dopant is referred to as the "phosphorescent host". Note that the fluorescent host and the phosphorescent host are not classified only by the molecular structure. The phosphorescent host is a material for forming a phosphorescent emitting layer containing a phosphorescent dopant, but does not mean that it cannot be used as a material for forming a fluorescent emitting layer. The same can be applied to the fluorescent host.

No specific restrictions are generally imposed on the content of the dopant material in a host in the emitting layer. A person skilled in the art generally knows the concentration of a phosphorescent dopant respectively a fluorescent dopant usually present in a suitable host. In respect of sufficient emission and concentration quenching, the content is preferably 0.5 to 70 mass %, more preferably 0.8 to 30 mass %, further preferably 1 to 30 mass %, still further preferably 1 to 20 mass. The remaining mass of the emitting layer is generally provided by one or more host materials.

(Fluorescent Dopant)

Suitable fluorescent dopants are generally known by a person skilled in the art. As a fluorescent dopant a fused polycyclic aromatic compound, a styrylamine compound, a fused ring amine compound, a boron-containing compound, a pyrrole compound, an indole compound, a carbazole compound can be given, for example. Among these, a fused ring amine compound, a boron-containing compound, carbazole compound is preferable.

As the fused ring amine compound, a diaminopyrene compound, a diaminochrysene compound, a diaminoanthracene compound, a diaminofluorene compound, a diaminofluorene compound with which one or more benzofuro skeletons are fused, or the like can be given.

As the boron-containing compound, a pyrromethene compound, a triphenylborane compound or the like can be given.

(Phosphorescent Dopant)

Suitable phosphorescent dopants are generally known by a person skilled in the art. As a phosphorescent dopant, a phosphorescent emitting heavy metal complex and a phosphorescent emitting rare earth metal complex can be given, for example.

As the heavy metal complex, an iridium complex, an osmium complex, a platinum complex or the like can be given. The heavy metal complex is for example an orthometalated complex of a metal selected from iridium, osmium and platinum.

Examples of rare earth metal complexes include terbium complexes, europium complexes and the like. Specifically, tris(acetylacetonate)(monophenanthroline)terbium(III) (abbreviation: Tb(acac)$_3$(Phen)), tris(1,3-diphenyl-1,3-propandionate)(monophenanthroline)europium(II) (abbreviation:

Eu(DBM)$_3$(Phen)), tris[1-(2-thenoyl)-3,3,3-trifluoroacetonate](monophenanthroline)europium(II) (abbreviation: Eu(TTA)$_3$(Phen)) or the like can be given. These rare earth metal complexes are preferable as phosphorescent dopants since rare earth metal ions emit light due to electronic transition between different multiplicity.

As a blue phosphorescent dopant, an iridium complex, an osmium complex, a platinum complex, or the like can be given, for example. Specifically, bis[2-(4',6'-difluorophenyl) pyridinate-N,C2']iridium(III) tetrakis(1-pyrazolyl)borate (abbreviation: FIr6), bis[2-(4',6'-difluorophenyl)pyridinato-N,C2']iridium(III) picolinate (abbreviation: Ir(CF$_3$ppy)$_2$ (pic)), bis[2-(4',6'-difluorophenyl)pyridinato-N,C2']iridium (III) acetylacetonate (abbreviation: FIracac) or the like can be given.

As a green phosphorescent dopant, an iridium complex or the like can be given, for example. Specifically, tris(2-phenylpyridinato-N,C2') iridium(III) (abbreviation: Ir(ppy)$_3$), bis(1,2-diphenyl-1H-benzimidazolato)iridium (III) acetylacetonate (abbreviation: Ir(pbi)$_2$(acac)), bis(benzo[h]quinolinato)iridium(II) acetylacetonate (abbreviation: Ir(bzq)$_2$(acac)) or the like can be given.

As a red phosphorescent dopant, an iridium complex, a platinum complex, a terbium complex, an europium complex or the like can be given. Specifically, bis[2-(2'-benzo [4,5-a]thienyl)pyridinato-N,C3']iridium(III) acetylacetonate (abbreviation: Ir(btp)$_2$(acac)), bis(1-phenylisoquinolinato-N,C2')iridium(III) acetylacetonate (abbreviation: Ir(piq)$_2$ (acac)), (acetylacetonato)bis[2,3-bis(4-fluorophenyl)quinoxalinato]iridium(III) (abbreviation: Ir(Fdpq)$_2$(acac)), 2,3, 7,8,12,13,17,18-octaethyl-21H,23H-porphyrin platinum(II) (abbreviation PtOEP) or the like can be given.

(Host Material)

As host material, metal complexes such as aluminum complexes, beryllium complexes and zinc complexes; heterocyclic compounds such as indole compounds, pyridine compounds, pyrimidine compounds, triazine compounds, quinoline compounds, isoquinoline compounds, quinazoline compounds, dibenzofuran compounds, dibenzothiophene compounds, oxadiazole compounds, benzimidazole compounds, phenanthroline compounds; fused polyaromatic hydrocarbon (PAH) compounds such as a naphthalene compound, a triphenylene compound, a carbazole compound, an anthracene compound, a phenanthrene compound, a pyrene compound, a chrysene compound, a naphthacene compound, a fluoranthene compound; and aromatic amine compound such as triarylamine compounds and fused polycyclic aromatic amine compounds can be given, for example. Plural types of host materials can be used in combination.

As a fluorescent host, a compound having a higher singlet energy level than a fluorescent dopant is preferable. For example, a heterocyclic compound, a fused aromatic compound or the like can be given. As a fused aromatic compound, an anthracene compound, a pyrene compound, a chrysene compound, a naphthacene compound or the like are preferable. An anthracene compound is preferentially used as blue fluorescent host.

As a phosphorescent host, a compound having a higher triplet energy level as compared with a phosphorescent dopant is preferable. For example, a metal complex, a heterocyclic compound, a fused aromatic compound or the like can be given. Among these, an indole compound, a carbazole compound, a pyridine compound, a pyrimidine compound, a triazine compound, a quinolone compound, an isoquinoline compound, a quinazoline compound, a dibenzofuran compound, a dibenzothiophene compound, a naphthalene compound, a triphenylene compound, a phenanthrene compound, a fluoranthene compound or the like can be given.

Preferred host materials are substituted or unsubstituted polyaromatic hydrocarbon (PAH) compounds, substituted or unsubstituted polyheteroaromatic compounds, substituted or unsubstituted anthracene compounds, or substituted or unsubstituted pyrene compounds, preferably substituted or unsubstituted anthracene compounds or substituted or unsubstituted pyrene compounds, more preferably substituted or unsubstituted anthracene compounds, most preferably anthracene compounds represented by formula (10) below.

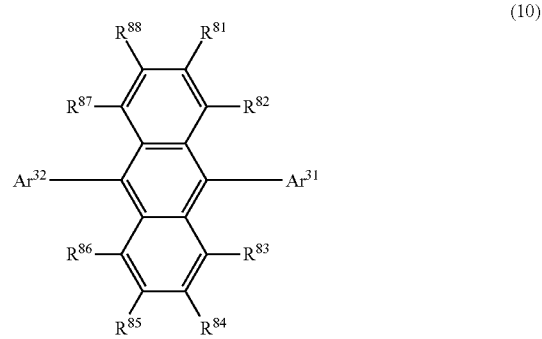

(10)

In the formula (10), $Ar^{31}$ and $Ar^{32}$ each independently represent a substituted or unsubstituted aryl group having 6 to 50 ring carbon atoms or a heterocyclic group having 5 to 50 ring atoms.

$R^{81}$ to $R^{88}$ each independently represent a hydrogen atom, a substituted or unsubstituted aryl group having 6 to 50 ring carbon atoms, a substituted or unsubstituted heterocyclic group having 5 to 50 ring atoms, a substituted or unsubstituted alkyl group having 1 to 50 carbon atoms, a substituted or unsubstituted alkoxy group having 1 to 50 carbon atoms, a substituted or unsubstituted aralkyl group having 7 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted alkoxycarbonyl group having 2 to 50 carbon atoms, a substituted or unsubstituted silyl group, a carboxyl group, a halogen atom, a cyano group, a nitro group or a hydroxyl group.

In formula (10):

The aryl group having 6 to 50 ring carbon atoms is preferably an aryl group having 6 to 40 ring carbon atoms, more preferably an aryl group having 6 to 30 ring carbon atoms.

The heterocyclic group having 5 to 50 ring atoms is preferably a heterocyclic group having 5 to 40 ring atoms, more preferably a heterocyclic group having 5 to 30 ring atoms. More preferably, the heterocyclic group is a substituted or unsubstituted heteroaryl group having to 30 ring atoms. Suitable substituted or unsubstituted heteroaryl groups are mentioned above.

The alkyl group having 1 to 50 carbon atoms is preferably an alkyl group having 1 to 30 carbon atoms, more preferably an alkyl group having 1 to 10 carbon atoms, further preferably an alkyl group having 1 to 5 carbon atoms.

The alkoxy group having 1 to 50 carbon atoms is preferably an alkoxy group having 1 to 30 carbon atoms, more preferably an alkoxy group having 1 to 10 carbon atoms, further preferably an alkoxy group having 1 to 5 carbon atoms.

The aralkyl group having 7 to 50 carbon atoms is preferably an aralkyl group having 7 to 30 carbon atoms, more preferably an aralkyl group having 7 to 20 carbon atoms.

The aryloxy group having 6 to 50 ring carbon atoms is preferably an aryloxy group having 6 to 40 ring carbon atoms, more preferably an aryloxy group having 6 to 30 ring carbon atoms.

The arylthio group having 6 to 50 ring carbon atoms is preferably an arylthio group having 6 to 40 ring carbon atoms, more preferably an arylthio group having 6 to 30 ring carbon atoms.

The alkoxycarbonyl group having 2 to 50 carbon atoms is preferably an alkoxycarbonyl group having 2 to 30 carbon atoms, more preferably an alkoxycarbonyl group having 2 to 10 carbon atoms, further preferably an alkoxycarbonyl group having 2 to 5 carbon atoms.

Examples of the halogen atom are a fluorine atom, a chlorine atom and a bromine atom.

$Ar^{31}$ and $Ar^{31'}$ are preferably a substituted or unsubstituted aryl group having 6 to 50 ring carbon atoms.

(Electron-Transporting Zone)/(Electron-Transporting Layer/Electron-Injecting Layer/Hole-Blocking Layer)

The electron-transporting zone is an organic layer or a plurality of organic layers that is formed between the emitting layer and the cathode and has a function of transporting electrons from the cathode to the emitting layer. The electron-transporting zone therefore comprises at least one electron-transporting layer comprising an electron-transporting material. When the electron-transporting zone is formed of plural layers, an organic layer or an inorganic layer that is nearer to the cathode is often defined as the electron-injecting layer (see for example the FIGURE, wherein an electron-injecting layer 9, an electron-transporting layer and preferably a hole-blocking layer 7 form an electron-transporting zone 11). The electron-injecting layer has a function of injecting electrons from the cathode efficiently to the organic layer unit. Preferred electron-injecting materials are alkali metal, alkali metal compounds, alkali metal complexes, the alkaline earth metal complexes and compounds and rare earth metals or rare earth metal complexes and compounds.

Preferably, the electron-injecting material are rare earth metals or rare earth metal complexes and compounds, more preferably rare earth metals. Suitable rare earth metals and rare earth metal compounds and complexes are mentioned below. Most preferred is ytterbium. In one preferred embodiment of the present invention, the electron-injecting layer does not comprise Liq, preferably, the electron-injecting layer does not comprise alkali metal complexes or compounds.

According to one embodiment, it is therefore preferred that the electron-transporting zone comprises in addition to the electron-transporting layer one or more layer(s) like an electron-injecting layer to enhance efficiency and lifetime of the device, a hole-blocking layer or an exciton/triplet-blocking layer (layer 7 in the FIGURE).

In one preferred embodiment of the present invention, the compound of the formula (I) is present in the electron-transporting zone, as an electron-transporting material, an electron-injecting material, a hole-blocking material, an exciton-blocking material and/or a triplet-blocking material. More preferably, the compound of the formula (I) is present in the electron-transporting zone as an electron-transporting material and/or a hole-blocking material.

According to one embodiment, it is preferred that an electron-donating dopant be contained in the interfacial region between the cathode and the emitting unit. Due to such a configuration, the organic EL device can have an increased luminance or a long life. Here, the electron-donating dopant means one having a metal with a work function of 3.8 eV or less. As specific examples thereof, at least one selected from an alkali metal, an alkali metal complex, an alkali metal compound, an alkaline earth metal, an alkaline earth metal complex, an alkaline earth metal compound, a rare earth metal, a rare earth metal complex and a rare earth metal compound or the like can be mentioned.

As the alkali metal, Li (work function: 2.9 eV), Na (work function: 2.36 eV), K (work function: 2.28 eV), Rb (work function: 2.16 eV), Cs (work function: 1.95 eV) and the like can be given. One having a work function of 2.9 eV or less is particularly preferable. Among them, K, Rb and Cs are preferable. Rb or Cs is further preferable. Cs is most preferable. As the alkaline earth metal, Ca (work function: 2.9 eV), Sr (work function: 2.0 eV to 2.5 eV), Ba (work function: 2.52 eV), Mg (work function: 3.68 eV) and the like can be given. One having a work function of 2.9 eV or less is particularly preferable. As the rare-earth metal, Sc, Y, Ce, Tb, Yb and the like can be given. One having a work function of 2.9 eV or less is particularly preferable.

Examples of the alkali metal compound include an alkali chalcogenide such as $Li_2O$, $Na_2O$, $Cs_2O$, $K_2O$, $Na_2S$ or $Na_2Se$, and an alkali halide such as LiF, NaF, CsF, KF, LiCl, KCl and NaCl. Among them, LiF, $Li_2O$ and NaF are preferable. Examples of the alkaline earth metal compound include BaO, SrO, CaO, BeO, BaS, CaSe and mixtures thereof such as $Ba_xSr_{1-x}O$ (0<x<1) and $Ba_xCa_1O$ (0<x<1). Alkaline earth metal halides are for example fluorides such as $CaF_2$, $BaF_2$, $SrF_2$, $MgF_2$ and $BeF_2$. Among them, BaO, SrO and CaO are preferable.

Examples of the rare earth metal compounds include one or more oxides, nitrides, oxidized nitrides or halides, especially fluorides, containing at least one element selected from Yb, Sc, Y, Ce, Gd, Tb and the like, for example $YbF_3$, $ScF_3$, $ScO_3$, $Y_2O_3$, $Ce_2O_3$, $GdF_3$ and $TbF_3$. Among these, $YbF_3$, $ScF_3$ and $TbF_3$ are preferable. Further suitable dopants are one or more oxides, nitrides and oxidized nitrides of Al, Ga, In, Cd, Si, Ta, Sb and Zn and nitrides and oxidized nitrides of Ba, Ca, Sr, Yb, Li, Na and Mg.

The alkali metal complexes, the alkaline earth metal complexes and the rare earth metal complexes are not particularly limited as long as they contain, as a metal ion, at least one of alkali metal ions, alkaline earth metal ions, and rare earth metal ions. Meanwhile, preferred examples of the ligand include, but are not limited to, quinolinol, benzoquinolinol, acridinol, phenanthridinol, hydroxyphenyloxazole, hydroxyphenylthiazole, hydroxydiaryloxadiazole, hydroxydiarylthiadiazole, hydroxyphenylpyridine, hydroxyphenylbenzimidazole, hydroxybenzotriazole, hydroxyfluborane, bipyridyl, phenanthroline, phthalocyanine, porphyrin, cyclopentadiene, β-diketones, and azomethines.

Regarding the addition form of the electron-donating dopant, it is preferred that the electron-donating dopant be formed in a shape of a layer or an island in the interfacial region. A preferred method for the formation is a method in which an organic compound (a light emitting material or an electron-injecting material) for forming the interfacial region is deposited simultaneously with deposition of the electron-donating dopant by a resistant heating deposition method, thereby dispersing the electron-donating dopant in the organic compound.

In a case where the electron-donating dopant is formed into the shape of a layer, the light-emitting material or electron-injecting material which serves as an organic layer in the interface is formed into the shape of a layer. After that, a reductive dopant is solely deposited by the resistant heating deposition method to form a layer preferably having a thickness of from 0.1 nm to 15 nm. In a case where the electron-donating dopant is formed into the shape of an island, the emitting material or the electron-injecting material which serves as an organic layer in the interface is formed into the shape of an island. After that, the electron-donating dopant is solely deposited by the resistant heating deposition method to form an island preferably having a thickness of from 0.05 nm to 1 nm.

As the electron-transporting material used in the electron-transporting layer other than a compound of the formula (I), an aromatic heterocyclic compound having one or more hetero atoms in the molecule may preferably be used. In particular, a nitrogen containing heterocyclic compound is preferable.

According to one embodiment, it is preferable that the electron-transporting layer comprises a nitrogen containing heterocyclic metal chelate.

According to another embodiment, it is preferable that the electron-transporting layer comprises a substituted or unsubstituted nitrogen containing heterocyclic compound.

Specific examples of preferred heterocyclic compounds for the electron-transporting layer are, 6-membered azine compounds; such as pyridine compounds, pyrimidine compounds, triazine compounds, pyrazine compounds, preferably pyrimidine compounds or triazine compounds; 6-membered fused azine compounds, such as quinolone compounds, isoquinoline compounds, quinoxaline compounds, quinazoline compounds, phenanthroline compounds, benzoquinoline compounds, benzoisoquinoline compounds, dibenzoquinoxaline compounds, preferably quinolone compounds, isoquinoline compounds, phenanthroline compounds; 5-membered heterocyclic compounds, such as imidazole compounds, oxazole compounds, oxadiazole compounds, triazole compounds, thiazole compounds, thiadiazole compounds; fused imidazole compounds, such as benzimidazole compounds, imidazopyridine compounds, naphthoimidazole compounds, benzimidazophenanthridine compounds, benzimidzobenzimidazole compounds, preferably benzimidazole compounds, imidazopyridine compounds or benzimidazophenanthridine compounds.

According to another embodiment, it is preferable the electron-transporting layer comprises a phosphine oxide compound represented as $Ar_{p1}Ar_{p2}Ar_{p3}P=O$.

$Ar_{p1}$ to $Ar_{p3}$ are the substituents of phosphor atom and each independently represent substituted or unsubstituted above mentioned aryl group or substituted or unsubstituted above mentioned heterocyclic group.

According to another embodiment, it is preferable that the electron-transporting layer comprises aromatic hydrocarbon compounds. Specific examples of preferred aromatic hydrocarbon compounds for the electron-transporting layer are, oligo-phenylene compounds, naphthalene compounds, fluorene compounds, fluoranthenyl group, anthracene compounds, phenanthrene compounds, pyrene compounds, triphenylene compounds, benzanthracene compounds, chrysene compounds, benzphenanthrene compounds, naphthacene compounds, and benzochrysene compounds, preferably anthracene compounds, pyrene compounds and fluoranthene compounds.

A hole-blocking layer may be provided adjacent to the emitting layer, and has a function of preventing leakage of holes from the emitting layer to the electron-transporting layer. In order to improve hole-blocking capability, a material having a deep HOMO level is preferably used.

In a preferred embodiment, the organic electroluminescence device according to the present invention, comprises an electron-transporting zone, wherein the electron-transporting zone further comprises at least one of an electron-donating dopant and preferably an organic metal complex. Suitable dopants are mentioned above.

More preferably, the at least one of an electron-donating dopant and an organic metal complex is at least one selected from the group consisting of an alkali metal, an alkali metal compound, an alkali metal complex, an alkaline earth metal, an alkaline earth metal compound, an alkaline earth metal complex, a rare earth metal, a rare earth metal compound, and a rare earth metal complex.

(Cathode)

For the cathode, a metal, an alloy, an electrically conductive compound, and a mixture thereof, each having a small work function (specifically, a work function of 3.8 eV or less) are preferably used. Specific examples of a material for the cathode include an alkali metal such as lithium and cesium; an alkaline earth metal such as magnesium, calcium, and strontium; an alloy containing these metals (for example, magnesium-silver, aluminum-lithium); a rare earth metal such as europium and ytterbium; and an alloy containing a rare earth metal.

The cathode is usually formed by a vacuum vapor deposition or a sputtering method. Further, in the case of using a silver paste or the like, a coating method, an inkjet method, or the like can be employed.

Moreover, when the electron-injecting layer is provided, various electrically conductive materials such as aluminum, silver, ITO, graphene, indium oxide-tin oxide containing silicon or silicon oxide, selected independently from the work function, can be used to form a cathode. These electrically conductive materials are made into films using a sputtering method, an inkjet method, a spin coating method, or the like.

(Insulating Layer)

In the organic EL device, pixel defects based on leakage or a short circuit are easily generated since an electric field is applied to a thin film. In order to prevent this, it is preferred to insert an insulating thin layer between a pair of electrodes. Examples of materials used in the insulating layer include aluminum oxide, lithium fluoride, lithium oxide, cesium fluoride, cesium oxide, magnesium oxide, magnesium fluoride, calcium oxide, calcium fluoride, aluminum nitride, titanium oxide, silicon oxide, germanium oxide, silicon nitride, boron nitride, molybdenum oxide, ruthenium oxide, and vanadium oxide. A mixture thereof may be used in the insulating layer, and a laminate of a plurality of layers that include these materials can be also used for the insulating layer.

(Spacing Layer)

A spacing layer is a layer for example provided between a fluorescent emitting layer and a phosphorescent emitting layer when a fluorescent emitting layer and a phosphorescent emitting layer are stacked in order to prevent diffusion of excitons generated in the phosphorescent emitting layer to the fluorescent emitting layer or in order to adjust the carrier balance. Further, the spacing layer can be provided between the plural phosphorescent emitting layers.

Since the spacing layer is for example provided between the emitting layers, the material used for the spacing layer is preferably a material having both electron-transporting capability and hole-transporting capability. In order to prevent diffusion of the triplet energy in adjacent phosphorescent emitting layers, it is preferred that the spacing layer have a triplet energy of 2.6 eV or more. As the material used for the spacing layer, the same materials as those used in the above-mentioned hole-transporting layer can be given.

Triplet-Blocking Layer

A triplet-blocking layer (exciton-blocking layer) may be provided adjacent to the emitting layer.

The triplet-blocking layer has a function of preventing triplet excitons generated in the emitting layer from diffusing into neighboring layers to trap the triplet excitons within the emitting layer, thereby suppressing energy deactivation of the triplet excitons on molecules other than the emitting dopant in the electron-transporting layer.

When the triplet-blocking layer is provided in a phosphorescent device, triplet energy of a phosphorescent dopant in the emitting layer is denoted as ET d and triplet energy of a compound used as the triplet-blocking layer is denoted as ET TB. In an energy relationship of ET d<ET TB, triplet excitons of the phosphorescent dopant are trapped (cannot be transferred to another molecule) to leave no alternative route for energy deactivation other than emission on the dopant, so that highly efficient emission can be expected. However, when an energy gap (Δ ET=ET TB−ET d) is small even though the relationship of ET d<ET TB is satisfied, under actual environments for driving a device (i.e., at around the room temperature), it is considered that triplet excitons can be transferred to another molecule irrespective of the energy gap Δ ET by absorbing heat energy around the device. Particularly, since the excitons of the phosphorescent device have longer lifetime than those of a fluorescent device, influence by heat absorption during transfer of the excitons is more likely to be given on the phosphorescent device relative to the fluorescent device. A larger energy gap Δ ET relative to heat energy at the room temperature is preferable, more preferably 0.1 eV or more, further preferable at 0.2 eV or more. On the other hand, in the fluorescent device, the organic-EL-device material according to the exemplary embodiment is usable as the triplet-blocking layer in the TTF device structure described in International Publication WO2010/134350A1.

(Method for Forming a Layer)

The method for forming each layer of the organic EL device of the invention is not particularly limited unless otherwise specified. A known film-forming method such as a dry film-forming method, a wet film-forming method or the like can be used. Specific examples of the dry film-forming method include a vacuum deposition method, a sputtering method, a plasma method, an ion plating method, and the like. Specific examples of the wet film-forming method include various coating methods such as a spin coating method, a dipping method, a flow coating method, an inkjet method, and the like.

(Film Thickness)

The film thickness of each layer of the organic EL device of the invention is not particularly limited unless otherwise specified. If the film thickness is too small, defects such as pinholes are likely to occur to make it difficult to obtain a sufficient luminance. If the film thickness is too large, a high driving voltage is required to be applied, leading to a lowering in efficiency. In this respect, the film thickness is preferably 5 nm to 10 μm, and more preferably 10 nm to 0.2 μm.

(Electronic Apparatus (Electronic Equipment))

The present invention further relates to an electronic equipment (electronic apparatus) comprising the organic electroluminescence device according to the present application. Examples of the electronic apparatus include display parts such as an organic EL panel module; display devices of television sets, mobile phones, smart phones, and personal computer, and the like; and emitting devices of a lighting device and a vehicle lighting device.

It should be noted that the invention is not limited to the above exemplary embodiments but may include any modification and improvement as long as such modification and improvement are compatible with the invention.

The following examples are included for illustrative purposes only and do not limit the scope of the claims. Unless otherwise stated, all parts and percentages are by weight.

EXAMPLES

I Preparation Examples

Compound 1
Step 1

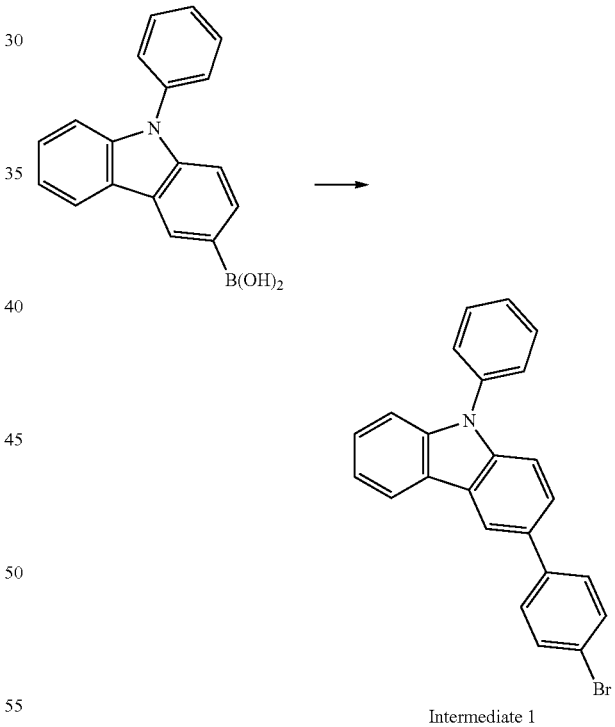

Intermediate 1

In a 2 l three-necked, round bottomed flask were placed (9-phenyl-9H-carbazol-3-yl)boronic acid (52 g, 181 mmol) followed by 1-bromo-4-iodobenzene (56.4 g, 199 mmol), $K_2CO_3$ (75 g, 543 mmol), Toluene (500 ml) THF (250 ml) and water (125 ml). The reaction mixture was evacuated and back filled with Argon 5 times. $Pd(PPh_3)_4$ (6.28 g, 5.43 mmol) was added, the mixture was evacuated and back filled with Argon 5 times and heated to reflux overnight. The reaction mixture was then diluted with 500 ml Toluene, cooled to 50° C., the phases were separated and the THF evaporated. The Toluene phase was washed 3× with H₂O (200 ml each), 1× with 100 ml brine, dried over MgSO₄ and 60 g silica was added. The suspension was stirred for 15 min, filtered, washed 3× with Toluene (100 ml each) and concentrated to yield 87.37 g of a yellow oil. 1600 ml 2-Propanol was added. The mixture was heated to reflux and a suspension was formed. Stirred for 1 h, then cooled to RT with stirring. The suspension was filtered, the filter cake was washed 2× with ice cold 2-Propanol (50 ml each) and 2× with ice cold MeoH (100 ml each). Dried at 80° C./125 mbar overnight to yield 65.9 g (91.4% of theory) of Intermediate 1 as a white solid.

¹H NMR (300 MHz, Tetrachloroethane-d₂) δ 8.28 (d, 1=1.7 Hz, 1H), 8.17 (dt, 1=7.8, 1.1 Hz, 1H), 7.68-7.53 (m, 9H), 7.52-7.40 (m, 4H), 7.30 (dt, J=8.0, 4.1 Hz, 1H).
Step 2 was stirred at −75° C. for 1 h, then warmed to RT. The reaction mixture was concentrated to 100 ml solution, then added slowly to 2 l MeOH under vigorous stirring. The suspension was stirred for 10 min, then filtered and the filter cake was washed 2× with MeOH (100 ml each).

The residue was dried at RT/125 mbar over the weekend to yield 12.5 g (44.5% of theory) of Intermediate 2 as a yellow solid.

1H NMR (300 MHz, Tetrachloroethane-d₂) δ 8.73-8.67 (m, 2H), 8.65-8.58 (m, 2H), 8.43 (d, J=1.7 Hz, 1H), 8.21 (dd, J=7.7, 1.1 Hz, 1H), 7.94-7.87 (m, 2H), 7.74 (dd, J=8.6, 1.8 Hz, 1H), 7.66-7.42 (m, 11H), 7.32 (ddd, J=8.0, 4.7, 3.5 Hz, 1H).
Step 3

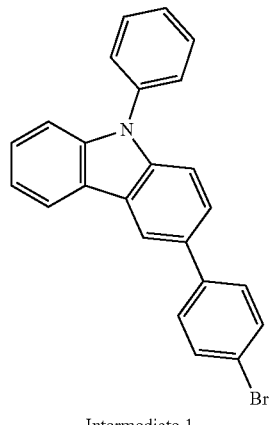

Intermediate 1

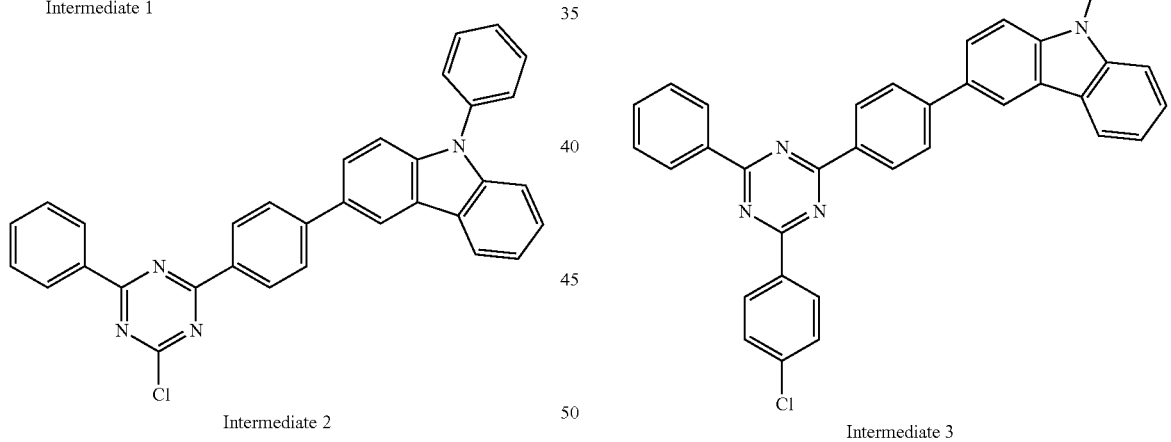

A 1 l three necked round-bottomed flask with magnetic stirrer and thermometer was charged with Intermediate 1 (22 g, 55.2 mmol), followed by THF (600 ml). The coulourless, clear solution was cooled with an Aceton/dry ice-bath to −74° C. under Argon, before 2.5M n-BuLi (26.5 ml, 66.3 mmol) was added slowly within 15 min. keeping the internal temperature between −76 and −73° C. The yellow solution was stirred at −74° C. for 1 h.

A 2 l three necked round-bottomed flask with magnetic stirrer and thermometer was charged with 2,4-dichloro-6-phenyl-1,3,5-triazine (31.2 g, 138 mmol), and THF (600 ml). The solution was cooled with an Aceton/dry ice-bath to −76° C., before the solution from step 1 was added slowly over a period of 40 min (internal temperature −76° C. to −73° C. during addition) with a canula. The reaction mixture A 250 ml three necked round-bottomed flask with magnetic stirrer, thermometer and reflux condenser was charged with Intermediate 2 (7 g, 12.38 mmol), (4-chlorophenyl) boronic acid (1.55 g, 9.90 mmol), K₂CO₃ (5.13 g, 37.1 mmol) followed by Toluene (70 ml), THF (35 ml) and Water (17.5 ml). The reaction mixture was evacuated and back-filled with Argon five times. Pd(PPh₃)₄ (0.715 g, 0.619 mmol) was added and the reaction mixture was evacuated and backfilled with Argon five times. The yellow suspension was heated to reflux and a yellow solution was formed that was stirred overnight. The yellow suspension was cooled to RT, filtered and washed with ice cold Toluene, MeOH, H₂O and again with MeOH. The filter cake was dried at ambient conditions overnight to yield 4.67 g of crude product that was crystallized from Toluene to yield 3.85 g (53% of theory) of Intermediate 3 as a yellow solid.

¹H NMR (300 MHz, Tetrachloroethane-d₂) δ 8.87-8.68 (m, 6H), 8.45 (d, J=1.9 Hz, 1H), 8.21 (d, J=7.7 Hz, 1H), 7.98-7.89 (m, 2H), 7.76 (dd, J=8.6, 1.8 Hz, 1H), 7.66-7.41 (m, 13H), 7.33 (dq, J=8.1, 4.4 Hz, 1H).

Step 4

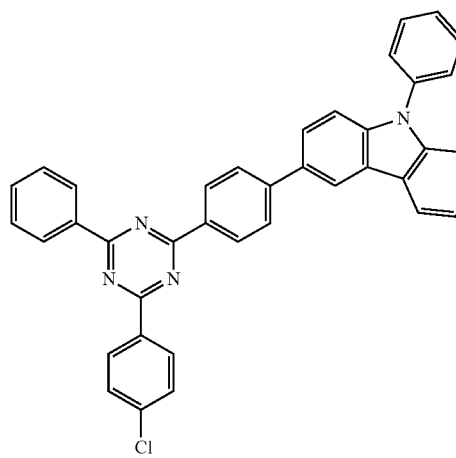

Intermediate 3

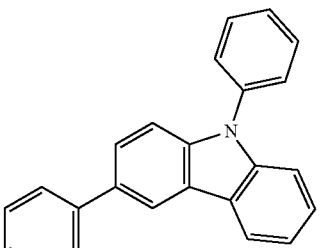

Intermediate 4

In a 250 ml three necked round-bottomed flask with magnetic stirrer, thermometer and reflux condenser were placed Intermediate 3 (6.03 g, 10.31 mmol), Bis(pinacolato) diboron (6.54 g, 25.8 mmol), Potassium acetate (2.53 g, 25.8 mmol) and Dioxane (150 ml). The yellow suspension was evacuated and backfilled with Argon 5 times. Then Argon was bubbled through the suspension for 40 min. Pd₂(dba)₃ (0.142 g, 0.155 mmol) and s-Phos (0.127 g, 0.309 mmol) were added and the red suspension was evacuated and backfilled with argon 5 times. The reaction mixture was heated to reflux overnight, then filtered hot through Hyflo and washed 2× with EtOAc (40 ml each). The filtate was concentrated to yield 12.39 g of an orange foam. 200 ml MeOH was added to the residue, put in an ultra sonic bath for 30 min. The suspension was cooled with stirring, filtered, washed 3× with MeOH (20 ml each) and dried at RT/125 mbar overnight to yield 6.8 g (98%) of Intermediate 4 as a beige solid.

¹H NMR (300 MHz, Tetrachloroethane-d₂) δ 8.88-8.71 (m, 6H), 8.46 (d, J=1.7 Hz, 1H), 8.22 (dt, J=7.7, 1.0 Hz, 1H), 8.04-7.91 (m, 4H), 7.77 (dd, J=8.6, 1.8 Hz, 1H), 7.66-7.56 (m, 7H), 7.54-7.42 (m, 4H), 7.32 (dt, J=7.9, 4.0 Hz, 1H), 1.35 (s, 12H).

Step 5

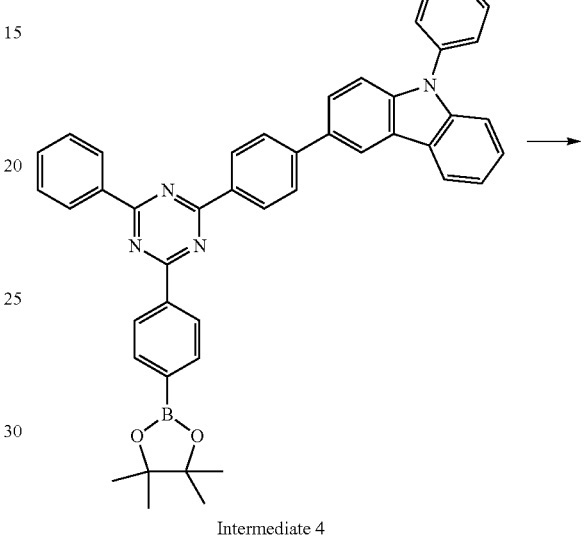

Intermediate 4

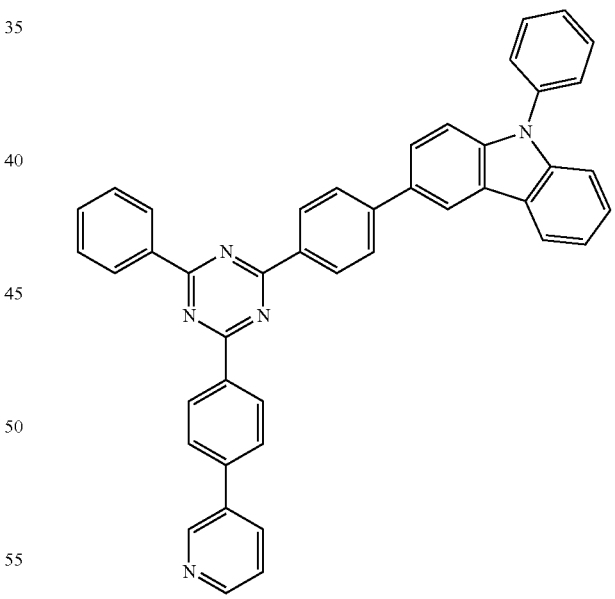

Compound 1

In a 250 ml three necked round-bottomed flask with magnetic stirrer, thermometer and reflux condenser were placed 3-chloropyridine (0.843 ml, 8.87 mmol), Intermediate 4 (6.0 g, 8.87 mmol) and potassium carbonate (2.92 g, 21.10 mmol) in Dioxane (40 ml), Toluene (78 ml) and H₂O (30 ml). The pink suspension was bubbled with argon for 60 min. Pd(OAc)₂ (0.038 g, 0.168 mmol) and dicyclohexyl(2', 4',6'-triisopropyl-[1,1'-biphenyl]-2-yl)phosphane (0.161 g, 0.337 mmol) were added and the reaction mixture was evacuated and backfilled with argon 5 times. The brown suspension was heated to reflux and reacted overnight. The reaction mixture was filtered hot through Hyflo and the two phases of the filtrate were separated. The organic phase was washed three times with water, dried with $MgSO_4$, filtered and concentrated to yield 8.28 g of a yellow solid. The crude product was crystallized from Xylene to yield 4.04 g (72.6%) of Compound 1 as a yellow solid.

$^1$H NMR (300 MHz, Tetrachloroethane-$d_2$) δ 8.94-8.84 (m, 5H), 8.82-8.77 (m, 2H), 8.62 (dd, J=4.8, 1.6 Hz, 1H), 8.46 (d, J=1.8 Hz, 1H), 8.22 (dt, J=7.7, 1.1 Hz, 1H), 8.02-7.92 (m, 3H), 7.83-7.74 (m, 3H), 7.65-7.56 (m, 7H), 7.51 (dd, J=8.6, 6.8 Hz, 2H), 7.43 (ddd, J=9.0, 4.7, 1.0 Hz, 3H), 7.33 (dt, J=8.0, 4.1 Hz, 1H).

Compound 2

Step 1

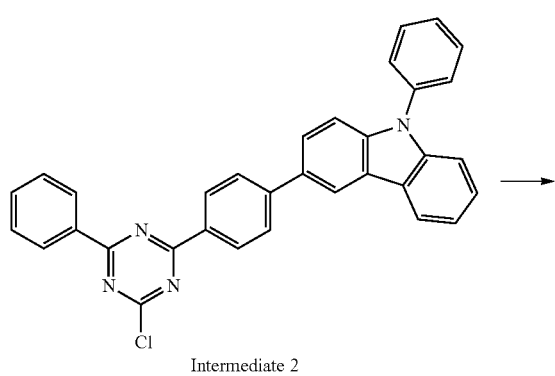

Intermediate 2

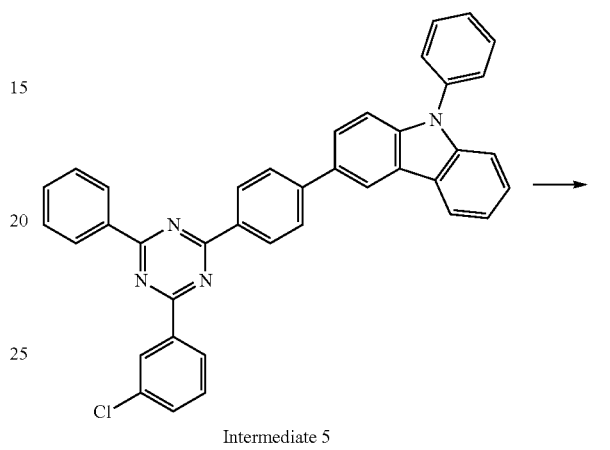

Intermediate 5

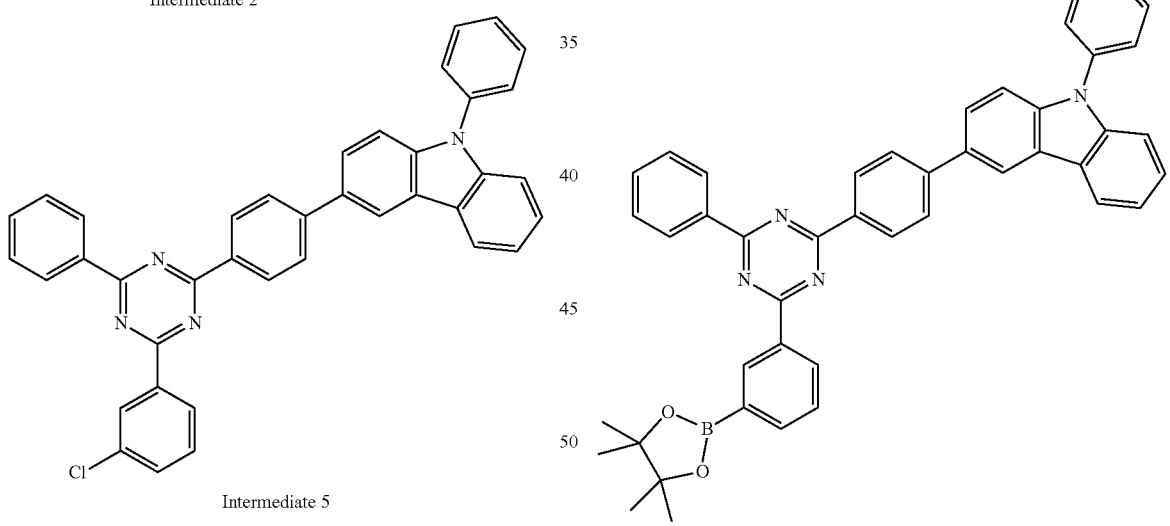

A 250 ml three necked round-bottomed flask with magnetic stirrer, thermometer and reflux condeser was charged with Intermediate 2 (9.94 g, 17.58 mmol), (3-chlorophenyl) boronic acid (2.199 g, 14.06 mmol), $K_2CO_3$ (7.29 g, 52.7 mmol) followed by Toluene (100 ml), THF (50 ml) and $H_2O$ (25 ml). The reaction mixture was evacuated and backfilled with Argon five times. $Pd(PPh_3)_4$ (1.015 g, 0.879 mmol) was added and the reaction mixture was evacuated and backfilled with Argon five times. The yellow suspension was heated to reflux and a orange solution was formed that was stirred overnight. The yellow suspension was cooled to RT, then to 0° C. with an ice bath, filtered and washed with ice cold Toluene, MeOH, $H_2O$ and again with MeOH. The filter cake was dried at 80° C./125 mbar overnight to yield 6.31 g of crude product that was crystallized from Toluene to yield 5.81 g (57% of theory) of Intermediate 5 as a slightly yellow solid.

$^1$H NMR (300 MHz, Tetrachloroethane-$d_2$) δ 8.87-8.65 (m, 6H), 8.45 (d, J=1.7 Hz, 1H), 8.22 (dd, J=7.7, 1.0 Hz, 1H), 7.98-7.90 (m, 2H), 7.76 (dd, J=8.6, 1.8 Hz, 1H), 7.65-7.40 (m, 13H), 7.32 (dt, J=8.0, 4.1 Hz, 1H).

Step 2

The synthesis of Compound 1, Step 4 was repeated, but using Intermediate 5 (5.81 g, 9.93 mmol) instead of Intermediate 3 to yield 6.7 g (100%) of Intermediate 6 as a beige solid.

$^1$H NMR (300 MHz, Tetrachloroethane-$d_2$) δ 9.07 (t, J=1.5 Hz, 1H), 8.89-8.82 (m, 3H), 8.78 (ddd, J=5.5, 4.4, 2.7 Hz, 2H), 8.46 (d, J=1.8 Hz, 1H), 8.22 (dt, J=7.7, 1.0 Hz, 1H), 8.06 (dt, J=7.3, 1.3 Hz, 1H), 7.99-7.92 (m, 2H), 7.77 (dd, J=8.6, 1.9 Hz, 1H), 7.65-7.57 (m, 8H), 7.55-7.47 (m, 2H), 7.44 (d, J=3.8 Hz, 2H), 7.32 (dt, J=8.0, 4.1 Hz, 1H), 3.41 (s, 12H).

Step 3

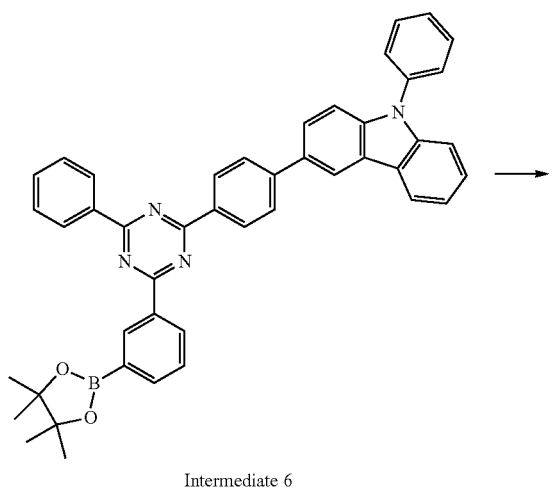

Intermediate 6

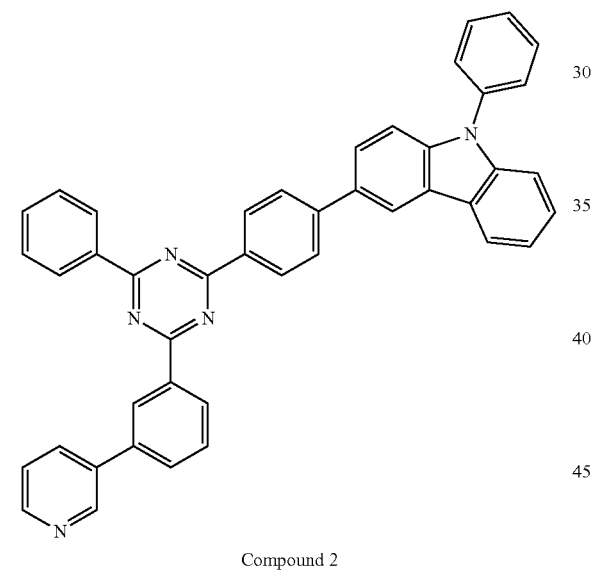

Compound 2

Compound 3
Step 1

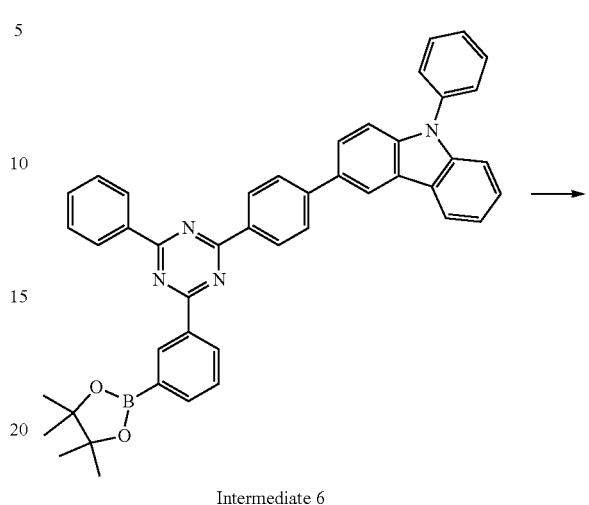

Intermediate 6

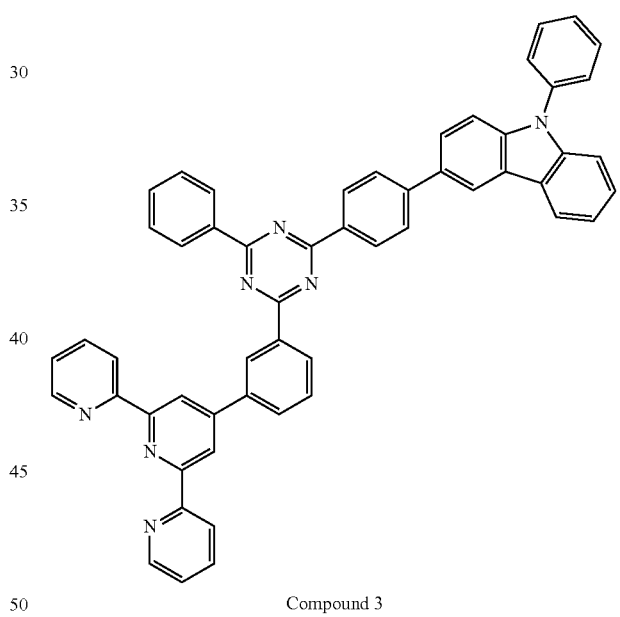

Compound 3

The synthesis of Compound 1, Step 5 was repeated, but using Intermediate 6 (5 g, 7.39 mmol) instead of Intermediate 4 to yield 2.15 g (46.4%) of Compound 2 as a slightly yellow solid.

$^1$H NMR (300 MHz, Tetrachloroethane-d$_2$) δ 9.00 (dt, J=3.2, 1.4 Hz, 2H), 8.91-8.76 (m, 5H), 8.63 (dd, J=4.8, 1.6 Hz, 1H), 8.46 (d, J=1.8 Hz, 1H), 8.21 (dt, J=7.7, 1.1 Hz, 1H), 8.05 (ddd, J=7.9, 2.4, 1.7 Hz, 1H), 7.99-7.92 (m, 2H), 7.87-7.54 (m, 11H), 7.52-7.43 (m, 4H), 7.33 (dt, J=7.9, 4.0 Hz, 1H).

The synthesis of Compound 1, Step 5 was repeated, but using Intermediate 6 (5 g, 7.39 mmol)

instead of Intermediate 4 and 4'-chloro-2,2':6',2''-terpyridine (1.89 g, 7.04 mmol) instead of 3-chloropyridine to yield 3.57 g (61.8%) of Compound 3 as a slightly yellow solid.

$^1$H NMR (300 MHz, Tetrachloroethane-d$_2$) δ 9.19 (t, J=1.8 Hz, 1H), 8.91-8.66 (m, 11H), 8.45 (d, J=1.7 Hz, 1H), 8.24-8.18 (m, 1H), 8.11 (dt, J=8.0, 1.3 Hz, 1H), 7.98-7.87 (m, 4H), 7.80-7.72 (m, 2H), 7.66-7.56 (m, 7H), 7.54-7.31 (m, 7H).

Compound 4
Step 1

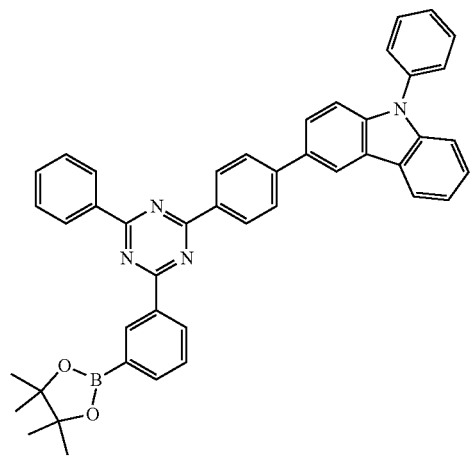

Intermediate 6

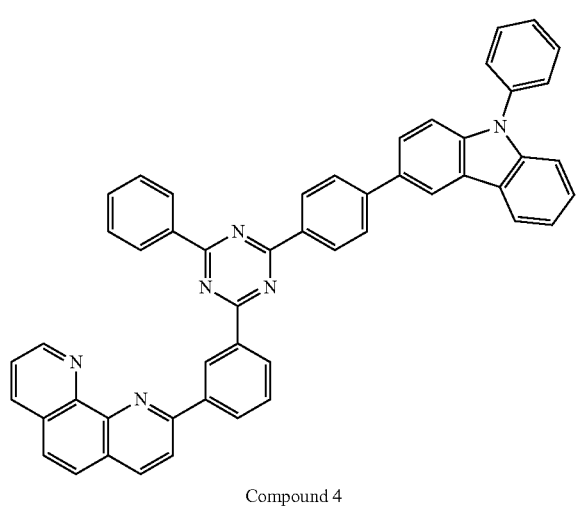

Compound 4

The synthesis of Compound 1, Step 5 was repeated, but using Intermediate 6 (6.8 0.08 mmol) instead of Intermediate 4 and 2-bromo-1,10-phenanthroline (5.22 g, 20.16 mmol) instead of 3-chloropyridine to yield 6.61 g (89.9%) of Compound 4 as a slightly yellow solid.

1H NMR (300 MHz, Tetrachloroethane-$d_2$) δ 9.55 (t, J=1.9 Hz, 1H), 9.23 (dd, J=4.4, 1.8 Hz, 1H), 8.91 (dd, J=8.8, 7.0 Hz, 3H), 8.87-8.78 (m, 2H), 8.73 (dt, J=7.7, 1.5 Hz, 1H), 8.46 (d, J=1.8 Hz, 1H), 8.39 (d, J=8.4 Hz, 1H), 8.33-8.25 (m, 2H), 8.22 (dd, J=7.7, 1.1 Hz, 1H), 8.01-7.91 (m, 2H), 7.88-7.72 (m, 4H), 7.72-7.56 (m, 8H), 7.56-7.40 (m, 4H), 7.33 (dt, J=7.9, 4.1 Hz, 1H).

Compound 5
Step 1

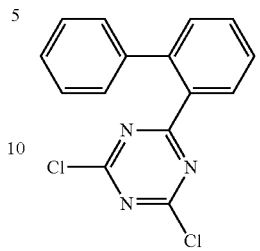

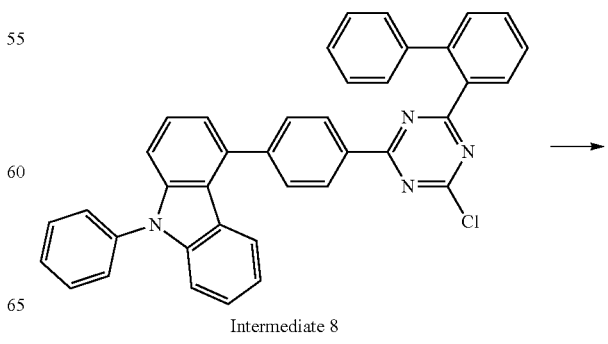

Intermediate 8

In a 100 mL three-necked, round bottomed flask were placed (4-(9-phenyl-9H-carbazol-4-yl)phenyl)boronic acid (6.13 g, 16.88 mmol) followed by 2-([1,1'-biphenyl]-2-yl)-4,6-dichloro-1,3,5-triazine (3.4 g, 11.25 mmol), $Na_2CO_3$ (2.98 g, 28.1 mmol), Toluene (56 ml) and water (14 ml). The reaction mixture was evacuated and back filled with Argon 5 times. $PdCl_2(PPh_3)_2$ (0.079 g, 0.11 mmol) was added, the mixture was evacuated and back filled with Argon 5 times and heated to reflux overnight. The reaction mixture was cooled to room temperature and the solvent was evaporated. The crude material was purified by silica gel chromatography, eluting with Hexane and $CH_2Cl_2$ to obtain Intermediate 8 as a pale yellow solid (3.87 g, 58.8% yield).

As a result of mass spectroscopy, it was found that m/e=585 and the comound was identified to be the above Intermediate 8 (Exact mass: 584.17).

Step 2

Intermediate 8

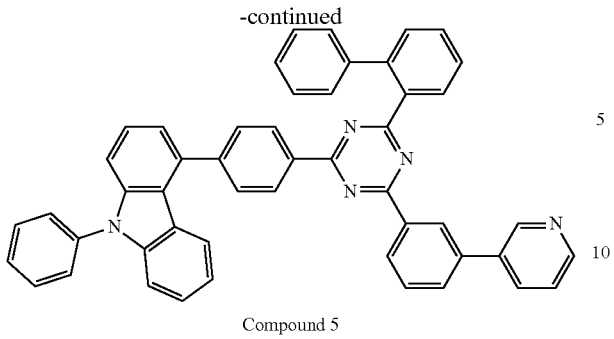

Compound 5

The synthesis of Compound 2, Step 1 was repeated, but using 3-(3-(4,4,5,5-tetramethyl-1,3,2-dioxaborolan-2-yl)phenyl)pyridine (2.42 g, 8.60 mmol) instead of (3-chlorophenyl)boronic acid and Intermediate 8 (3.87 g, 6.61 mmol) instead of Intermediate 2 to yield 1.86 g (38.4%) of Compound 5 as a slightly yellow solid.

As a result of mass spectroscopy, it was found that m/z=704 and the compound was identified to be the above Compound 5 (Exact mass: 703.27).

Comparative Compound 1
Step 1

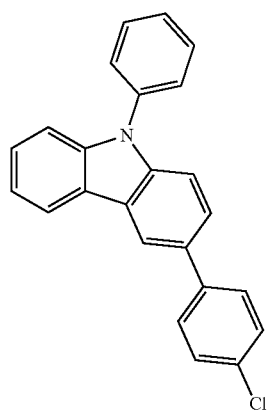

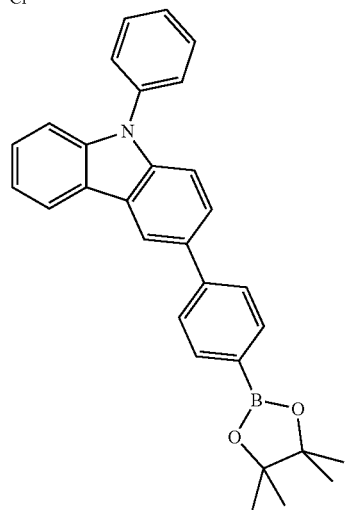

Intermediate 7

The synthesis of Compound 1, Step 4 was repeated, but using 3-(4-chlorophenyl)-9-phenyl-9H-carbazole (11 g, 31.1 mmol) instead of Intermediate 3 to yield 10.39 g (75%) of Intermediate 7 as a beige solid.

$^1$H NMR (300 MHz, Tetrachloroethane-d$_2$) δ 8.34 (d, J=1.8 Hz, 1H), 8.18 (dd, J=7.7, 1.1 Hz, 1H), 7.93-7.87 (m, 2H), 7.73-7.55 (m, 7H), 7.49-7.40 (m, 4H), 7.29 (ddd, J=8.0, 4.7, 3.5 Hz, 1H), 1.33 (s, 12H).

Step 2

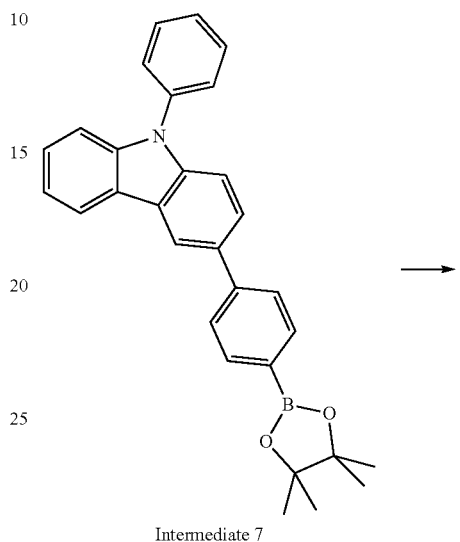

Intermediate 7

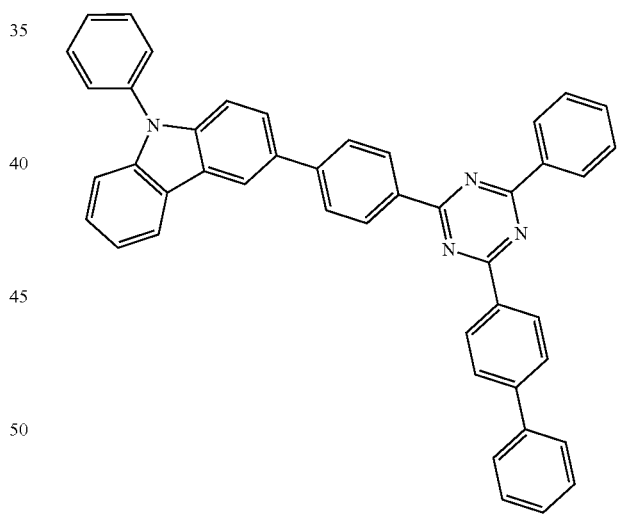

Comparative Compound 1

The synthesis of Compound 2, Step 1 was repeated, but using Intermediate 7 (9.84 g, 22.1 mmol) instead of (3-chlorophenyl)boronic acid and 2-[1,1'-biphenyl]-4-yl)-4-chloro-6-phenyl-1,3,5-triazine (9.12 g, 26.5 mmol) instead of Intermediate 2 to yield 3.37 g (24.3%) of Comparative Compound 1 as a slightly yellow solid.

$^1$H NMR (300 MHz, Tetrachloroethane-d$_2$) δ 8.93-8.81 (m, 4H), 8.82-8.75 (m, 2H), 8.46 (d, J=1.8 Hz, 1H), 8.27-8.18 (m, 1H), 8.00-7.90 (m, 2H), 7.86-7.80 (m, 2H), 7.77 (dd, J=8.6, 1.8 Hz, 1H), 7.74-7.68 (m, 2H), 7.68-7.55 (m, 7H), 7.55-7.37 (m, 7H), 7.33 (dt, J=7.9, 4.0 Hz, 1H).

II Application Examples

Application Example 1

A glass substrate with 130 nm-thick indium-tin-oxide (ITO) transparent electrode (manufactured by Geomatec Co., Ltd.) used as an anode was first treated with N2 plasma for 100 sec. This treatment also improved the hole-injection properties of the ITO. The cleaned substrate was mounted on a substrate holder and loaded into a vacuum chamber. Thereafter, the organic materials specified below were applied by vapor deposition to the ITO substrate at a rate of approx. 0.2-1 Å/sec at about $10^{-6}$-$10^{-8}$ mbar. As a hole-injection layer, 10 nm-thick mixture of Compound HT and 3% by weight of Compound HI were applied. Then 80 nm-thick of Compound HT and 5 nm of Compound EB were applied as hole-transporting layer 1 and electron-blocking layer, respectively. Subsequently, a mixture of 1% by weight of an emitter Compound BD-1 and 99% by weight of host Compound BH-1 were applied to form a 20 nm-thick fluorescent-emitting layer. On the emitting layer, 5 nm-thick Compound HB was applied as an hole-blocking layer and 25 nm of Compound 1 as electron transporting layer. Finally, 1 nm-thick Yb was deposited as an electron injection layer and 50 nm-thick Al was then deposited as a cathode to complete the device. The device was sealed with a glass lid and a getter in an inert nitrogen atmosphere with less than 1 ppm of water and oxygen. To characterize the OLED, electroluminescence spectra were recorded at various currents and voltages. In addition, the current-voltage characteristic was measured. Lifetime of OLED device was measured as a decay of the luminance at constant current density of 50 mA/cm$^2$ to 95% of its initial value. Voltage rise was measured at constant current density of 50 mA/cm$^2$ after 100 h, relative to initial voltage. The device results are shown in Table 1.

Compound HI

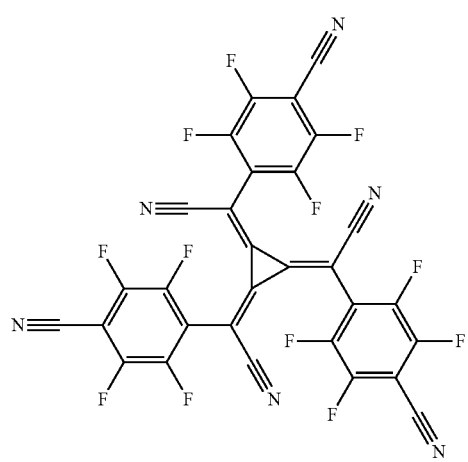

Compound HT

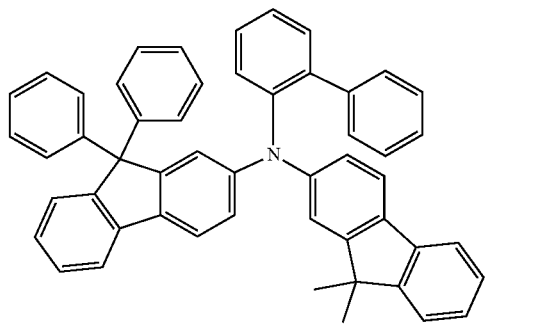

Compound EB

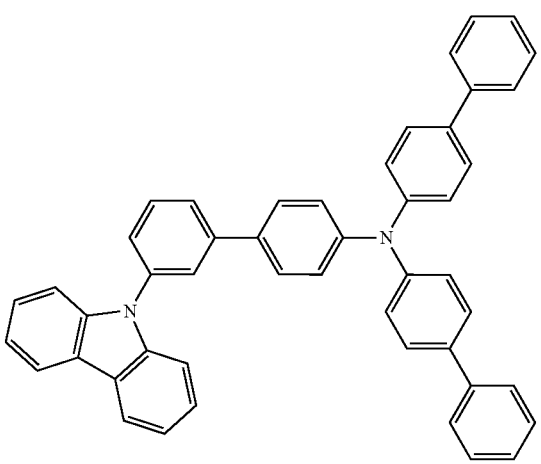

Compound BD-1

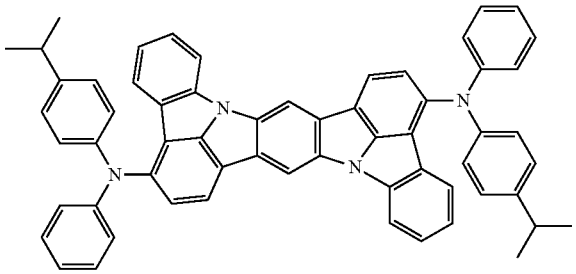

Compound BH-1

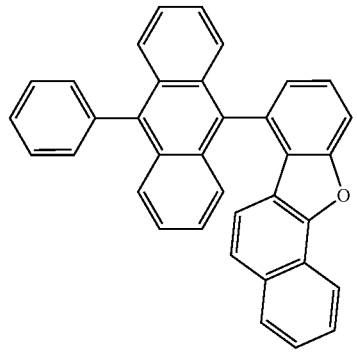

-continued

Compound HB

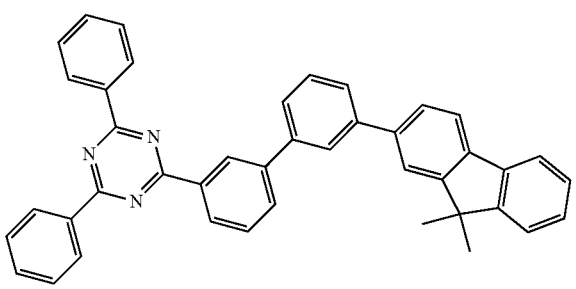

Comparative Compound 1

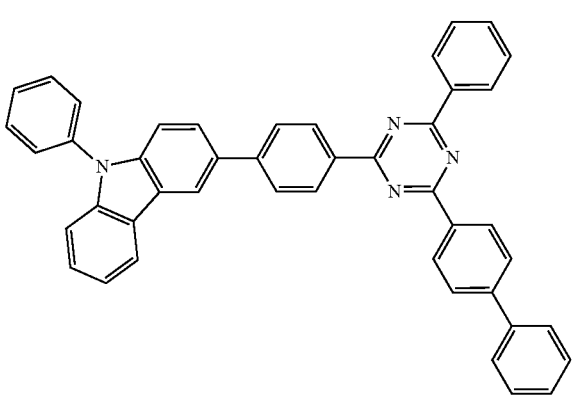

(based on KR 2014-0129435)

Comparative Compound 2

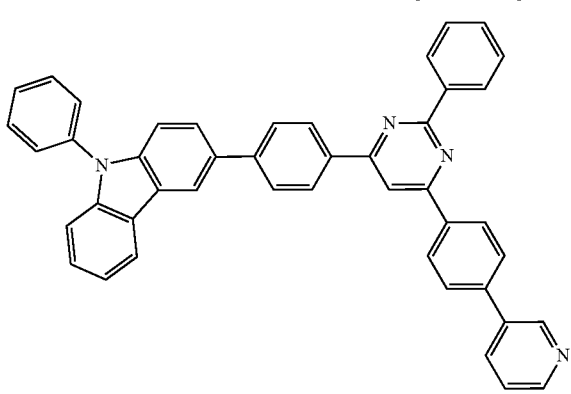

(U.S. Pat. No. 10,217,954)

Compound 1

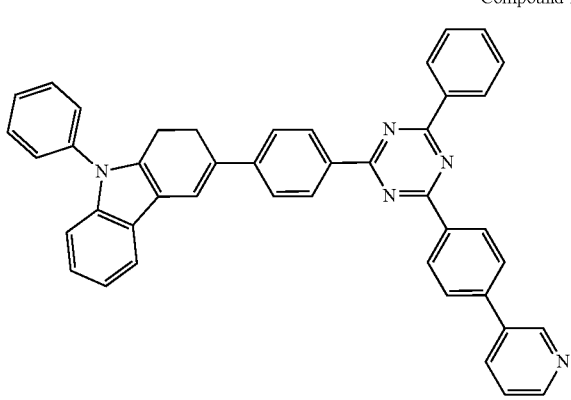

Compound 2

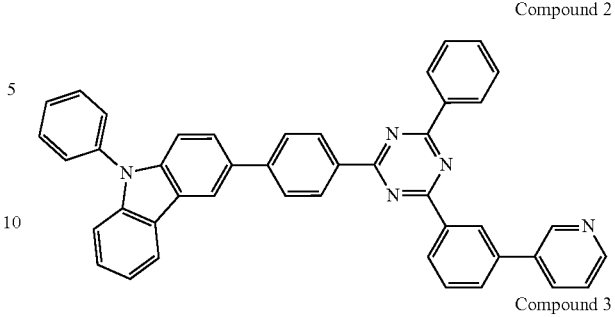

Compound 3

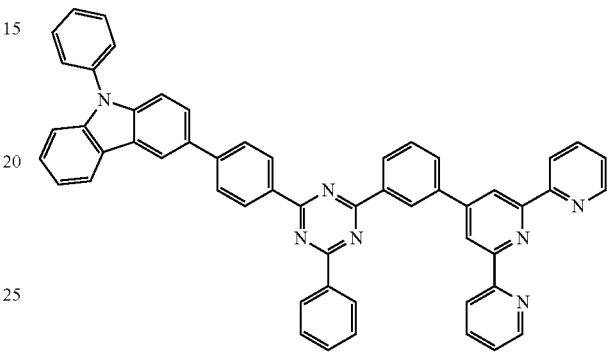

Application Example 2

Application Example 1 was repeated except for using the Compound 2 in place of Compound 1 in the electron transporting layer.

Application Example 3

Application Example 1 was repeated except for using the Compound 3 in place of Compound 1 in the electron transporting layer.

Comparative Application Example 1

Application Example 1 was repeated except for using the Comparative Compound 1 in place of Compound 1 in the electron transporting layer.

Comparative Application Example 2

Application Example 1 was repeated except for using the Comparative Compound 2 in place of Compound 1 in the electron transporting layer.

The device results are shown in Table 1.

TABLE 1

| Appl. Ex. | Electron transporting layer | LT95 at 50 mA/cm$^2$, h | Voltage rise at 100 hours, V |
|---|---|---|---|
| Appl. Ex. 1 | Compound 1 | 164 | 0.02 |
| Appl. Ex. 2 | Compound 2 | 152 | 0.03 |
| Appl. Ex. 3 | Compound 3 | 139 | 0.07 |
| Comp. Appl. Ex. 1 | Comparative Compound 1 | 47 | 0.23 |
| Comp. Appl. Ex. 2 | Comparative Compound 2 | 107 | 0.35 |

These results demonstrate that lifetime and voltage rise are improved in the case that the inventive Compounds are used instead of the Comparative Compounds 1 and 2 as the electron transporting material with Yb as electron injecting layer.

Application Example 4

A glass substrate with 130 nm-thick indium-tin-oxide (ITO) transparent electrode (manufactured by Geomatec Co., Ltd.) used as an anode was first treated with N2 plasma for 100 sec. This treatment also improved the hole-injection properties of the ITO. The cleaned substrate was mounted on a substrate holder and loaded into a vacuum chamber. Thereafter, the organic materials specified below were applied by vapor deposition to the ITO substrate at a rate of approx. 0.2-1 Å/sec at about $10^{-6}$-$10^{-8}$ mbar. As a hole-injection layer, 10 nm-thick mixture of Compound HT and 3% by weight of Compound HI were applied. Then 80 nm-thick of Compound HT and 5 nm of Compound EB were applied as hole-transporting layer 1 and electron-blocking layer, respectively. Subsequently, a mixture of 1% by weight of an emitter Compound BD-1 and 99% by weight of host Compound BH-1 were applied to form a 20 nm-thick fluorescent-emitting layer. On the emitting layer, 5 nm-thick Compound HB was applied as an hole-blocking layer and 25 nm of Compound 1 as electron transporting layer. Finally, 1 nm-thick LiF was deposited as an electron injection layer and 50 nm-thick Al was then deposited as a cathode to complete the device. The device was sealed with a glass lid and a getter in an inert nitrogen atmosphere with less than 1 ppm of water and oxygen. To characterize the OLED, electroluminescence spectra were recorded at various currents and voltages. Voltages are reported at 10 mA/cm$^2$. Lifetime of OLED device was measured as a decay of the luminance at constant current density of 50 mA/cm$^2$ to 95% of its initial value. The device results are shown in Table 2.

Application Example 5

Application Example 4 was repeated except for using the Compound 2 in place of Compound 1 in the electron transporting layer.

Application Example 6

Application Example 4 was repeated except for using the Compound 3 in place of Compound 1 in the electron transporting layer.

Comparative Application Example 3

Application Example 4 was repeated except for using the Comparative Compound 1 in place of Compound 1 in the electron transporting layer.

The device results are shown in Table 2.

TABLE 2

| Appl. Ex. | Electron transporting layer | V at 10 mA/cm$^2$, h | LT95 at 50 mA/cm$^2$, h |
|---|---|---|---|
| Appl. Ex. 4 | Compound 1 | 3.39 | 176 |
| Appl. Ex. 5 | Compound 2 | 3.55 | 147 |

TABLE 2-continued

| Appl. Ex. | Electron transporting layer | V at 10 mA/cm$^2$, h | LT95 at 50 mA/cm$^2$, h |
|---|---|---|---|
| Appl. Ex. 6 | Compound 3 | 3.45 | 166 |
| Comp. Appl. Ex. 3 | Comparative Compound 1 | 5.59 | 5 |

These results demonstrate that voltage and lifetime are improved in the case that the inventive Compounds are used instead of the Comparative Compounds 1 as the electron transporting material with LiF as electron injecting layer.

Application Example 7

A glass substrate with 130 nm-thick indium-tin-oxide (ITO) transparent electrode (manufactured by Geomatec Co., Ltd.) used as an anode was first treated with N2 plasma for 100 sec. This treatment also improved the hole-injection properties of the ITO. The cleaned substrate was mounted on a substrate holder and loaded into a vacuum chamber. Thereafter, the organic materials specified below were applied by vapor deposition to the ITO substrate at a rate of approx. 0.2-1 Å/sec at about $10^{-6}$-$10^{-8}$ mbar. As a hole-injection layer, 10 nm-thick mixture of Compound HT and 3% by weight of Compound HI were applied. Then 80 nm-thick of Compound HT and 5 nm of Compound EB were applied as hole-transporting layer 1 and electron-blocking layer, respectively. Subsequently, a mixture of 1% by weight of an emitter Compound BD-1 and 99% by weight of host Compound BH-1 were applied to form a 20 nm-thick fluorescent-emitting layer. On the emitting layer, 5 nm-thick Compound HB was applied as an hole-blocking layer and 25 nm of mixture of 50% by weight of Compound 2 and lithium quinolate (Liq) as electron-transporting layer. Finally, 1 nm-thick Yb was deposited as an electron-injection layer and 80 nm-thick Al was then deposited as a cathode to complete the device. The device was sealed with a glass lid and a getter in an inert nitrogen atmosphere with less than 1 ppm of water and oxygen. To characterize the OLED, electroluminescence spectra were recorded at various currents and voltages. In addition, the current-voltage characteristic was measured in combination with the luminance to determine luminous efficiency and external quantum efficiency (EQE). Voltage and efficiency are reported at mA/cm$^2$. Lifetime of OLED device was measured as a decay of the luminance at constant current density of 50 mA/cm$^2$ to 95% of its initial value. The device results are shown in Table 3.

TABLE 3

| Appl. Ex. | Electron transporting layer | V at 10 mA/cm$^2$, h | LT95 at 50 mA/cm$^2$, h |
|---|---|---|---|
| Appl. Ex. 7 | Compound 2:liq (50%) | 3.2 | 142 |

This result demonstrates that the inventive compounds can be applied in an electron transporting layer also comprising an alkali metal dopant.

The invention claimed is:

1. A compound represented by formula (I):

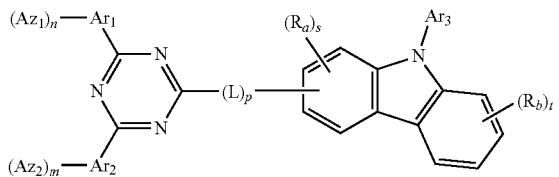

wherein

L is an unsubstituted divalent aromatic hydrocarbon group containing 6 to 30 ring atoms;

$Ar_1$, $Ar_2$ and $Ar_3$ are each independently an unsubstituted or substituted aromatic hydrocarbon group containing 6 to 30 ring atoms or an unsubstituted or substituted heteroaromatic group containing 3 to 30 ring atoms, wherein at least one of $Ar_1$ and $Ar_2$ is substituted by at least one group $Az_1$ or $Az_2$;

$Az_1$ and $Az_2$ are each independently selected from the group consisting of a pyridyl group, a quinoline group, a phenanthroline group, a pyridazine group, a pyrimidine group, a pyrazine group, a triazine group, a isoquinoline group, a quinolizine group, a cinnoline group, a quinoxaline group, a quinazoline group, a phthalazine group, a naphthyridine group, an acridine group, a phenanthridine group, a phenazine group, a pteridine group, a thiazole group, an imidazole group, a benzothiazole group, a benzimidazole group, and an imidazopyridine group wherein the aforementioned groups are optionally substituted with a substituent selected from the group consisting of a halogen atom, a cyano group, an alkyl group having 1 to 25 carbon atoms and an aryl group having 6 to 24 ring carbon atoms;

$R_a$ and $R_b$ are each independently hydrogen, an unsubstituted or substituted aromatic hydrocarbon group containing 6 to 30 ring atoms or an unsubstituted or substituted heteroaromatic group containing 3 to 30 ring atoms, an unsubstituted or substituted alkyl group having 1 to 25 carbon atoms, an unsubstituted or substituted cycloalkyl group having 3 to 18 ring carbon atoms or CN, or two adjacent groups $R_a$, and/or two adjacent groups $R_b$, can form together a substituted or unsubstituted heterocyclic ring;

p is 1, 2 or 3;

m and n are each independently 0, 1, 2, 3 or 4, wherein at least one of m and n is not 0;

s is 0, 1, 2 or 3; and t is 0, 1, 2, 3 or 4.

2. The compound according to claim 1, wherein p is 1 or 2.

3. The compound according to claim 1, wherein m and n are each independently 0, 1 or 2, wherein at least one of m and n is not 0.

4. The compound according to claim 1, wherein when n is 0, $Ar_1$ is an unsubstituted or substituted phenyl group or an unsubstituted or substituted naphthyl group or an unsubstituted A or substituted fluorene group, and when m is 0, $Ar_2$ is an unsubstituted or substituted phenyl group or an unsubstituted or substituted naphthyl group or an unsubstituted or substituted fluorene group, wherein when substituted the substituent is selected from the group consisting of a halogen atom, a cyano group, an alkyl group having 1 to 25 carbon atoms and an aryl group having 6 to 24 ring carbon atoms.

5. The compound according to claim 1, wherein when n is not 0, $Ar_1$ is an unsubstituted or substituted phenylene group, an unsubstituted or substituted fluorene-diyl group, or an unsubstituted or substituted naphthylene group, and when m is not 0, $Ar_2$ is an unsubstituted or substituted phenylene group, an unsubstituted or substituted fluorene-diyl group, or an unsubstituted or substituted naphthylene group, wherein when substituted the substituent is selected from the group consisting of a halogen atom, a cyano group, an alkyl group having 1 to 25 carbon atoms and an aryl group having 6 to 24 ring carbon atoms.

6. The compound according to claim 1, wherein $R_a$ and $R_b$ are each independently hydrogen, an unsubstituted or substituted aromatic hydrocarbon group containing 6 to 30 ring atoms or an unsubstituted or substituted heteroaromatic group containing 3 to 30 ring atoms, or CN, wherein when substituted, the substituent is selected from the group consisting of a halogen atom, a cyano group, an alkyl group having 1 to 25 carbon atoms and an aryl group having 6 to 24 ring carbon atoms.

7. A material for an organic electroluminescence device, comprising at least one compound according to claim 1.

8. An organic electroluminescence device comprising at least one compound according to claim 1.

9. The organic electroluminescence device according to claim 8, the organic electroluminescence device further comprising:

a cathode, an anode, and one or more organic thin film layers comprising an emitting layer disposed between the cathode and the anode, wherein the organic thin film layers comprise an electron-transporting zone provided between the emitting layer and the cathode, and wherein the electron-transporting zone comprises the at least one compound.

10. The organic electroluminescence device according to claim 9, wherein the electron-transporting zone further comprises an electron-transporting layer provided between the emitting layer and the cathode, and wherein the electron-transporting layer comprises the at least one compound.

11. The organic electroluminescence device according to claim 9, wherein the electron-transporting zone further comprises at least one organic metal complex or compound.

12. An electronic equipment comprising the organic electroluminescence device according to claim 8.